(12) United States Patent
Nosaka

(10) Patent No.: US 11,316,499 B2
(45) Date of Patent: Apr. 26, 2022

(54) FILTER DEVICE, MULTIPLEXER, RADIO FREQUENCY FRONT-END CIRCUIT, AND COMMUNICATION DEVICE

(71) Applicant: Murata Manufacturing Co., Ltd., Nagaokakyo (JP)

(72) Inventor: Koji Nosaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 224 days.

(21) Appl. No.: 16/799,848

(22) Filed: Feb. 25, 2020

(65) Prior Publication Data

US 2020/0195230 A1 Jun. 18, 2020

Related U.S. Application Data

(63) Continuation of application No. PCT/JP2018/031175, filed on Aug. 23, 2018.

(30) Foreign Application Priority Data

Aug. 28, 2017 (JP) .............................. JP2017-163618

(51) Int. Cl.
*H03H 9/70* (2006.01)
*H03H 9/46* (2006.01)
(Continued)

(52) U.S. Cl.
CPC ............ *H03H 9/70* (2013.01); *H03H 7/0161* (2013.01); *H03H 9/46* (2013.01); *H04B 1/0057* (2013.01);
(Continued)

(58) Field of Classification Search
CPC .. H03H 9/46; H03H 9/70–725; H03H 7/0161; H03H 7/46–468; H01B 1/0057; H01B 1/52

See application file for complete search history.

(56) References Cited

U.S. PATENT DOCUMENTS 9,882,586 B2 * 1/2018 Zeng .................... H04B 1/0057
10,181,839 B2 * 1/2019 Tomita .................... H03H 9/64
(Continued)

FOREIGN PATENT DOCUMENTS

JP 04-336817 A 11/1992
JP 2005-086738 A 3/2005
(Continued)

OTHER PUBLICATIONS

English Translation of the Written Opinion of the International Search Authority dated Oct. 23, 2018 for PCT/JP2018/031175, 5 pages.

(Continued)

*Primary Examiner* — Dean O Takaoka
*Assistant Examiner* — Alan Wong
(74) *Attorney, Agent, or Firm* — Xsensus LLP

(57) ABSTRACT

A filter device includes: a common terminal; a first input/output terminal; a second input/output terminal; a first filter connected to a first path that connects the common terminal and the first input/output terminal, and having a passband that is a first band; a second filter connected to a second path that connects the common terminal and the second input/output terminal, and having a passband that is a second band having a frequency range that is different from and does not overlap a frequency range of the first band; a first switch element connected between a first node on the first path between the first filter and the first input/output terminal and a second node on the second path between the second filter and the second input/output terminal; and a second switch element on the second path, which is connected between the second node and the second input/output terminal.

20 Claims, 52 Drawing Sheets

(51) Int. Cl.
*H03H 7/01* (2006.01)
*H04B 1/00* (2006.01)
*H04B 1/52* (2015.01)

(52) U.S. Cl.
CPC ......... *H04B 1/52* (2013.01); *H03H 2007/013* (2013.01)

(56) References Cited

U.S. PATENT DOCUMENTS

2014/0073268 A1\* 3/2014 Taniuchi ................ H04B 1/525
455/83
2016/0043822 A1 2/2016 Yi et al.
2020/0366272 A1\* 11/2020 Nosaka .................. H03H 9/703

FOREIGN PATENT DOCUMENTS

JP 2008-160629 A 7/2008
WO 2017/199649 A1 11/2017

OTHER PUBLICATIONS

International Search Report and Written Opinion dated Oct. 23, 2018 for PCT/JP2018/031175 filed on Aug. 23, 2018, 8 pages including English Translation of the International Search Report.

\* cited by examiner

Comparative Example 1

Comparative Example 2

Frequency (1.429 GHz to 1.511 GHz)

―――― Example 1 - Tc (SW1: On, SW2: Off)
------ Comparative Example 2 - Tc (SWa: On, SWb: On, SWc: Off, SWd: Off, SWe: Off)

Frequency (1.429 GHz to 1.511 GHz)

——— Example 1 - T1 (SW1: On, SW2: Off)
---- Comparative Example 2 - T1 (SWa: On, SWb: On, SWc: Off, SWd: Off, SWe: Off)

Example 5

US 11,316,499 B2

FILTER DEVICE, MULTIPLEXER, RADIO FREQUENCY FRONT-END CIRCUIT, AND COMMUNICATION DEVICE

CROSS REFERENCE TO RELATED APPLICATIONS

This is a continuation application of PCT International Application No. PCT/JP2018/031175 filed on Aug. 23, 2018, designating the United States of America, which is based on and claims priority of Japanese Patent Application No. 2017-163618 filed on Aug. 28, 2017. The entire disclosures of the above-identified applications, including the specifications, drawings and claims are incorporated herein by reference in their entirety.

FIELD

The present disclosure relates to a filter device, a multiplexer, a radio frequency front-end circuit, and a communication device.

BACKGROUND

A frequency-tunable filter (a radio reception circuit) has been known which can switch between a filter having a narrow passband and a filter having a wide passband by switching between the conducting state (on) and the non-conducting state (off) of switches (for example, see Japanese Unexamined Patent Application Publication No. 2008-160629). Specifically, the frequency-tunable filter has a circuit configuration in which a filter having a narrow band and a relatively low center frequency and a filter having a narrow band and a relatively high center frequency are connected in parallel to each other, and switches are connected to upstream and downstream of one of the two filters connected in parallel.

SUMMARY

Technical Problem

In recent years, there has been a demand for a multi-band system that can switch between a filter having a relatively wide passband and a multiplexer that demultiplexes or multiplexes a plurality of passbands narrower than the relatively wide passband of the filter. An example of such a multi-band system is a system that switches between time division duplex (TDD) for a wide passband and a frequency division duplex (FDD) in which a narrow passband included in the wide passband is a transmission band, and a narrow passband included in the wide passband is a receiving band.

In order to achieve the above system using the frequency-tunable filter described in Japanese Unexamined Patent Application Publication No. 2008-160629, it is necessary to configure a filter device in which the frequency-tunable filter described in Japanese Unexamined Patent Application Publication No. 2008-160629 and other filters each having narrow passbands are connected to a common terminal. In this case, a total of three filters are necessary, which, as recognized by the present inventor, raises a problem of an increase in the circuit scale.

In view of this, the present disclosure describes a small filter device that can switch between a filter having a wide passband and a multiplexer having narrow passbands, a multiplexer, a radio frequency front-end circuit, and a communication device.

Solutions to Problem

In order to provide such a filter device, a filter device according to an aspect of the present disclosure includes: a first filter connected to a first path that connects a common terminal and a first input/output terminal, the first filter having a passband that is a first band; a second filter connected to a second path that connects the common terminal and a second input/output terminal, the second filter having a passband that is a second band, the second band having a frequency range that is different from, and not overlapping with, a frequency range of the first band; a first switch element connected between a first node on the first path and a second node on the second path, the first node being located between the first filter and the first input/output terminal, the second node being located between the second filter and the second input/output terminal; and a second switch element on the second path, the second switch element being connected between the second node and the second input/output terminal.

According to the above configuration, a small filter device that switches between (1) and (2) below by switching between on and off of the first switch element and the second switch element can be provided: (1) a filter having a relatively wide passband (hereinafter, defined as a third band) that includes the first band and the second band, and formed between the common terminal and the first input/output terminal, and (2) a multiplexer that multiplexes or demultiplexes a signal passing through the first filter having a relatively narrow passband that is the first band and formed between the common terminal and the first input/output terminal, and a signal passing through the second filter having a relatively narrow passband that is the second band and formed between the common terminal and the second input/output terminal.

The first switch element and the second switch element may be switched between conducting and non-conducting states mutually exclusively from each other.

Accordingly, when the first switch element is on and the second switch is off, a filter having a passband that is the third band that includes at least a portion of the first band and at least a portion of the second band is formed between the common terminal and the first input/output terminal. On the other hand, when the first switch element is off and the second switch is on, a multiplexer having a passband that is the first band between the common terminal and the first input/output terminal, and a passband that is the second band between the common terminal and the second input/output terminal is formed. Thus, a small filter device can be provided since a wide-band filter and a multiplexer can be achieved by using two filter elements and two switch elements.

The filter device may further include: a third switch element connected between a ground and a third node on the second path, the third node being located between the second switch element and the second input/output terminal, and the second switch element and the third switch element may be switched between conducting and non-conducting states mutually exclusively from each other.

Accordingly, passband insertion loss can be decreased in a filter having a passband that is the third band and formed between the common terminal and the first input/output terminal when the first switch element is on and the second switch element is off.

"Off-capacitance" of the first switch element, which is capacitance of the first switch element when non-conducting, may be smaller than off-capacitance of the second switch element, which is capacitance of the second switch element when non-conducting.

The first switch element is off when the filter device forms a multiplexer. At this time, mutual interference of the first filter and the second filter increases when the first switch element has great off-capacitance, and consequently characteristics of the attenuation band of one of the filters corresponding to the passband of the other filter deteriorate. On the other hand, the second switch element is off when the filter device forms a filter having a wide passband. At this time, a device that passes a signal is not present between the second switch element and the second input/output terminal, and thus even if off-capacitance of the second switch element increases, this does not affect the attenuation of the filter. As described above, by making the off-capacitance of the first switch element smaller than the off-capacitance of the second switch element, the balance of the characteristics of the filter device can be optimized while improving attenuation characteristics of the multiplexer.

Off-capacitance of the first switch element may be at most 0.10 pF.

Accordingly, when the filter device forms a multiplexer, attenuation characteristics of the multiplexer can be improved.

Off-capacitance of the second switch element may be at most 0.35 pF.

Accordingly, insertion loss of a filter having a passband that is the wide third band, and formed between the common terminal and the first input/output terminal can be decreased.

The first switch element may include a plurality of unit switches connected in series, the filter device may further include a fourth switch element connected between a ground and a fourth node that is one of connection nodes of the plurality of unit switches, and the switch states of the first switch element and the fourth switch element may be switched between conducting and non-conducting states mutually exclusively with respect to each other.

Accordingly, when the filter device forms a multiplexer, attenuation characteristics of the multiplexer can be improved even if the first switch element having a small size and great off-capacitance is used. Accordingly, the filter device can be miniaturized.

The filter device may further include: a third filter on the second path, the third filter being connected between the second switch element and the second input/output terminal, and having a passband that is the second band.

According to this, when the first switch element is on and the second switch element is off, and a filter having a passband that is the third band is operating between the common terminal and the first input/output terminal, the third filter does not operate. On the other hand, when the first switch element is off and the second switch element is on, and a multiplexer is operating, the third filter operates between the common terminal and the second input/output terminal, and characteristics of attenuation that occurs outside the passband of a filter formed between the common terminal and the second input/output terminal and having a passband that is the second band improve.

The frequency range of the first band may be lower than the frequency range of the second band, and a lower-frequency skirt adjacent to the second band in passing characteristics of the third filter alone may be steeper than a lower-frequency skirt adjacent to the second band in passing characteristics of the second filter alone.

When a filter having a wide passband that is the third band is operating between the common terminal and the first input/output terminal, the steeper a lower-frequency skirt adjacent to the second band of the second filter is, the more likely a ripple occurs in the passband. On the other hand, when a multiplexer is operating, the steeper a lower-frequency skirt adjacent to the second band of the second filter is, the more isolation (attenuation) in the first band improves between the first input/output terminal and the second input/output terminal. According to the above configuration, the third filter that has a highly steep lower-frequency skirt adjacent to the second band and does not contribute to forming the third band is disposed, and thus attenuation characteristics and isolation characteristics of a multiplexer that includes the first filter, and a filter circuit in which the second filter and the third filter are cascaded can be improved while decreasing a ripple in a filter having a wide passband that is the third band.

Furthermore, the number of resonators in the second filter included in a multiplexer can be decreased by disposing the third filter. Specifically, this allows fewer resonators to be included in the second filter and the second band to have a wider width, and thus a ripple in the third band can be decreased.

The frequency range of the first band may be lower than the frequency range of the second band, the second filter may include a third input/output terminal and a fourth input/output terminal, a frequency at which impedance when the second filter alone is viewed from the third input/output terminal has a local maximum value may be at most a frequency at a lower edge of the second band, and a frequency at which impedance when the second filter alone is viewed from the fourth input/output terminal has a local maximum value may be at most the frequency at the lower edge of the second band.

Accordingly, a ripple in the wide passband of the filter that is the third band can be decreased down to 20 dB or lower.

The frequency range of the first band may be lower than the frequency range of the second band, and a difference between a phase shift caused by the first filter alone and a phase shift caused by the second filter alone may be in a range from −50° to +50° at a frequency at which the first filter alone and the second filter alone have an identical amplitude.

Accordingly, a ripple in the wide passband of the filter that is the third band can be decreased down to 10 dB or lower.

The second filter may include a third input/output terminal and a fourth input/output terminal, a frequency at which impedance when the second filter alone is viewed from the third input/output terminal has a local maximum value may be at most a frequency at a higher edge of the first band, and a frequency at which impedance when the second filter alone is viewed from the fourth input/output terminal has a local maximum value may be at most the frequency at the higher edge of the first band.

Accordingly, a ripple in the wide passband of the filter that is the third band can be decreased down to 5 dB or lower.

The second filter may include: a third input/output terminal; a fourth input/output terminal; a filter circuit having resonance characteristics; a first phase shifter connected between one terminal of the filter circuit and the third input/output terminal; and a second phase shifter connected between another terminal of the filter circuit and the fourth input/output terminal.

Accordingly, a difference between phase shifts caused by the first filter and the second filter can be optimized.

The frequency range of the first band may be higher than the frequency range of the second band, and a higher-frequency skirt adjacent to the second band in passing characteristics of the third filter alone may be steeper than a higher-frequency skirt adjacent to the second band in passing characteristics of the second filter alone.

When a filter having a wide passband that is the third band is operating between the common terminal and the first input/output terminal, the steeper a higher-frequency skirt adjacent to the second band of the second filter is, the more likely a ripple occurs in the passband. On the other hand, when a multiplexer is operating, the steeper a higher-frequency skirt adjacent to the second band of the second filter is, the more isolation (attenuation) in the first band improves between the first input/output terminal and the second input/output terminal. According to the above configuration, the third filter that has a highly steep higher-frequency skirt adjacent to the second band and does not contribute to forming the third band is disposed, and thus attenuation characteristics and isolation characteristics of a multiplexer that includes the first filter, and a filter circuit in which the second filter and the third filter are cascaded can be improved while decreasing a ripple in a filter having a wide passband that is the third band.

Furthermore, the number of resonators in the second filter included in a multiplexer can be decreased by disposing the third filter. Specifically, this allows fewer resonators to be included in the second filter and the second band to have a wider width, and thus a ripple in the third band can be decreased.

The frequency range of the first band may be higher than the frequency range of the second band, the first filter may include a third input/output terminal and a fourth input/output terminal, a frequency at which impedance when the first filter alone is viewed from the third input/output terminal has a local maximum value may be at most a frequency at a lower edge of the first band, and a frequency at which impedance when the first filter alone is viewed from the fourth input/output terminal has a local maximum value may be at most the frequency at the lower edge of the first band.

Accordingly, a ripple in the wide passband of the filter that is the third band can be decreased down to 20 dB or lower.

The frequency range of the first band may be higher than the frequency range of the second band, and a difference between a phase shift caused by the first filter alone and a phase shift caused by the second filter alone may be in a range from −50° to +50° at a frequency at which the first filter alone and the second filter alone have an identical amplitude.

Accordingly, a ripple in the wide passband of the filter that is the third band can be decreased down to 10 dB or lower.

The first filter may include a third input/output terminal and a fourth input/output terminal, a frequency at which impedance when the first filter alone is viewed from the third input/output terminal has a local maximum value may be at most a frequency at a higher edge of the second band, and a frequency at which impedance when the first filter alone is viewed from the fourth input/output terminal has a local maximum value may be at most the frequency at the higher edge of the second band.

Accordingly, a ripple in the wide passband of the filter that is the third band can be decreased down to 5 dB or lower.

The first filter may include: a third input/output terminal; a fourth input/output terminal; a filter circuit having resonance characteristics; a first phase shifter connected between one terminal of the filter circuit and the third input/output terminal; and a second phase shifter connected between another terminal of the filter circuit and the fourth input/output terminal.

Accordingly, a difference between phase shifts caused by the first filter and the second filter can be optimized.

The first phase shifter and the second phase shifter may each include an impedance element that includes at least one of a capacitor or an inductor.

Accordingly, by using a lumped-constant element, a difference between phase shifts caused by the first filter and the second filter can be optimized, and furthermore the first phase shifter and the second phase shifter can be miniaturized.

At least one of the first phase shifter or the second phase shifter may include: an inductor disposed on the second path; and a capacitor connected between a node on the second path and a ground.

Accordingly, characteristics of attenuation in a higher frequency range than the third band can be improved while optimizing a difference between phase shifts caused by the first filter and the second filter.

At least one of the first phase shifter or the second phase shifter may include: a capacitor disposed on the second path; and an inductor connected between a node on the second path and a ground.

Accordingly, characteristics of attenuation that occurs in a lower frequency range than the third band can be improved while optimizing a difference between phase shifts caused by the first filter and the second filter.

At least one of the first filter or the second filter exhibits a change in frequency range of corresponding passband in response to a change between conducting and non-conducting states of a switch element.

According to the above configuration, the passbands of both (1) and (2) below can be changed: (1) a filter having a relatively wide passband that includes the first band and the second band, and (2) a multiplexer that multiplexes or demultiplexes a relatively narrow passband that is the first band and a relatively narrow passband that is the second band.

The filter device may further include: a fifth input/output terminal; a fourth filter connected to a third path that connects the common terminal and the fifth input/output terminal, and having a passband that is a fourth band, the fourth band having a frequency range that is different from the frequency range of the first band and the frequency range of the second band, and does not overlap the frequency range of the first band; a fifth switch element connected between the first node and a fifth node on the third path, the fifth node being located between the fourth filter and the fifth input/output terminal; a sixth switch element on the third path, the sixth switch element being connected between the fifth node and the fifth input/output terminal; a seventh switch element connected between the common terminal and the second filter; and an eighth switch element connected between the common terminal and the fourth filter.

According to the above configuration, the second filter and the fourth filter can be selected by switching between on and off of the seventh switch element and the eighth switch element. Accordingly, a small filter device that switches among (1) to (4) below by switching between on and off of the first switch element, the second switch element, the fifth switch element, the sixth switch element, the seventh switch element, and the eighth switch element can be provided: (1) a filter having a passband that is the wide third band and formed between the common terminal and the first input/output terminal, (2) a filter having a relatively wide passband that includes the first band and the fourth band and formed between the common terminal and the first input/output terminal, (3) a multiplexer that multiplexes or demultiplexes a signal passing through the first filter having a relatively narrow passband that is the first band and formed between the common terminal and the first input/output terminal, and a signal passing through the second filter having a relatively narrow passband that is the second band and formed between the common terminal and the second input/output terminal, and (4) a multiplexer that multiplexes or demultiplexes a signal passing through the first filter having a relatively narrow passband that is the first band and formed between the common terminal and the first input/output terminal, and a signal passing through the fourth filter having a relatively narrow passband that is the fourth band and formed between the common terminal and the fifth input/output terminal.

Under a condition that the first switch element is conducting and the second switch element is non-conducting, the filter device may be configured as a filter for time division duplex (TDD) between the common terminal and the first input/output terminal, and under a condition that the first switch element is non-conducting and the second switch element is conducting, the filter device may be configured as a multiplexer for frequency division duplex (FDD) between the common terminal and the first input/output terminal and between the common terminal and the second input/output terminal.

According to this, a small filter device that serves as both of (1) and (2) below can be provided: (1) a filter for TDD having a passband that is the wide third band and formed between the common terminal and the first input/output terminal, and (2) a multiplexer for FDD that multiplexes or demultiplexes a signal passing through the first filter having a relatively narrow passband that is the first band and formed between the common terminal and the first input/output terminal, and a signal passing through the second filter having a relatively narrow passband that is the second band and formed between the common terminal and the second input/output terminal.

At least one of the first filter or the second filter may be one of a surface acoustic wave filter, a boundary acoustic wave filter, and an acoustic wave filter that uses a bulk acoustic wave (BAW).

Accordingly, a small filter device having high selectivity can be achieved.

A multiplexer according to an aspect of the present disclosure includes: a plurality of filter devices each of which is the filter device as stated above, and each common terminal of the plurality of filter devices are directly or indirectly connected to a common connection terminal.

According to the above configuration, a small multiplexer that switches between a group of filters each having a wide passband and a group of duplexers each having relatively narrow passbands can be provided.

A radio frequency front-end circuit according to an aspect of the present disclosure includes: the filter device as stated above; and an amplifier circuit directly or indirectly connected to the filter device or the multiplexer.

According to the above configuration, a small radio frequency front-end circuit that can switch between a filter having a relatively wide passband and a multiplexer having relatively narrow passbands can be provided.

A communication device according to an aspect of the present disclosure includes: a radio frequency (RF) signal processing circuit that processes a radio frequency signal to be transmitted by an antenna element and a radio frequency signal received by the antenna element; and the radio frequency front-end circuit as stated above that conveys the radio frequency signals between the antenna element and the RF signal processing circuit.

According to the above configuration, a small communication device that can switch between a filter having a relatively wide passband and a multiplexer having relatively narrow passbands can be provided.

Advantageous Effects

The present disclosure provides a small filter device that can switch between a filter having a wide passband and a multiplexer having narrow passbands, a multiplexer, a radio frequency front-end circuit, and a communication device.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1A:
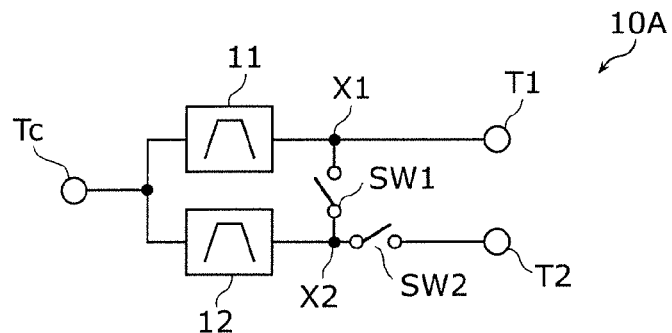
FIG. 1A is a circuit block diagram of a filter device according to Example 1.

The following describes in detail embodiments of the present disclosure, using examples and drawings. Note that the embodiments described below each show a general or specific example. The numerical values, shapes, materials, elements, the arrangement and connection of the elements, and others indicated in the following embodiments are mere examples, and therefore are not intended to limit the present disclosure. Thus, among the elements in the following embodiments, elements not recited in any independent claim are described as arbitrary elements. In addition, the sizes of elements and the ratios of the sizes illustrated in the drawings are not necessarily accurate. Throughout the drawings, the same numeral is given to substantially the same element, and redundant description is omitted or simplified. Constants of circuit elements such as resonators may be adjusted as appropriate according to, for instance, requirement specification. Accordingly, even if circuit elements have the same reference numeral, constants thereof may be different.

A resonant frequency of a resonator or a circuit is for forming an attenuation pole in or near a passband of a filter that includes the resonator or the circuit, and is a frequency at a "resonance point" that is a singular point at which impedance of the resonator or the circuit has a local minimum value (a point at which the impedance is ideally 0), unless otherwise stated.

An antiresonant frequency of a resonator or a circuit is for forming an attenuation pole in or near a passband of a filter that includes the resonator or the circuit, and is a frequency at an "antiresonance point" that is a singular point at which impedance of the resonator or the circuit has a local maximum value (a point at which the impedance is ideally infinite), unless otherwise stated.

Note that a series-arm (resonant) circuit and a parallel-arm (resonant) circuit in the following embodiments are defined as follows.

A parallel-arm (resonant) circuit is disposed between the ground and a node on a path that connects a first input/output terminal and a second input/output terminal.

A series-arm (resonant) circuit is disposed between the first input/output terminal or the second input/output terminal and the node on the path connected with the parallel-arm (resonant) circuit, or between a node on the path connected with one parallel-arm (resonant) circuit and another node on the path connected with another parallel-arm (resonant) circuit.

In the following, a "passband low-frequency edge" means "the lowest frequency in a passband". A "passband high-frequency edge" means "the highest frequency in a passband". In the following, a "passband low-frequency side" means "a lower-frequency side relative to a passband, which is outside the passband". A "passband high-frequency side" means "a higher-frequency side relative to a passband, which is outside the passband". In the following, if a passband is not-specifically defined in terms of passband low-frequency edge to passband high-frequency edge, generally it may be presumed that a passband with symmetrical edges (e.g., a passband defined by its 3 dB points) is described.

Embodiment 1

1.1 Filter Device According to Example 1 and Variation 1

FIG. 1A is a circuit block diagram of filter device 10A according to Example 1. Filter device 10A illustrated in FIG. 1A includes filters 11 and 12, switches SW1 and SW2, common terminal Tc, and input/output terminals T1 and T2.

In this example, filter 11 is a first filter connected to a first path that connects common terminal Tc and input/output terminal T1, and having a passband that is a first band. Filter 12 is a second filter connected to a second path that connects common terminal Tc and input/output terminal T2, and having a passband that is a second band. The second band has a frequency range that is higher than the frequency range of the first band, and does not overlap the frequency range of the first band. In this example, input/output terminal T1 corresponds to a first input/output terminal, and input/output terminal T2 corresponds to a second input/output terminal.

Switch SW1 is a first switch element connected between node X1 and node X2. Switch SW2 is a second switch element connected between node X2 and input/output terminal T2. Node X1 is a first node on the first path, between filter 11 and input/output terminal T1, and node X2 is a second node on the second path, between filter 12 and input/output terminal T2.

Figure 1B:
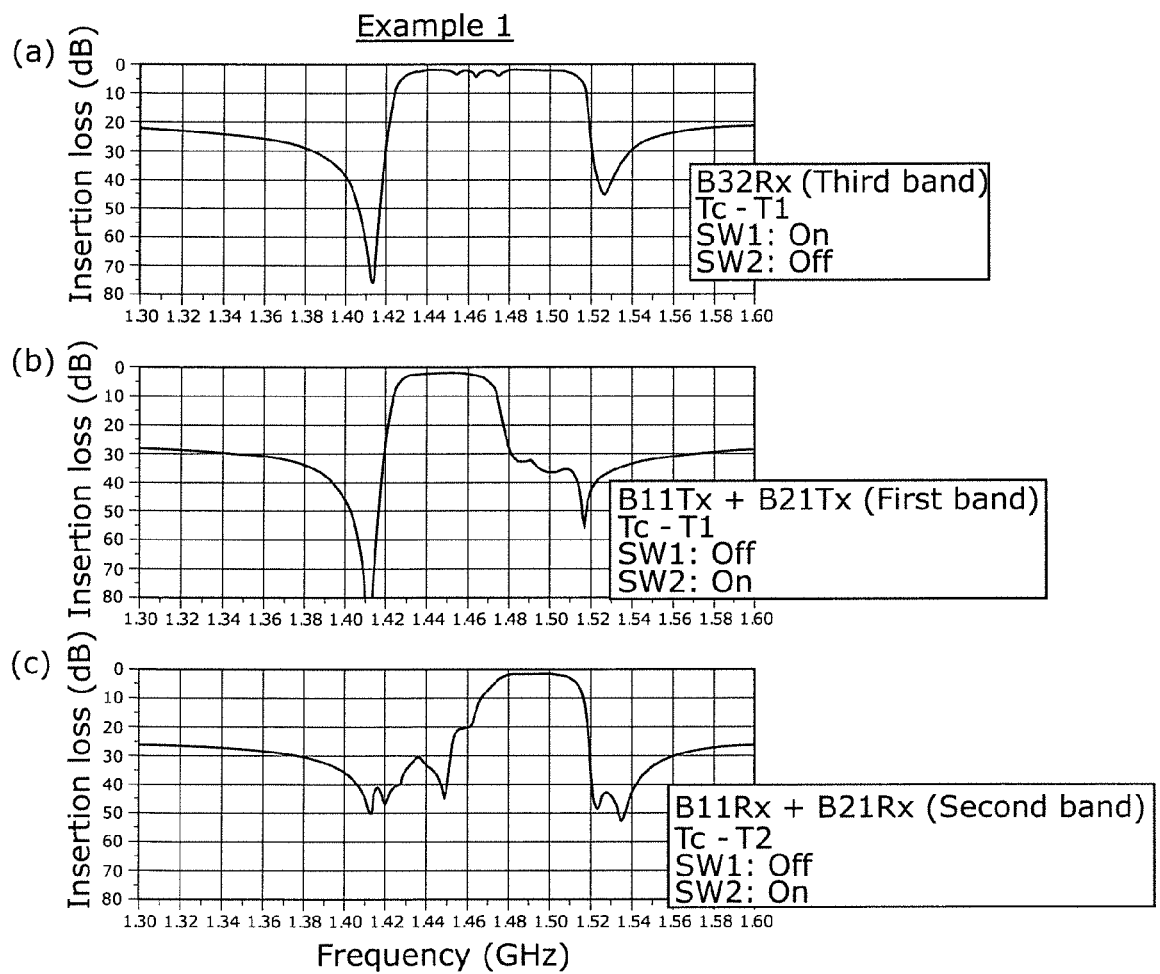
FIG. 1B illustrates graphs showing passing characteristics of the filter device according to Example 1.

FIG. 1B illustrates graphs showing passing characteristics of filter device 10A according to Example 1. Part (a) of FIG. 1B illustrates passing characteristics between common terminal Tc and input/output terminal T1 when switch SW1 is conducting (on) and switch SW2 is non-conducting (off). Part (b) of FIG. 1B illustrates passing characteristics between common terminal Tc and input/output terminal T1 when switch SW1 is off and switch SW2 is on. Part (c) of FIG. 1B illustrates passing characteristics between common terminal Tc and input/output terminal T2 when switch SW1 is off and switch SW2 is on.

Note that in this example, the first band of filter 11 is a band (1428 to 1463 MHz) that includes a transmission band of long term evolution (LTE) Band 11 (Band11Tx: 1428 to 1448 MHz) and a transmission band of LTE Band 21 (Band21Tx: 1448 to 1463 MHz). The second band of filter 12 is a band (1476 to 1511 MHz) that includes a receiving band of LTE Band 11 (Band11Rx: 1476 to 1496 MHz), and a receiving band of LTE Band 21 (Band21Rx: 1496 to 1511 MHz).

As illustrated in (a) of FIG. 1B, when switch SW1 is on and switch SW2 is off, filter device 10A forms a filter having a relatively wide third band that includes the first band and the second band, between common terminal Tc and input/output terminal T1. In this example, the third band is a band (1428 to 1511 MHz) that includes the receiving band of LTE Band 32 (Band32Rx: 1452 to 1496 MHz). Thus, the third band includes at least a portion of the first band, and at least a portion of the second band.

Note that the second band is defined to be a single band having continuous frequencies, rather than a band made up of discrete bands.

On the other hand, as illustrated in (b) and (c) of FIG. 1B, when switch SW1 is off and switch SW2 is on, filter device 10A forms a duplexer (a version of a multiplexer/demultiplex that separates signals in two different channels) in which filter 11 having a relatively narrow passband that is the first band between common terminal Tc and input/output terminal T1 is connected, via common terminal Tc, to filter 12 having a relatively narrow passband that is the second band between common terminal Tc and input/output terminal T2.

Specifically, a small filter device that switches between (1) and (2) below by switching between on and off of switches SW1 and SW2 can be provided: (1) a filter having a relatively wide passband (third band) that includes the first band and the second band, and formed between common terminal Tc and input/output terminal T1, and (2) a multiplexer that multiplexes or demultiplexes a signal passing through filter 11 having a relatively narrow passband that is the first band and formed between common terminal Tc and input/output terminal T1, and a signal passing through filter 12 having a relatively narrow passband that is the second band and formed between common terminal Tc and input/output terminal T2.

As described above, the filter as in (1) and the multiplexer as in (2) are switched by switching between on and off of switches SW1 and SW2 mutually exclusively from each other.

Note that not only when switches SW1 and SW2 are switched between on and off mutually exclusively from each other, but also when both switches SW1 and SW2 are on, filter device 10A according to this example is applicable as a power divider (or a power combiner) between common terminal Tc and input/output terminals T1 and T2. When both switches SW1 and SW2 are off, filter device 10A according to this example is applicable as a narrow band filter (filter 11) having a passband that is the first band, between common terminal Tc and input/output terminal T1.

Note that switch SW2 may be disposed between node X1 and input/output terminal T1, instead of being disposed between node X2 and input/output terminal T2.

Figure 1C:
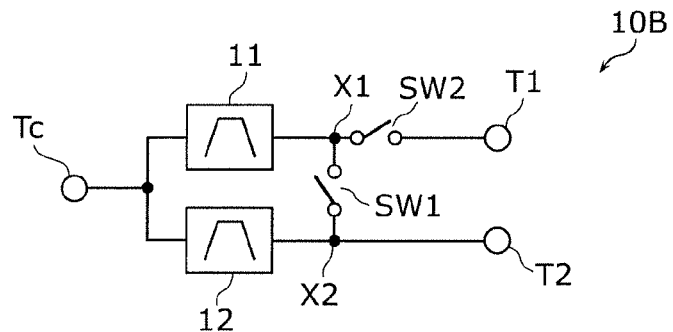
FIG. 1C is a circuit block diagram of a filter device according to Variation 1.

FIG. 1C is a circuit block diagram of filter device 10B according to Variation 1. Filter device 10B illustrated in FIG. 1C includes filters 11 and 12, switches SW1 and SW2, common terminal Tc, and input/output terminals T1 and T2. Filter device 10B according to this variation is different from filter device 10A according to Example 1 in the location of switch SW2 in the configuration. In the following, description of common points of filter device 10B according to this variation to those of filter device 10A according to Example 1 is omitted, and different points are mainly described.

In this variation, filter 11 is a second filter connected to a second path that connects common terminal Tc and input/output terminal T1 (second input/output terminal), and having a passband that is the second band. Filter 12 is a first filter connected to a first path that connects common terminal Tc and input/output terminal T2 (first input/output terminal), and having a passband that is the first band. The second band has a frequency range that is lower than the frequency range of the first band, and does not overlap the frequency range of the first band. In this variation, input/output terminal T1 corresponds to the second input/output terminal, and input/output terminal T2 corresponds to the first input/output terminal.

Switch SW1 is a first switch element connected between node X1 and node X2. Switch SW2 is a second switch element connected between node X1 and input/output terminal T1. Node X1 is a second node on the second path, between filter 11 and input/output terminal T1, and node X2 is a first node on the first path, between filter 12 and input/output terminal T2.

Figure 1D:
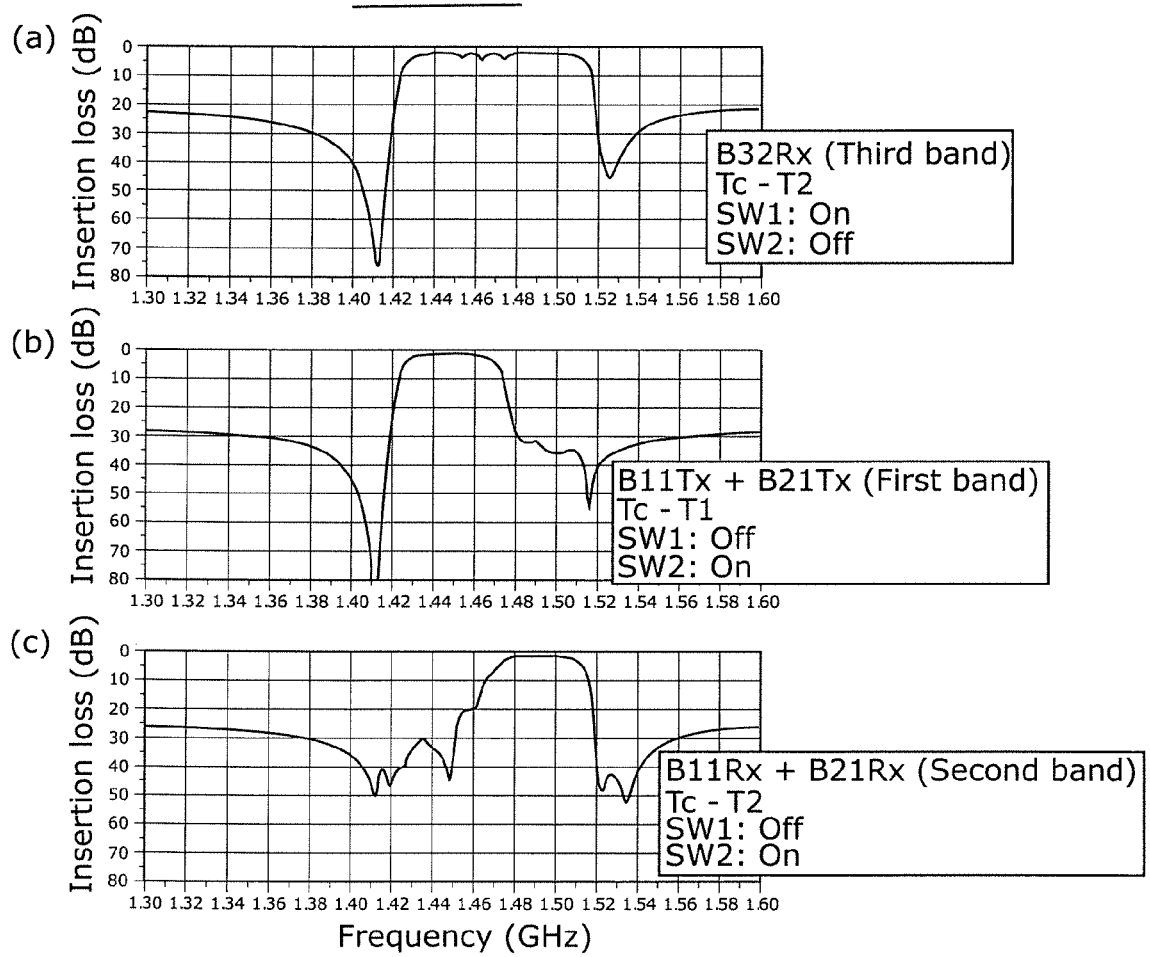
FIG. 1D illustrates graphs showing passing characteristics of the filter device according to Variation 1.

FIG. 1D illustrates graphs showing passing characteristics of filter device 10B according to Variation 1. Part (a) of FIG. 1D illustrates passing characteristics between common terminal Tc and input/output terminal T2 when switch SW1 is on and switch SW2 is off. Part (b) of FIG. 1D illustrates passing characteristics between common terminal Tc and input/output terminal T1 when switch SW1 is off and switch SW2 is on. Part (c) of FIG. 1D illustrates passing characteristics between common terminal Tc and input/output terminal T2 when switch SW1 is off and switch SW2 is on.

As illustrated in (a) of FIG. 1D, when switch SW1 is on and switch SW2 is off, filter device 10B forms a filter having the relatively wide third band that includes the first band and the second band, between common terminal Tc and input/output terminal T1.

On the other hand, as illustrated in (b) and (c) of FIG. 1D, when switch SW1 is off and switch SW2 is on, filter device 10B forms a duplexer (multiplexer) in which filter 11 having a relatively narrow passband that is the second band between common terminal Tc and input/output terminal T1 is connected, via common terminal Tc, to filter 12 having a relatively narrow passband that is the first band between common terminal Tc and input/output terminal T2.

Specifically, also in this variation, a small filter device that switches between (1) and (2) below by switching between on and off of switches SW1 and SW2 can be provided: (1) a filter having a relatively wide passband (third band) that includes the first band and the second band and formed between common terminal Tc and input/output terminal T2 (input/output terminal T1 in Example 1), and (2) a multiplexer that multiplexes or demultiplexes a signal passing through filter 11 having a relatively narrow passband that is the second band and formed between common terminal Tc and input/output terminal T1, and a signal passing through filter 12 having a relatively narrow passband that is the first band and formed between common terminal Tc and input/output terminal T2.

As described above, the filter as in (1) and the multiplexer as in (2) are switched by switching between on and off of switches SW1 and SW2 mutually exclusively from each other.

Note that not only when switches SW1 and SW2 are switched between on and off mutually exclusively from each other, but also when both switches SW1 and SW2 are on, filter device 10B according to this example is applicable as a power divider (or a power combiner) between common terminal Tc and input/output terminals T1 and T2. When both switches SW1 and SW2 are off, filter device 10B is applicable as a narrow band filter (filter 12) having a passband that is the first band, between common terminal Tc and input/output terminal T2.

As in Example 1 and Variation 1 above, the location where switch SW2 is connected may be closer to filter 12 or to filter 11. Note that in Example 1, switch SW2 is connected between filter 12 and input/output terminal T2, and thus signal propagation loss on the filter 11 side (between common terminal Tc and input/output terminal T1) where switch SW2 is not disposed is decreased. In Variation 1, switch SW2 is connected between filter 11 and input/output terminal T1, and thus signal propagation loss is decreased on the filter 12 side (between common terminal Tc and input/output terminal T2) where switch SW2 is not disposed.

When a low-noise amplifier is connected to one of input/output terminals T1 and T2 and a power amplifier is or is not connected to the other terminal, switch SW2 is desirably connected to the one of the terminals to which the low-noise amplifier is connected. This is because a switch having high power durability has a large size, and thus switch SW2 can be miniaturized by being disposed on the low-noise amplifier side where power consumption is low.

When switch SW1 is on and switch SW2 is off, filter device 10A according to Example 1 may be used as a filter for time division duplex (TDD) between common terminal Tc and input/output terminal T1. On the other hand, when switch SW1 is off and switch SW2 is on, filter device 10A may be used as a multiplexer for frequency division duplex (FDD), between common terminal Tc and input/output terminal T1 and between common terminal Tc and input/output terminal T2. Accordingly, this provides a small filter device that serves as both (1) a filter for TDD having a wide passband that is the third band and formed between common terminal Tc and input/output terminal T1, and (2) a multiplexer for FDD that multiplexes or demultiplexes a signal passing through filter 11 having a relatively narrow passband that is the first band and formed between common terminal Tc and input/output terminal T1, and a signal passing through filter 12 having a relatively narrow passband that is the second band and formed between common terminal Tc and input/output terminal T2.

When switch SW1 is on and switch SW2 is off, filter device 10B according to Variation 1 may be used as a filter for time division duplex (TDD) between common terminal Tc and input/output terminal T2. On the other hand, when switch SW1 is off and switch SW2 is on, filter device 10B may be used as a multiplexer for frequency division duplex (FDD) between common terminal Tc and input/output terminal T1 and between common terminal Tc and input/output terminal T2. Accordingly, this provides a small filter device that serves as both (1) a filter for TDD having a wide passband that is the third band and formed between common terminal Tc and input/output terminal T2, and (2) a multiplexer for FDD that multiplexes or demultiplexes a signal passing through filter 12 having a relatively narrow passband that is the first band and formed between common terminal Tc and input/output terminal T2, and a signal passing through filter 11 having a relatively narrow passband that is the second band and formed between common terminal Tc and input/output terminal T1.

Here, configurations and features of filter devices according to Comparative Examples 1 and 2 are to be described in order to explain that filter devices 10A and 10B according to Example 1 and Variation 1 can achieve a filter having a wide passband and a multiplexer having a plurality of narrow passbands, using a small circuit configuration.

1.2 Filter Devices According to Comparative Examples 1 and 2

Figure 2A:
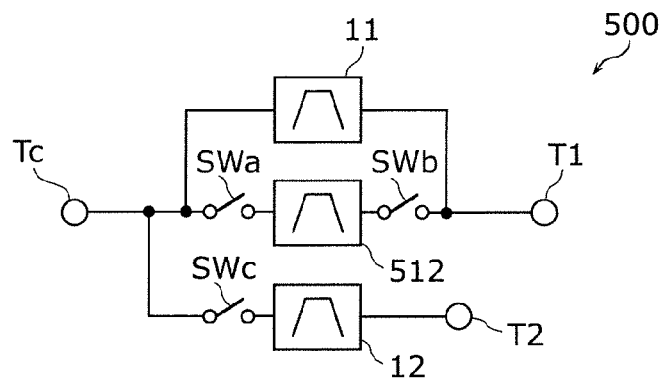
FIG. 2A is a circuit block diagram of a filter device according to Comparative Example 1.

FIG. 2A is a circuit block diagram of filter device 500 according to Comparative Example 1. Filter device 500 illustrated in FIG. 2A includes filters 11, 12, and 512, switches SWa, SWb and SWc, common terminal Tc, and input/output terminals T1 and T2.

In this comparative example, filter 11 is connected to the first path that connects common terminal Tc and input/output terminal T1, and has a passband that is the first band. Filter 12 is connected to the second path that connects common terminal Tc and input/output terminal T2, and has a passband that is the second band. Filter 512 is connected to a fourth path that connects common terminal Tc and input/output terminal T1 and is different from the first path, and has a passband that is the second band. The second band has a frequency range that is higher than the frequency range of the first band, and does not overlap the frequency range of the first band.

Switch SWa is connected to the fourth path between common terminal Tc and filter 512, switch SWb is connected to the fourth path between filter 512 and input/output terminal T1, and switch SWc is connected to the second path between common terminal Tc and filter 12.

Figure 2B:
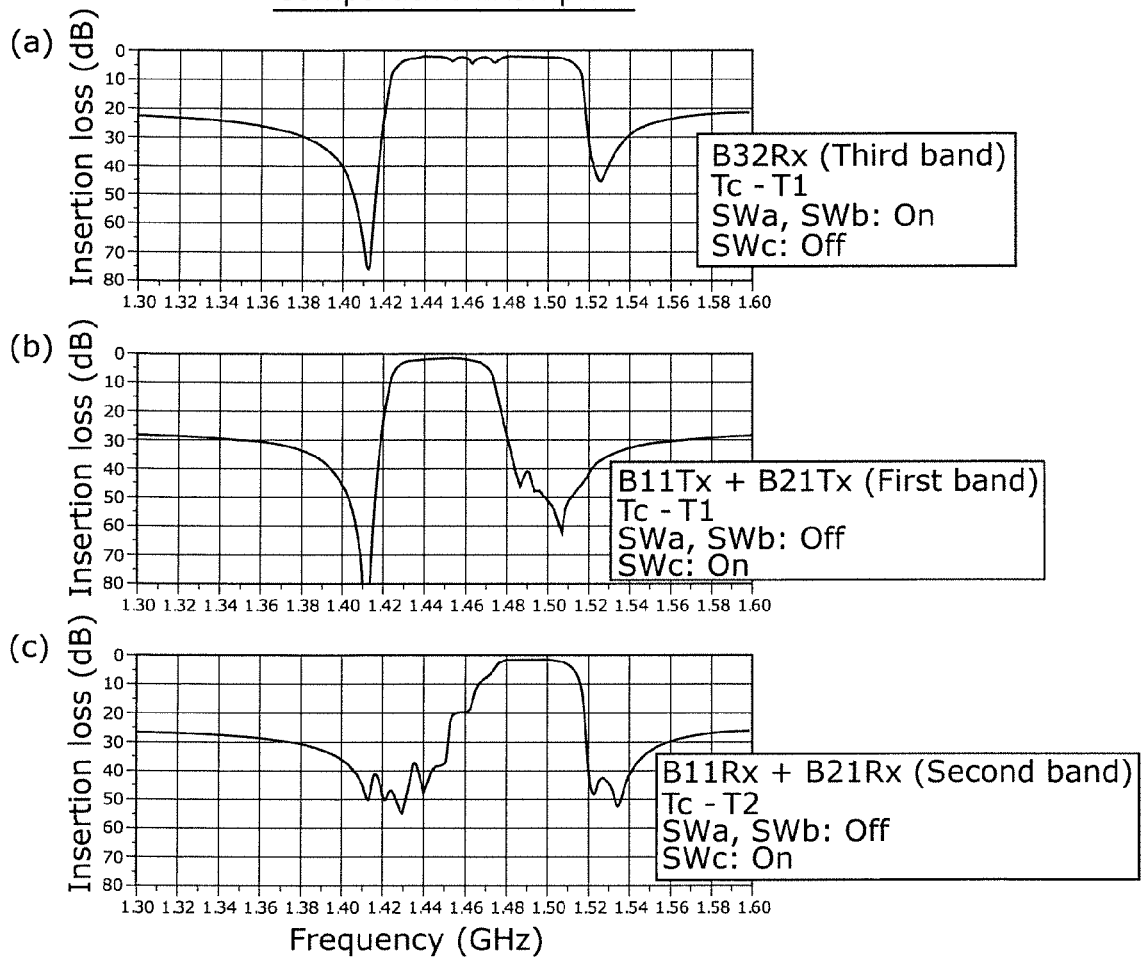
FIG. 2B illustrates graphs showing passing characteristics of the filter device according to Comparative Example 1.

FIG. 2B illustrates graphs showing passing characteristics of filter device 500 according to Comparative Example 1. Part (a) of FIG. 2B illustrates passing characteristics between common terminal Tc and input/output terminal T1 when switches SWa and SWb are on, and switch SWc is off. Part (b) of FIG. 2B illustrates passing characteristics between common terminal Tc and input/output terminal T1 when switches SWa and SWb are off, and switch SWc is on. Part (c) of FIG. 2B illustrates passing characteristics between common terminal Tc and input/output terminal T2 when switches SWa and SWb are off, and switch SWc is on.

Note that also in this comparative example, the first band includes the transmission band of LTE Band 11 and the transmission band of LTE Band 21, the second band includes the receiving band of LTE Band 11 and the receiving band of LTE Band 21, and the third band includes the receiving band of LTE Band 32, similarly to Example 1.

As illustrated in (a) of FIG. 2B, when switches SWa and SWb are on and switch SWc is off, filter device 500 forms, between common terminal Tc and input/output terminal T1, a filter having the relatively wide third band that includes the first band and the second band, using a combined circuit of filter 11 and filter 512.

On the other hand, as illustrated in (b) and (c) of FIG. 2B, when switches SWa and SWb are off and switch SWc is on, filter device 500 forms a duplexer (multiplexer) in which filter 11 having a relatively narrow passband that is the first band between common terminal Tc and input/output terminal T1 is connected, via common terminal Tc, to filter 12 having a relatively narrow passband that is the second band between common terminal Tc and input/output terminal T2.

However, filter device 500 according to Comparative Example 1 needs three filters 11, 12, and 512, and three switches SWa, SWb, and SWc, and thus has a larger size than the size of filter device 10A according to Example 1.

In the multiplexer formed when switches SWa and SWb are off and switch SWc is on, insertion loss on the filter 11 side is 3.75 dB, and insertion loss on the filter 12 side is 3.56 dB according to Comparative Example 1. On the other hand, insertion loss on the filter 11 side is 3.60 dB, and insertion loss on the filter 12 side is 3.56 dB in the multiplexer according to Example 1. Thus, the insertion loss on the filter 11 side is greater in Comparative Example 1 than in Example 1. This is because more switches are added in series and loss due to the switches in the multiplexer is greater in Comparative Example 1 than in Example 1.

Figure 3A:
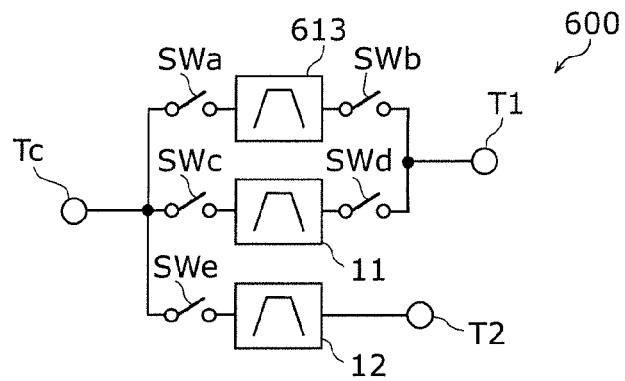
FIG. 3A is a circuit block diagram of a filter device according to Comparative Example 2.

FIG. 3A is a circuit block diagram of filter device 600 according to Comparative Example 2. Filter device 600 illustrated in FIG. 3A includes filters 11, 12, and 613, switches SWa, SWb, SWc, SWd, and SWe, common terminal Tc, and input/output terminals T1 and T2.

In this comparative example, filter 11 is connected to the first path that connects common terminal Tc and input/output terminal T1, and has a passband that is the first band. Filter 12 is connected to the second path that connects common terminal Tc and input/output terminal T2, and has a passband that is the second band. Filter 613 is connected to the fourth path that connects common terminal Tc and input/output terminal T1 and is different from the first path, and has a passband that is the third band. The second band has a frequency range that is higher than the frequency range of the first band, and does not overlap the frequency range of the first band. The third band is a relatively wide frequency band that includes the first band and the second band.

Switch SWa is connected to the fourth path, between common terminal Tc and filter 613, switch SWb is connected to the fourth path, between filter 613 and input/output terminal T1, switch SWc is connected to the first path, between common terminal Tc and filter 11, switch SWd is connected to the first path, between filter 11 and input/output terminal T1, and switch SWe is connected to the second path, between common terminal Tc and filter 12.

Figure 3B:
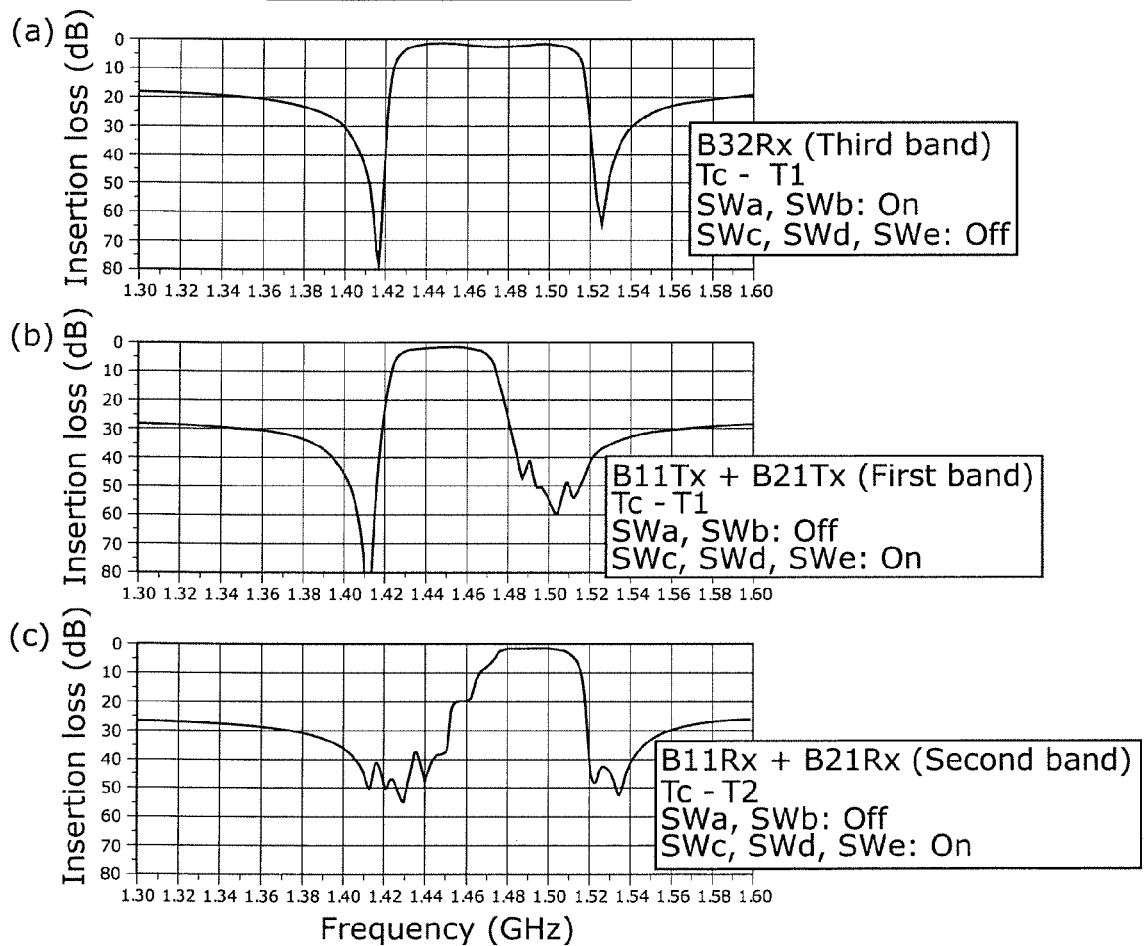
FIG. 3B illustrates graphs showing passing characteristics of the filter device according to Comparative Example 2.

FIG. 3B illustrates graphs showing passing characteristics of filter device 600 according to Comparative Example 2. Part (a) of FIG. 3B illustrates passing characteristics between common terminal Tc and input/output terminal T1 when switches SWa and SWb are on, and switches SWc, SWd, and SWe are off. Part (b) of FIG. 3B illustrates passing characteristics between common terminal Tc and input/output terminal T1 when switches SWa and SWb are off, and switches SWc, SWd, and SWe are on. Part (c) of FIG. 3B illustrates passing characteristics between common terminal Tc and input/output terminal T2 when switches SWa and SWb are off, and switches SWc, SWd, and SWe are on.

Note that also in this comparative example, the first band includes the transmission band of LTE Band 11 and the transmission band of LTE Band 21, the second band includes the receiving band of LTE Band 11 and the receiving band of LTE Band 21, and the third band includes the receiving band of LTE Band 32, similarly to Example 1.

As illustrated in (a) of FIG. 3B, when switches SWa and SWb are on and switches SWc, SWd, and SWe are off, filter device 600 forms a filter having the relatively wide third band that includes the first band and the second band between common terminal Tc and input/output terminal T1, using filter 613.

On the other hand, as illustrated in (b) and (c) of FIG. 3B, when switches SWa and SWb are off and switches SWc, SWd, and SWe are on, filter device 600 forms a duplexer (multiplexer) in which filter 11 having a relatively narrow passband that is the first band between common terminal Tc and input/output terminal T1 is connected, via common terminal Tc, to filter 12 having a relatively narrow passband that is the second band between common terminal Tc and input/output terminal T2.

However, filter device 600 according to Comparative Example 2 needs three filters 11, 12, and 613, and five switches SWa, SWb, SWc, SWd, and SWe, and thus has a larger size than the size of filter device 10A according to Example 1.

Figure 4A:
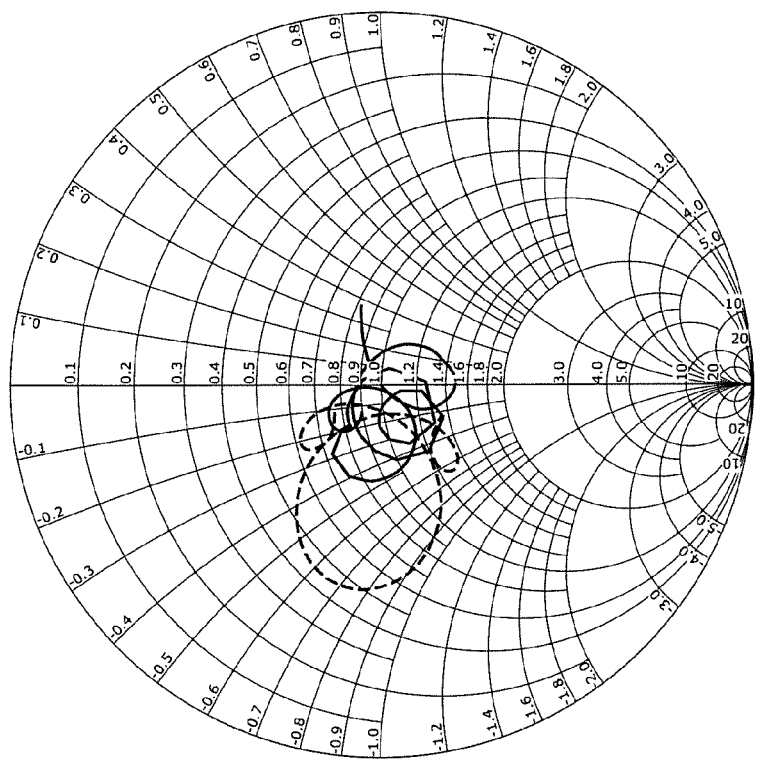
FIG. 4A is a Smith chart showing comparisons of impedance on the common terminal side in a filter mode in Example 1 and Comparative Example 2.
Figure 4B:
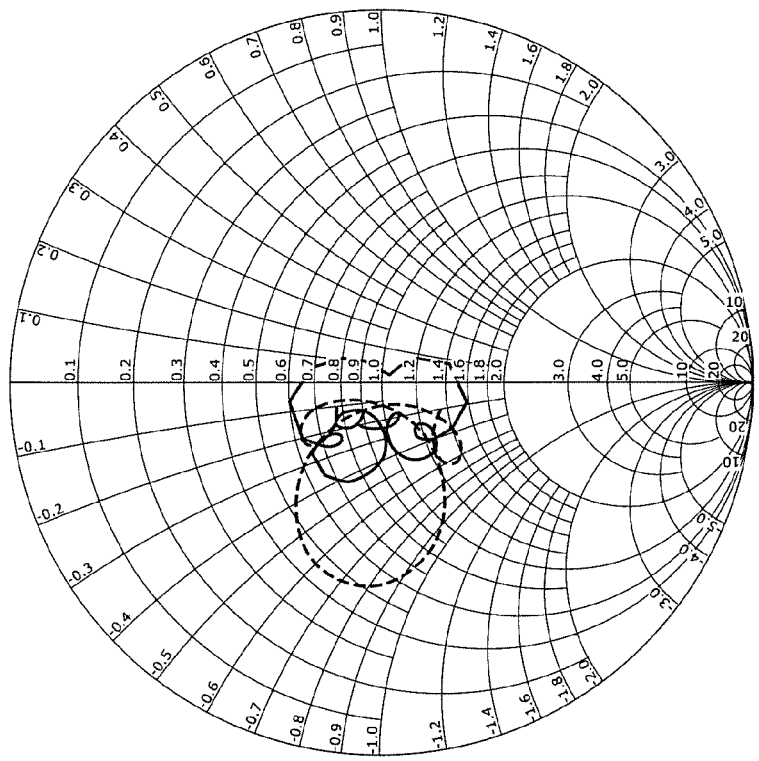
FIG. 4B is a Smith chart showing comparisons of impedance on the input/output terminal side in the filter mode in Example 1 and Comparative Example 2.

FIG. 4A is a Smith chart showing comparisons of impedance on the common terminal Tc side in a filter mode in Example 1 and Comparative Example 2. FIG. 4B is a Smith chart showing comparisons of impedance on the input/output terminal T1 side in the filter mode in Example 1 and Comparative Example 2. FIG. 4A illustrates impedance on the common terminal Tc side when the filter devices according to Example 1 and Comparative Example 2 each form a filter having a passband that is the third band relatively wide (in the filter mode). FIG. 4B illustrates impedance on the input/output terminal T1 side when the filter devices according to Example 1 and Comparative Example 2 each form a filter having a passband that is the third band relatively wide (in the filter mode). Note that the "filter mode" in the present embodiment refers to a state in which switching is made to a filter having a passband that is the third band between common terminal Tc and input/output terminal T1 (input/output terminal T2 in Variation 1). Further, a "duplexer mode" refers to a state in which switching is made to a duplexer in which a filter having a relatively narrow passband that is the first band between common terminal Tc and input/output terminal T1 is connected, via common terminal Tc, to a filter having a relatively narrow passband that is the second band between common terminal Tc and input/output terminal T2.

As illustrated in FIGS. 4A and 4B, characteristics of a filter having a passband that is the wide third band are achieved using single filter 613 in filter device 600 according to Comparative Example 2, and thus the degrees of concentration of impedance on the input side and the output side of the passband are both lower than those of filter device 10A according to Example 1. Accordingly, this results in a problem that favorable impedance matching with an amplifier connected upstream or downstream of filter device 600 is not obtained. For example, when the amplifier is a low-noise amplifier, there is a problem that a noise figure (NF) increases.

In contrast to filter device 500 according to Comparative Example 1 and filter device 600 according to Comparative Example 2 described above, filter device 10A according to Example 1 and filter device 10B according to Variation 1 achieve a filter having a relatively wide passband, and a duplexer (multiplexer) having a plurality of relatively narrow passbands, using two filter elements and two switch elements. Accordingly, a low-loss small filter device can be provided.

1.3 Filter Device According to Example 2

Figure 5A:
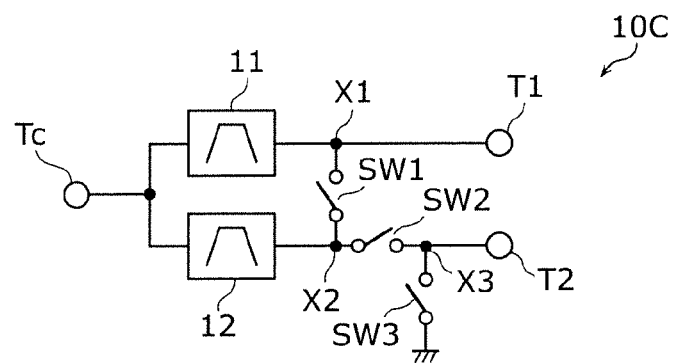
FIG. 5A is a circuit block diagram of a filter device according to Example 2.

FIG. 5A is a circuit block diagram of filter device 10C according to Example 2. Filter device 10C illustrated in FIG. 5A includes filters 11 and 12, switches SW1, SW2 and SW3, common terminal Tc, and input/output terminals T1 and T2. Filter device 10C according to this example is different from filter device 10A according to Example 1 in that switch SW3 is added in the configuration. In the following, description of common points of filter device 10C according to this example to those of filter device 10A according to Example 1 is omitted, and different points are mainly described.

Switch SW1 is a first switch element connected between node X1 and node X2. Switch SW2 is a second switch element connected between node X2 and input/output terminal T2. Switch SW3 is a third switch element connected between node X3 and the ground. Node X1 is a first node on the first path, between filter 11 and input/output terminal T1, and node X2 is a second node on the second path, between filter 12 and input/output terminal T2. Node X3 is a third node on the second path, between switch SW2 and input/output terminal T2.

Switch SW2 and switch SW3 are switched between on and off mutually exclusively from each other.

Figure 5B:
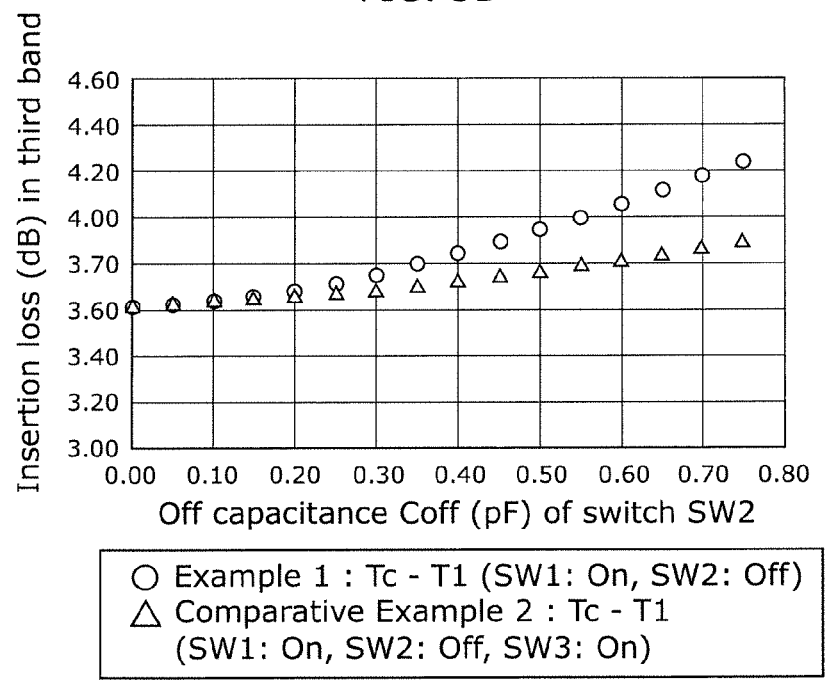
FIG. 5B illustrates graphs showing a relation between off-capacitance of a second switch and insertion loss in the filter mode in Examples 1 and 2.

FIG. 5B is a graph illustrating a relation between off-capacitance of switch SW2 and insertion loss in the filter mode in Examples 1 and 2. Note that off-capacitance represents capacitance of a switch when the switch is off. As illustrated in FIG. 5B, when filter device 10A according to Example 1 is applied as a filter having a wide passband that is the third band, although switch SW2 is off, insertion loss in the third band increases with an increase in off-capacitance of switch SW2. This is because the amount of signal leakage into input/output terminal T2 that is not in use increases with an increase in off-capacitance of switch SW2. In contrast, when filter device 10B according to Example 2 is applied as a filter having a wide passband that is the third band, insertion loss in the third band increases with an increase in off-capacitance of switch SW2, but nevertheless, the rate of increase of insertion loss in the third band is lower than that of the filter device according to Example 1. This is because when switch SW2 is off, switch SW3 is on and node X3 is shunt-connected to the ground, so that isolation between switch SW2 and input/output terminal T2 improves, and signal leakage into input/output terminal T2 that is not in use is reduced.

According to the configuration of Example 2, when SW1 is on and switch SW2 is off, passband insertion loss of the filter formed between common terminal Tc and input/output terminal T1 and having a passband that is the third band can be decreased.

Note that as illustrated in FIG. 5B, in filter device 10A according to Example 1, off-capacitance Coff of switch SW2 is to be set to 0.35 pF or less if insertion loss is to be limited to a 0.2-dB increase or less relative to the third band insertion loss (3.62 dB) when switch SW2 is an ideal switch element (off-capacitance of switch SW2=0 pF). Similarly, in filter device 10B according to Example 2, when off-capacitance Coff of switch SW2 is set to 0.35 pF or less, an increase in insertion loss relative to an ideal switch element can be limited to 0.1 dB or less.

Also in both of Examples 1 and 2, insertion loss of a filter formed between common terminal Tc and input/output terminal T1 and having a passband that is the wide third band can be decreased by setting off-capacitance Coff of switch SW2 to 0.35 pF or less.

Figure 6A:
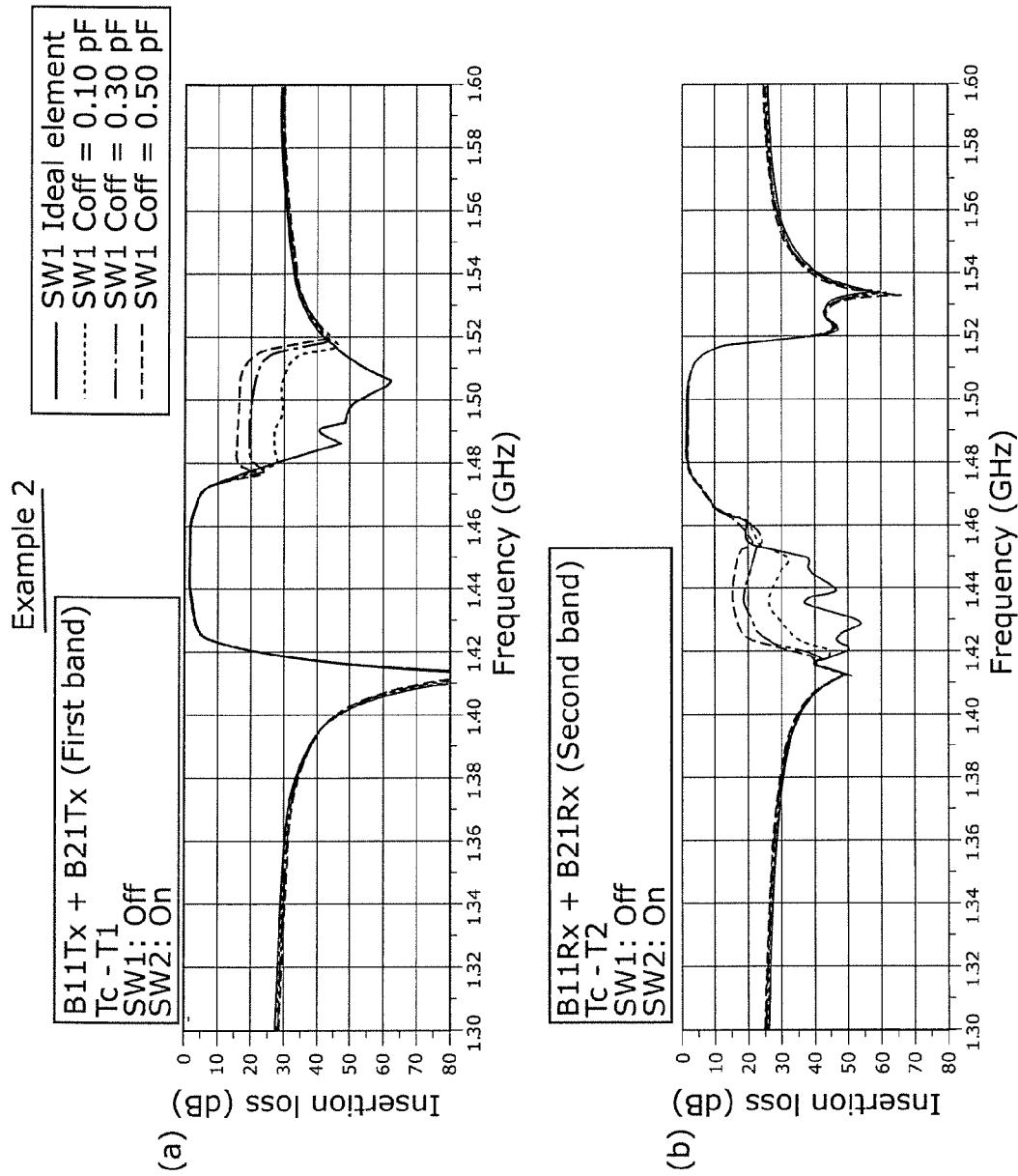
FIG. 6A illustrates graphs showing passing characteristics when off-capacitance of a first switch element of the filter device according to Example 2 is changed.

FIG. 6A illustrates graphs showing passing characteristics when off-capacitance of switch SW1 of filter device 10C according to Example 2 is changed. More specifically, (a) of FIG. 6A illustrates passing characteristics between common terminal Tc and input/output terminal T1 when off-capacitance of switch SW1 of filter device 10C according to Example 2 is changed in the state where switch SW1 is off and switch SW2 of filter device 10C is on. Further, (b) of FIG. 6A illustrates passing characteristics between common terminal Tc and input/output terminal T2 when off-capacitance of switch SW1 of filter device 10C according to Example 2 is changed in the state where switch SW1 is off and switch SW2 of filter device 10C is on.

Figure 6B:
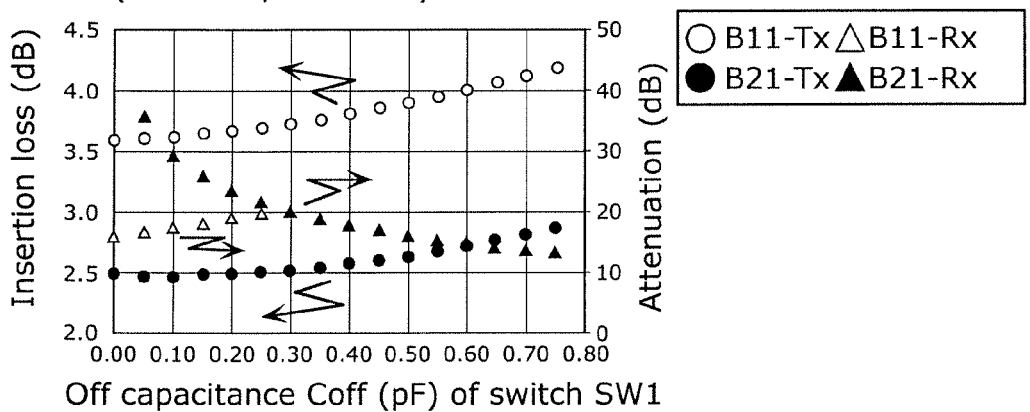
FIG. 6B illustrates graphs showing a relation between off-capacitance (i.e., "off-capacitance" meaning the capacitance exhibited by the switch when off) of the first switch element and insertion loss in a duplexer mode in Examples 1 and 2.
Figure 6B:
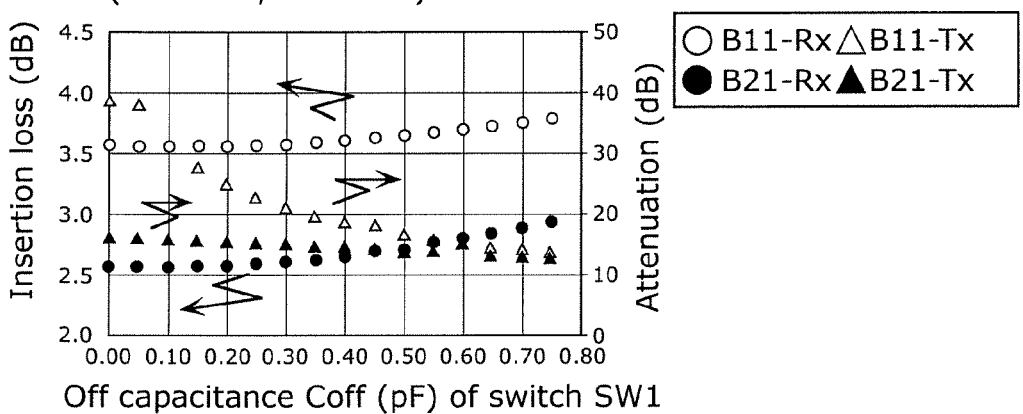

FIG. 6B illustrates graphs showing a relation between off-capacitance of switch SW1 and insertion loss in the duplexer mode in Examples 1 and 2. Part (a) of FIG. 6B illustrates insertion loss in the first band (Band11Tx and Band21Tx) between common terminal Tc and input/output terminal T1 and an attenuation in the second band (Band11Rx and Band21Rx), when switch SW1 is off and switch SW2 is on in Examples 1 and 2. Part (b) of FIG. 6B illustrates an attenuation in the first band (Band11Tx and Band21Tx) between common terminal Tc and input/output terminal T2, and insertion loss in the second band (Band11Rx and Band21Rx), when switch SW1 is off and switch SW2 is on in Examples 1 and 2.

As illustrated in (a) and (b) of FIG. 6A, the greater off-capacitance of switch SW1 is, the more attenuation characteristics near the passbands of the multiplexer deteriorate. As illustrated in (a) and (b) of FIG. 6B, the greater off-capacitance of switch SW1 is, the more attenuation characteristics near the passbands of the multiplexer deteriorate and also, the more insertion loss in the passband increases. Here, the attenuation that the multiplexer is to have is about 20 dB or more, and thus off-capacitance Coff of switch SW1 is desirably 0.1 dB or less. Accordingly, when the filter devices according to Examples 1 and 2 each form a multiplexer, attenuation characteristics of the multiplexer can be improved.

Figure 6C:
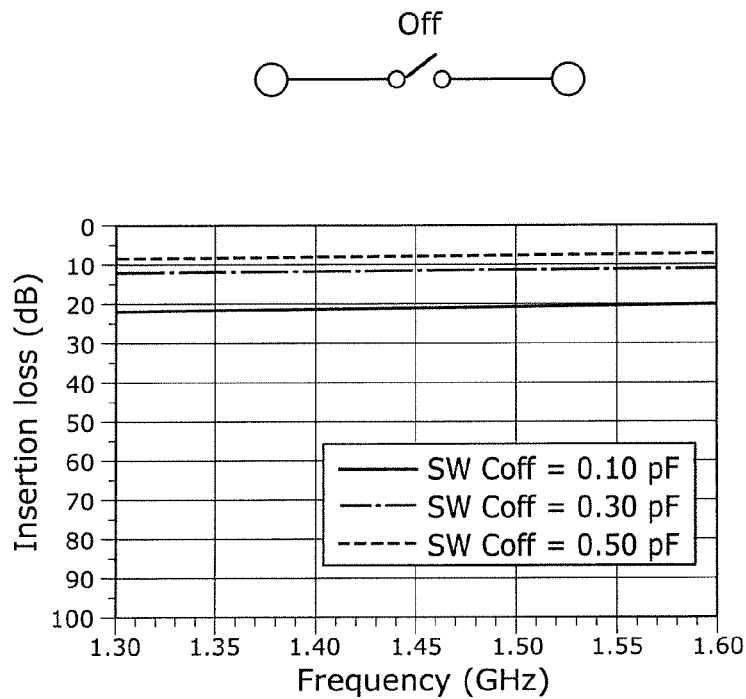
FIG. 6C illustrates a graph showing insertion loss when off-capacitance of a switch element is changed.
Figure 6D:
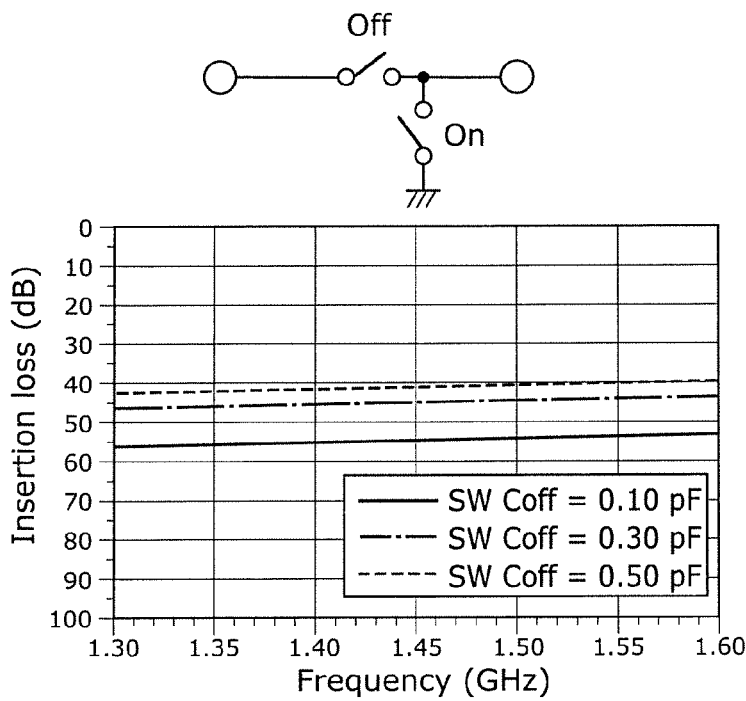
FIG. 6D illustrates a graph showing insertion loss when off-capacitance of a circuit in which a conducting shunt switch element is connected to a switch element is changed.

FIG. 6C illustrates a graph showing isolation (attenuation) provided by switch SW1 when off-capacitance of switch SW1 is changed in filter device 10C according to Example 2. FIG. 6D illustrates a graph showing isolation (attenuation) provided by a switch circuit that includes switches SW2 and SW3 in filter device 10C according to Example 2 when off-capacitance of switch SW2 is changed.

As illustrated in FIG. 6A, switch SW1 is off when the filter device forms a multiplexer in each of the filter devices according to Example 2. Accordingly, if off-capacitance Coff of switch SW1 is great, characteristics of filters 11 and 12 influence each other, and attenuation characteristics deteriorate at frequencies in the passbands of the filters.

On the other hand, switch SW2 is off when a filter having a wide passband that is the third band is formed, and a device that passes signals is not present on the input/output terminal T2 side of filter 12. Thus, even if off-capacitance Coff of switch SW2 increases, the attenuation is not affected thereby. Note that signal leakage occurs in the passband, and thus insertion loss in the passband increases. Further, isolation provided by switch SW2 can be improved by switch SW3.

As described above, switch SW1 is to be designed to have lower off-capacitance Coff than off-capacitance Coff of switch SW2.

The balance of characteristics of the filter device can be optimized by making off-capacitance of switch SW1 lower than off-capacitance of switch SW2, while improving attenuation characteristics of the multiplexer.

1.4 Filter Device According to Example 3

Figure 7A:
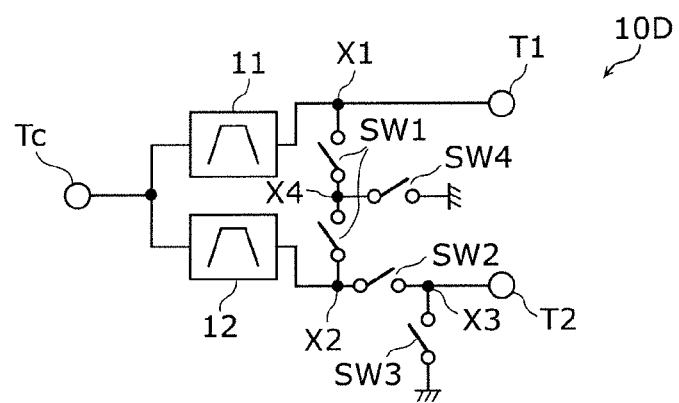
FIG. 7A is a circuit block diagram of a filter device according to Example 3.

FIG. 7A is a circuit block diagram of filter device 10D according to Example 3. Filter device 10D illustrated in FIG. 7A includes filters 11 and 12, switches SW1, SW2, SW3 and SW4, common terminal Tc, and input/output terminals T1 and T2. Filter device 10D according to this example is different from filter device 10C according to Example 2 in that switch SW1 is serially divided and switch SW4 is added in the configuration. In the following, description of common points of filter device 10D according to this example to those of filter device 10C according to Example 2 is omitted, and different points are mainly described.

Switch SW1 is a first switch element connected between node X1 and node X2. Switch SW1 includes a plurality of unit switches connected in series to one another. Switch SW4 is a fourth switch element connected between the ground and node X4 (fourth node) that is one of connection nodes of the unit switches connected in series to one another, and switch SW4 and switch SW1 are switched between on and off mutually exclusively from each other. Note that "switch SW1 includes a plurality of unit switches connected in series to each other" means that when, for example, n denotes a stack count indicating the number of stacked unit switches of switch SW1 (n is an integer of 2 or more), switch SW1 is divided into a switch circuit having k stack count(s) (k is a natural number of n−1 or less), and a switch circuit having (n−k) stack count(s). Accordingly, the size of switch SW1 is not increased by serially dividing switch SW1 into two switch circuits. Note that a unit switch is a field effect transistor (FET), for example.

Switches SW1 and SW4 are switched between on and off mutually exclusively from each other.

Figure 7B:
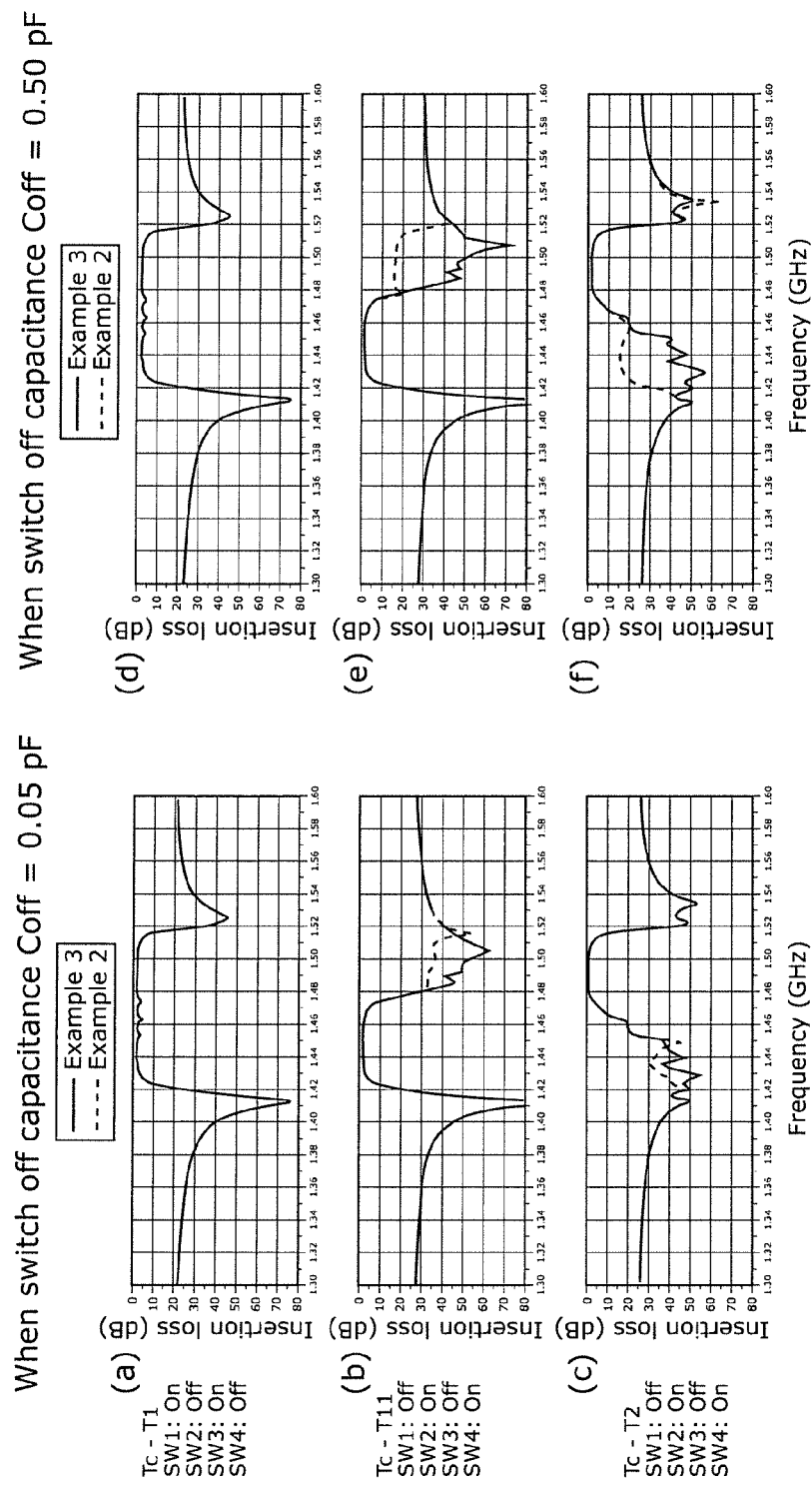
FIG. 7B illustrates graphs showing comparisons of passing characteristics of the filter devices according to Examples 2 and 3.

FIG. 7B illustrates graphs showing comparisons of passing characteristics of the filter devices according to Examples 2 and 3. Parts (a) to (c) of FIG. 7B illustrate graphs showing comparisons of passing characteristics of Examples 2 and 3 when off-capacitance of switch SW1 is 0.05 pF. Parts (d) to (f) of FIG. 7B illustrate graphs showing comparisons of passing characteristics in the filter mode in Examples 2 and 3 when off-capacitance of switch SW1 is 0.50 pF.

Figure 7C:
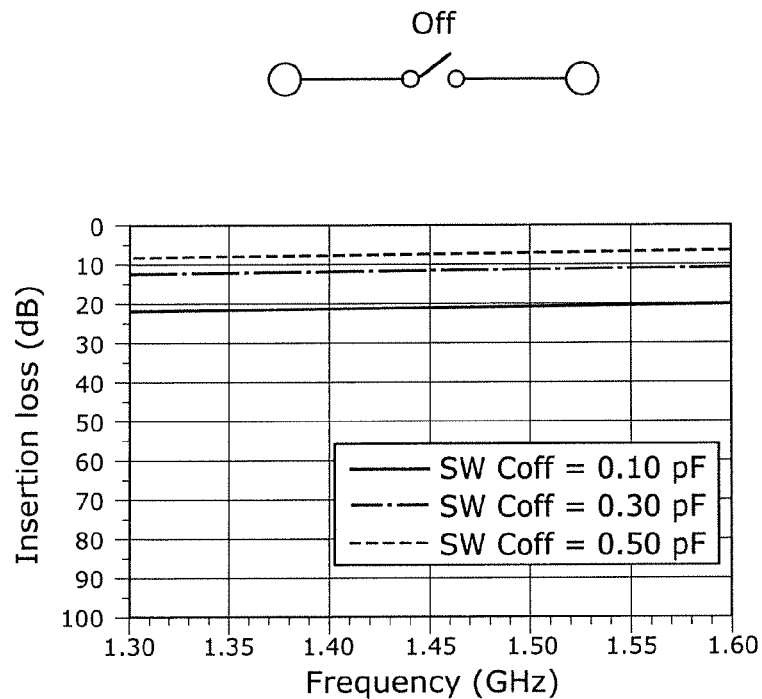
FIG. 7C illustrates a graph showing insertion loss when off-capacitance of a non-conducting switch element is changed.
Figure 7D:
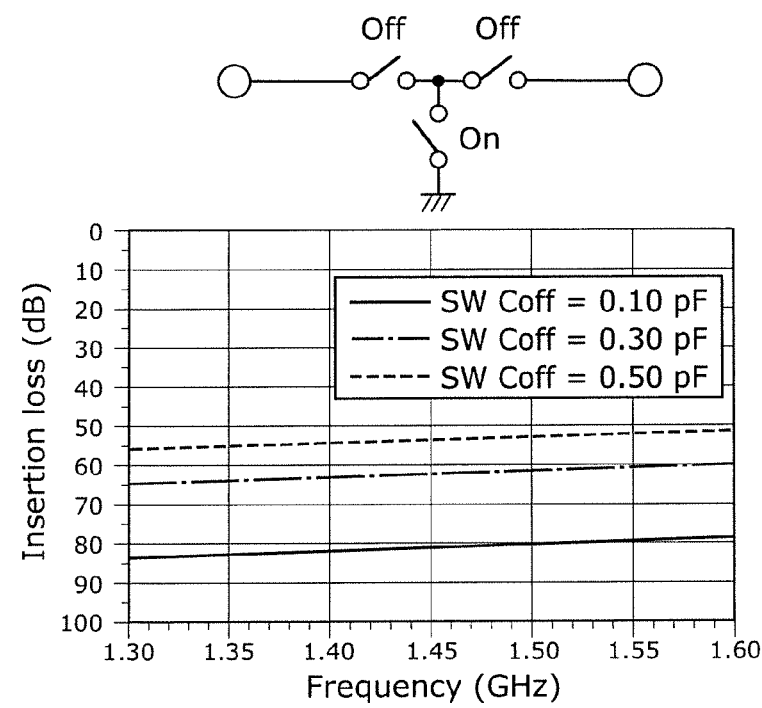
FIG. 7D illustrates a graph showing insertion loss when off-capacitance of a circuit in which a conducting shunt switch element is connected to a connection node of two non-conducting switch elements connected in series.

FIG. 7C illustrates a graph showing isolation (attenuation) provided by switch SW1 when off-capacitance of switch SW1 in filter device 10C according to Example 2 is changed. FIG. 7D illustrates a graph showing isolation (attenuation) provided by a switch circuit that includes serially divided switch SW1 and switch SW4 in filter device 10D according to Example 3 when off-capacitance of switch SW1 is changed in the switch circuit.

In filter device 10C according to Example 2, switch SW1 is off when a multiplexer is formed as illustrated in FIG. 7C. Accordingly, when off-capacitance Coff of switch SW1 is great, the amount of signal leakage caused by switch SW1 in the off state increases (insertion loss is decreased in FIG. 7C). In contrast, in filter device 10D according to Example 3, the amount of signal leakage caused by switch SW1 in the off state is decreased by disposing switch SW4 even if off-capacitance Coff of switch SW1 is great, as illustrated in FIG. 7D (greater isolation is provided in FIG. 7D).

Accordingly, in filter device 10D according to Example 3, isolation between filter 11 and filter 12 when switch SW1 is off improves, and attenuation characteristics of the multiplexer improve, as compared with filter device 10C according to Example 2. As can be seen from the comparison between FIGS. 7C and 7D, filter device 10D that additionally includes switch SW4 can ensure a sufficient attenuation even if switch SW1 has great off-capacitance, and thus a small switch element (switch element having a low stack count) having great off-capacitance can be used.

1.5 Impedance Characteristic of Filter Device According to Example 3

Figure 8:
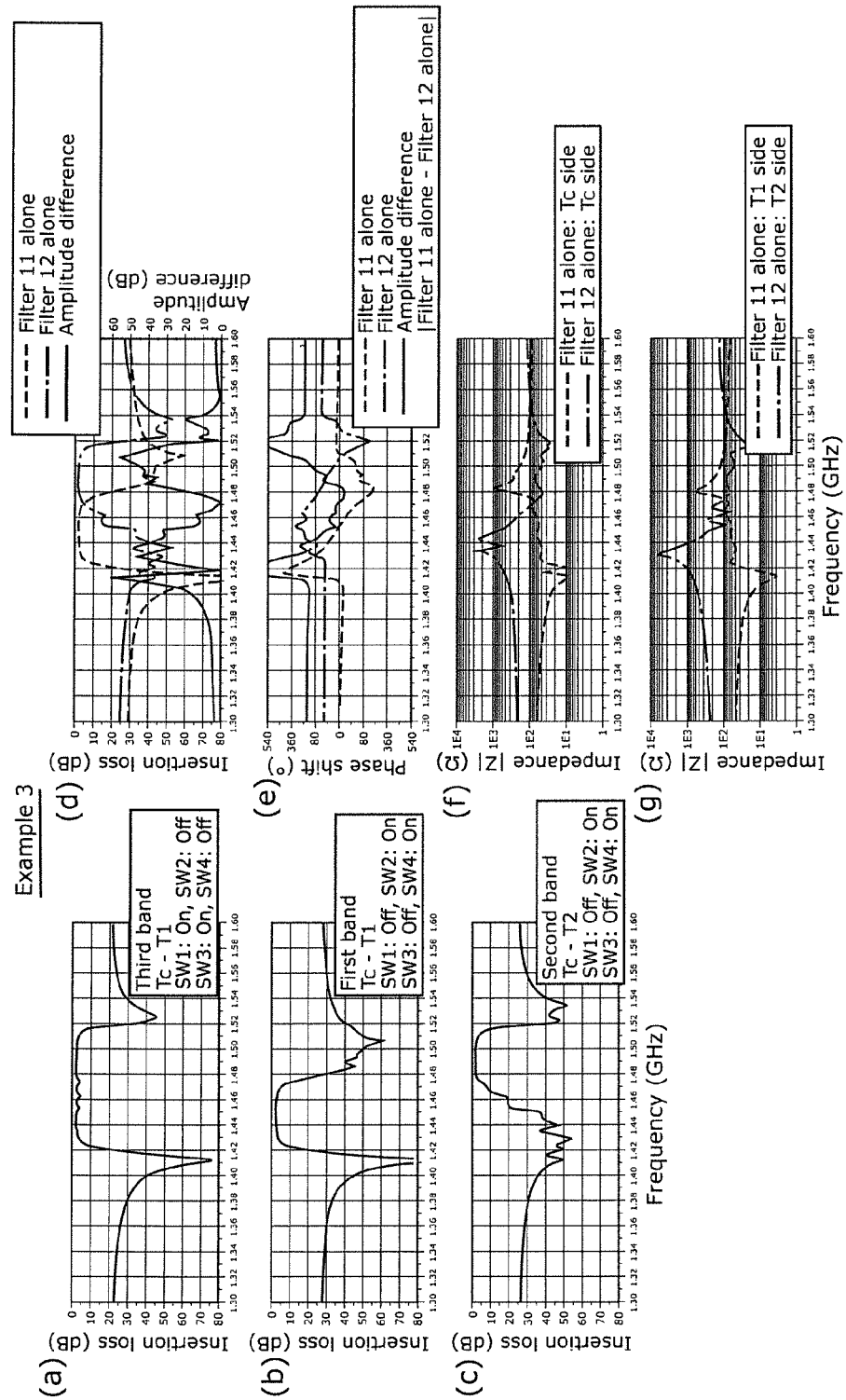
FIG. 8 illustrates graphs showing passing characteristics, amplitude characteristics, phase shift characteristics, and impedance characteristics of the filter device according to Example 3.

FIG. 8 illustrates graphs showing passing characteristics, amplitude characteristics, phase shift characteristics, and impedance characteristics of filter device 10D according to Example 3. Part (a) of FIG. 8 illustrates passing characteristics of filter device 10D in the filter mode. Parts (b) and (c) of FIG. 8 illustrate passing characteristics of filter device 10D in the multiplexer mode. Part (d) of FIG. 8 illustrates amplitude characteristics of filter 11 alone and filter 12 alone and an amplitude difference therebetween. Part (e) of FIG. 8 illustrates phase shift characteristics of filter 11 alone and filter 12 alone and a difference between phase shifts caused thereby. Part (f) of FIG. 8 illustrates impedance characteristics when filter 11 alone and filter 12 alone are viewed from common terminal Tc. Part (g) of FIG. 8 illustrates impedance characteristics when filter 11 alone is viewed from input/output terminal T1, and impedance characteristics when filter 12 alone is viewed from input/output terminal T2.

Note that in the present embodiment, "impedance" indicates impedance when a signal returns, and a "phase shift" represents the amount of phase shift when a signal passes through.

In filter device 10D according to Example 3, adjusting a frequency at which impedance of filter 12 alone is highest decreases a ripple (a deviation of insertion loss in a passband) in a filter having a wide passband that is the third band.

Table 1 shows in the filter mode of filter device 10D according to Example 3, insertion loss and a ripple in the third band, a frequency at which an amplitude difference between filters 11 and 12 is 0 dB, a difference between phase shifts caused by filters 11 and 12, frequency fz21 at which the impedance on the common terminal Tc side of filter 12 is highest, and frequency fz21 at which impedance on the input/output terminal T2 side of filter 12 is highest, when impedance of filter 12 on the common terminal Tc side is fixed and impedance of filter 12 on the input/output terminal T2 side is changed. Note that a phase shift caused by the first phase shifter and a phase shift caused by the second phase shifter illustrated in Table 1 show a phase shift caused by the first phase shifter that filter 12 includes on the common terminal Tc side and a phase shift caused by the second phase shifter that filter 12 includes on the input/output terminal T2 side, respectively. Filter 12 includes the first phase shifter, the second phase shifter, and a filter circuit connected between the first phase shifter and the second phase shifter. Filter 12 includes phase shifters at the ends thereof, and thus can change a frequency at which impedance of filter 12 alone is highest, and a difference between phase shifts caused by filter 11 alone and filter 12 alone.

TABLE 1

| Phase shift caused by 1st phase shifter (°) | Phase shift caused by 2nd phase shifter (°) | Freq fx at which amp diff is 0 dB (MHz) | Phase shift diff (Filters 11, 12) (°) | fz21 for filter 12 on Tc side (MHz) | fz22 for filter 12 on T2 side (MHz) | IL @ third band (dB) | Ripple @ third band (dB) |
|---|---|---|---|---|---|---|---|
| 85.0 | 0.0 | 1471.0 | 44.7 | 1442.0 | 1533.0 | 6.51 | 4.60 |
| 85.0 | 10.0 | 1471.0 | 34.7 | 1442.0 | 1558.0 | 5.60 | 3.72 |
| 85.0 | 20.0 | 1471.0 | 24.7 | 1442.0 | 1140.0 | 4.86 | 3.01 |
| 85.0 | 30.0 | 1471.0 | 14.7 | 1442.0 | 1390.0 | 4.32 | 2.51 |
| 85.0 | 40.0 | 1471.0 | 4.7 | 1442.0 | 1435.0 | 4.19 | 2.45 |

TABLE 1-continued

| Phase shift caused by 1st phase shifter (°) | Phase shift caused by 2nd phase shifter (°) | Freq fx at which amp diff is 0 dB (MHz) | Phase shift diff (Filters 11, 12) (°) | fz21 for filter 12 on Tc side (MHz) | fz22 for filter 12 on T2 side (MHz) | IL @ third band (dB) | Ripple @ third band (dB) |
|---|---|---|---|---|---|---|---|
| 85.0 | 50.0 | 1471.0 | −5.3 | 1442.0 | 1447.0 | 4.34 | 2.66 |
| 85.0 | 60.0 | 1471.0 | −15.3 | 1442.0 | 1450.0 | 4.73 | 3.11 |
| 85.0 | 70.0 | 1471.0 | −25.3 | 1442.0 | 1451.0 | 5.32 | 3.74 |
| 85.0 | 80.0 | 1471.0 | −35.3 | 1442.0 | 1461.0 | 5.70 | 4.15 |
| 85.0 | 90.0 | 1471.0 | −45.3 | 1442.0 | 1461.0 | 6.17 | 4.61 |
| 85.0 | 100.0 | 1471.0 | −55.3 | 1442.0 | 1462.0 | 6.75 | 5.16 |
| 85.0 | 130.0 | 1471.0 | −85.3 | 1442.0 | 1517.0 | 27.08 | 25.33 |
| 85.0 | 160.0 | 1471.0 | −115.3 | 1442.0 | 1520.0 | 16.14 | 14.25 |
| 85.0 | 190.0 | 1471.0 | −145.3 | 1442.0 | 1558.0 | 24.15 | 22.24 |
| 85.0 | 200.0 | 1471.0 | −155.3 | 1442.0 | 1140.0 | 17.59 | 15.73 |
| 85.0 | 220.0 | 1471.0 | −175.3 | 1442.0 | 1435.0 | 12.39 | 10.70 |
| 85.0 | 230.0 | 1471.0 | 174.7 | 1442.0 | 1447.0 | 11.11 | 9.48 |
| 85.0 | 250.0 | 1471.0 | 154.7 | 1442.0 | 1451.0 | 9.95 | 8.36 |
| 85.0 | 280.0 | 1471.0 | 124.7 | 1442.0 | 1462.0 | 17.44 | 15.83 |
| 85.0 | 290.0 | 1471.0 | 114.7 | 1442.0 | 1514.0 | 18.68 | 17.00 |
| 85.0 | 320.0 | 1471.0 | 84.7 | 1442.0 | 1518.0 | 22.48 | 20.61 |
| 85.0 | 340.0 | 1471.0 | 64.7 | 1442.0 | 1520.0 | 11.29 | 9.38 |

Figure 9A:
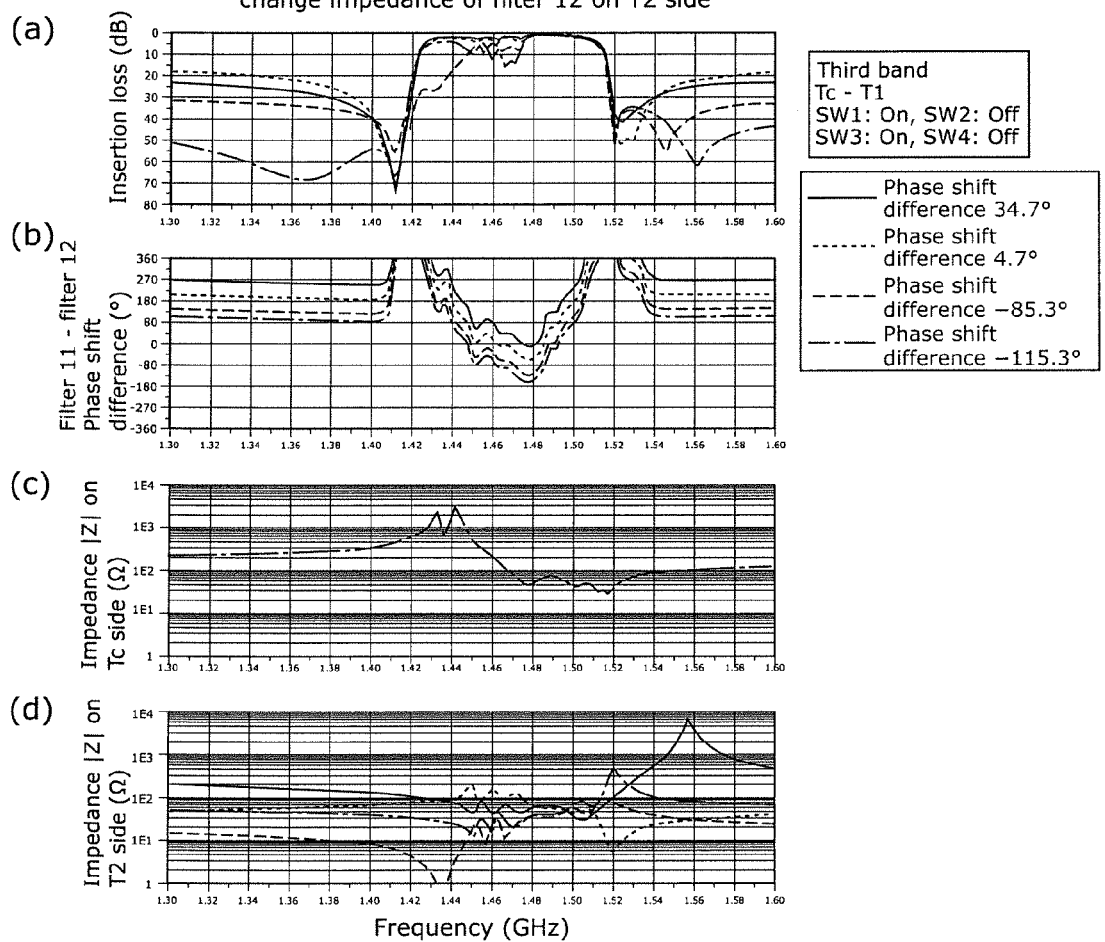
FIG. 9A illustrates graphs showing passing characteristics, phase shift difference characteristics, and impedance characteristics, when a phase shift on the input/output terminal side in the filter mode in Example 3 is changed.

FIG. 9A illustrates graphs showing passing characteristics, phase shift difference characteristics, and impedance characteristics when impedance of filter 12 on the common terminal Tc side is fixed and impedance of filter 12 on the input/output terminal T2 side is changed in filter device 10D according to Example 3 in the filter mode.

Figure 9B:
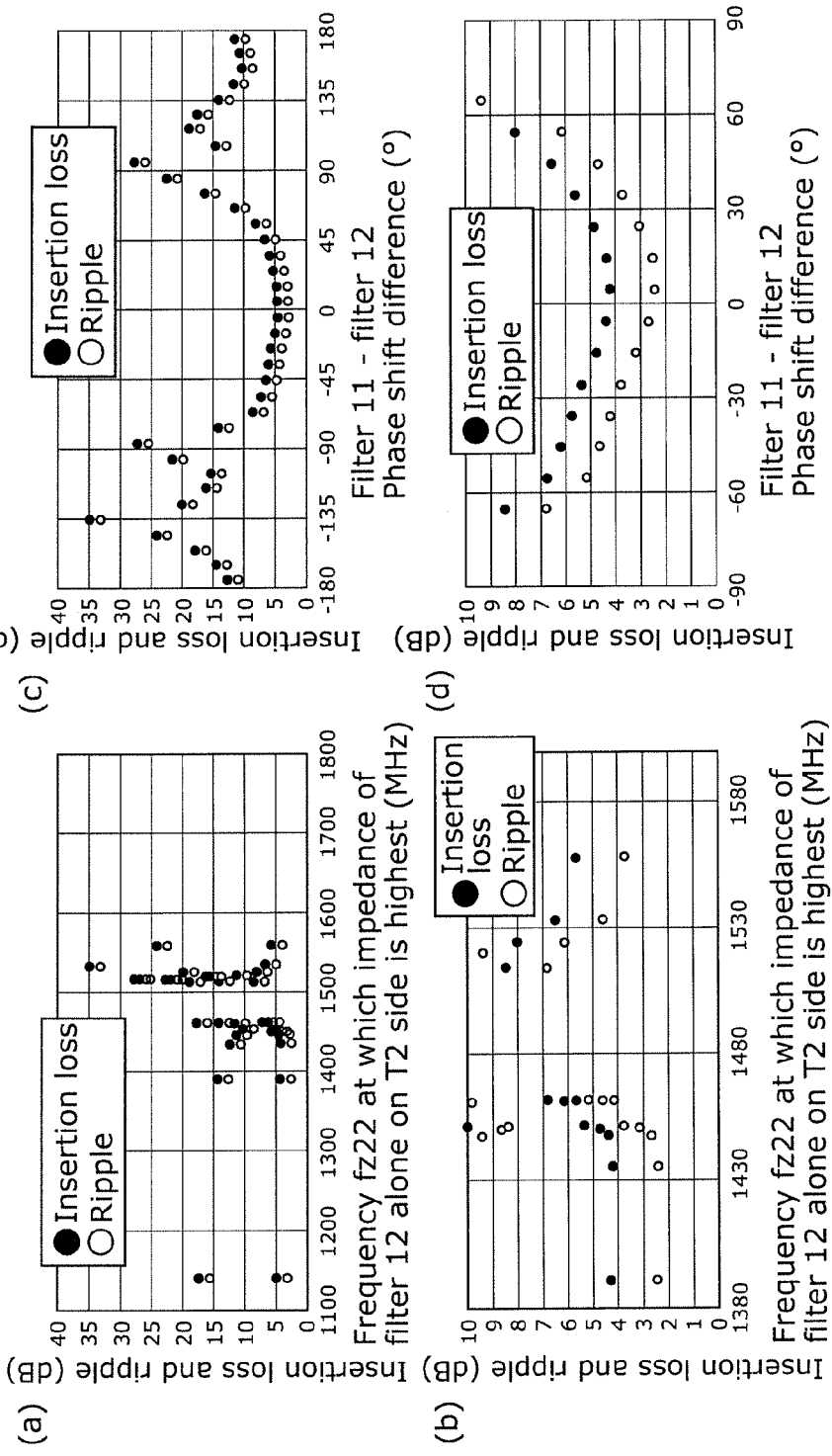
FIG. 9B illustrates graphs showing relations between (i) insertion loss and a ripple and (ii) a frequency at which the second filter has highest impedance and a difference between phase shifts caused by filters, when a phase shift on the input/output terminal side in the filter mode in Example 3 is changed.

FIG. 9B illustrates graphs showing insertion loss and a ripple in the third band when a phase of a signal that enters filter 12 through input/output terminal T2 is changed in filter device 10D according to Example 3 in the filter mode. Part (a) of FIG. 9B is a graph showing a relation between a frequency at which impedance of filter 12 is highest, and insertion loss and a ripple in the third band, and (b) of FIG. 9B is an enlarged portion of the graph in (a) of FIG. 9B. Part (c) of FIG. 9B is a graph showing a relation between a difference between phase shifts caused by filters 11 and 12 and insertion loss and a ripple in the third band, and (d) of FIG. 9B is an enlarged portion of the graph in (c) of FIG. 9B.

Table 1, FIG. 9A, and (a) and (b) of FIG. 9B show that a great ripple of more than 20 dB in the wide passband of the filter which is the third band can be decreased to 20 dB or lower when frequency fz21 at which impedance of filter 12 on the common terminal Tc side is highest and frequency fz22 at which impedance of filter 12 on the input/output terminal T2 side is highest are each at most a frequency at a lower edge of the second band.

Table 1, FIG. 9A, and (c) and (d) of FIG. 9B show that a great ripple of more than 10 dB in the wide passband of the filter which is the third band can be decreased to 10 dB or lower when a difference between phase shifts caused by filters 11 and 12 is at least −50° and at most +50°.

Further, Table 1, FIG. 9A, and (a) and (b) of FIG. 9B show that a great ripple of more than 5 dB in the wide passband of the filter which is the third band can be decreased to 5 dB or lower when frequency fz21 at which impedance of filter 12 alone on the common terminal Tc side is highest and frequency fz22 at which impedance of filter 12 alone on the input/output terminal T2 side is highest are each at most a frequency at a higher edge of the first band.

Table 2 shows that in filter device 10D according to Example 3 in the filter mode, insertion loss and a ripple in the third band, a frequency at which an amplitude difference between filters 11 and 12 is 0 dB, a difference between phase shifts caused by filters 11 and 12, frequency fz21 at which impedance of filter 12 on the common terminal Tc side is highest, and frequency fz21 at which impedance of filter 12 on the input/output terminal T2 side is highest, when impedance of filter 12 on the input/output terminal T2 side is fixed and impedance of filter 12 on the common terminal Tc side are changed. Note that a phase shift caused by the first phase shifter and a phase shift caused by the second phase shifter shown in Table 2 show a phase shift caused by the first phase shifter that filter 12 includes on the common terminal Tc side, and a phase shift caused by the second phase shifter that filter 12 includes on the input/output terminal T2 side, respectively. Filter 12 includes the first phase shifter, the second phase shifter, and a filter circuit connected between the first phase shifter and the second phase shifter. Filter 12 includes phase shifters at the ends thereof, and thus can change a frequency at which impedance of filter 12 alone is highest, and a difference between phase shifts caused by filter 11 alone and filter 12 alone.

TABLE 2

| Phase shift caused by 1st phase shifter (°) | Phase shift caused by 2nd phase shifter (°) | Freq fx at which amp diff is 0 dB (MHz) | Phase shift diff (Filters 11, 12) (°) | fz21 for filter 12 on Tc side (MHz) | fz22 for filter 12 on T2 side (MHz) | IL @ third band (dB) | Ripple @ third band (dB) |
|---|---|---|---|---|---|---|---|
| 5.0 | 40.0 | 1471.0 | 84.7 | 1518.0 | 1435.0 | 23.12 | 21.21 |
| 25.0 | 40.0 | 1471.0 | 64.7 | 1519.0 | 1435.0 | 9.19 | 7.31 |
| 45.0 | 40.0 | 1471.0 | 44.7 | 1527.0 | 1435.0 | 5.88 | 4.04 |
| 55.0 | 40.0 | 1471.0 | 34.7 | 1543.0 | 1435.0 | 5.07 | 3.24 |

TABLE 2-continued

| Phase shift caused by 1st phase shifter (°) | Phase shift caused by 2nd phase shifter (°) | Freq fx at which amp diff is 0 dB (MHz) | Phase shift diff (Filters 11, 12) (°) | fz21 for filter 12 on Tc side (MHz) | fz22 for filter 12 on T2 side (MHz) | IL @ third band (dB) | Ripple @ third band (dB) |
|---|---|---|---|---|---|---|---|
| 65.0 | 40.0 | 1471.0 | 24.7 | 1611.0 | 1435.0 | 4.58 | 2.78 |
| 75.0 | 40.0 | 1471.0 | 14.7 | 1372.0 | 1435.0 | 4.31 | 2.54 |
| 85.0 | 40.0 | 1471.0 | 4.7 | 1442.0 | 1435.0 | 4.19 | 2.45 |
| 95.0 | 40.0 | 1471.0 | −5.3 | 1457.0 | 1435.0 | 4.31 | 2.59 |
| 105.0 | 40.0 | 1471.0 | −15.3 | 1462.0 | 1435.0 | 4.90 | 3.23 |
| 115.0 | 40.0 | 1471.0 | −25.3 | 1467.0 | 1435.0 | 5.51 | 3.85 |
| 125.0 | 40.0 | 1471.0 | −35.3 | 1470.0 | 1435.0 | 6.10 | 4.44 |
| 135.0 | 40.0 | 1471.0 | −45.3 | 1472.0 | 1435.0 | 6.68 | 4.97 |
| 145.0 | 40.0 | 1471.0 | −55.3 | 1473.0 | 1435.0 | 7.25 | 5.47 |
| 155.0 | 40.0 | 1471.0 | −65.3 | 1475.0 | 1435.0 | 8.65 | 6.85 |
| 165.0 | 40.0 | 1471.0 | −75.3 | 1476.0 | 1435.0 | 15.05 | 13.23 |
| 175.0 | 40.0 | 1471.0 | −85.3 | 1518.0 | 1435.0 | 33.47 | 31.64 |
| 215.0 | 40.0 | 1471.0 | −125.3 | 1521.0 | 1435.0 | 31.42 | 29.55 |
| 245.0 | 40.0 | 1471.0 | −155.3 | 1611.0 | 1435.0 | 21.37 | 19.56 |
| 255.0 | 40.0 | 1471.0 | −165.3 | 1372.0 | 1435.0 | 15.42 | 13.66 |
| 295.0 | 40.0 | 1471.0 | 154.7 | 1467.0 | 1435.0 | 8.72 | 7.08 |
| 345.0 | 40.0 | 1471.0 | 104.7 | 1476.0 | 1435.0 | 20.75 | 18.85 |
| 355.0 | 40.0 | 1471.0 | 94.7 | 1518.0 | 1435.0 | 30.29 | 28.39 |

Figure 10A:
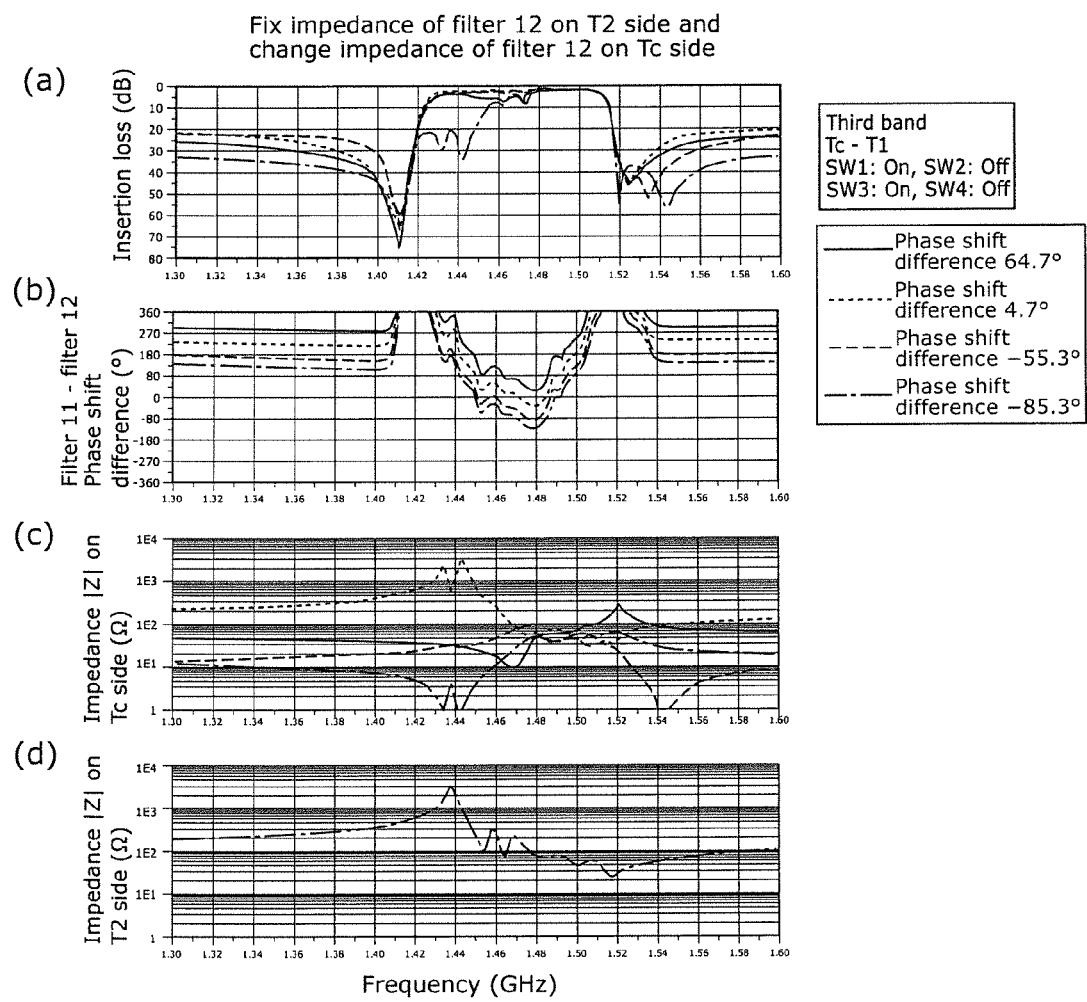
FIG. 10A illustrates graphs showing passing characteristics, phase shift difference characteristics, and impedance characteristics when a phase shift on the common terminals side in the filter mode in Example 3 is changed.

FIG. 10A illustrates graphs showing passing characteristics, phase shift difference characteristics, and impedance characteristics when impedance of filter 12 on the input/output terminal T2 side is fixed and impedance of filter 12 on the common terminal Tc side is changed in filter device 10D according to Example 3 in the filter mode.

Figure 10B:
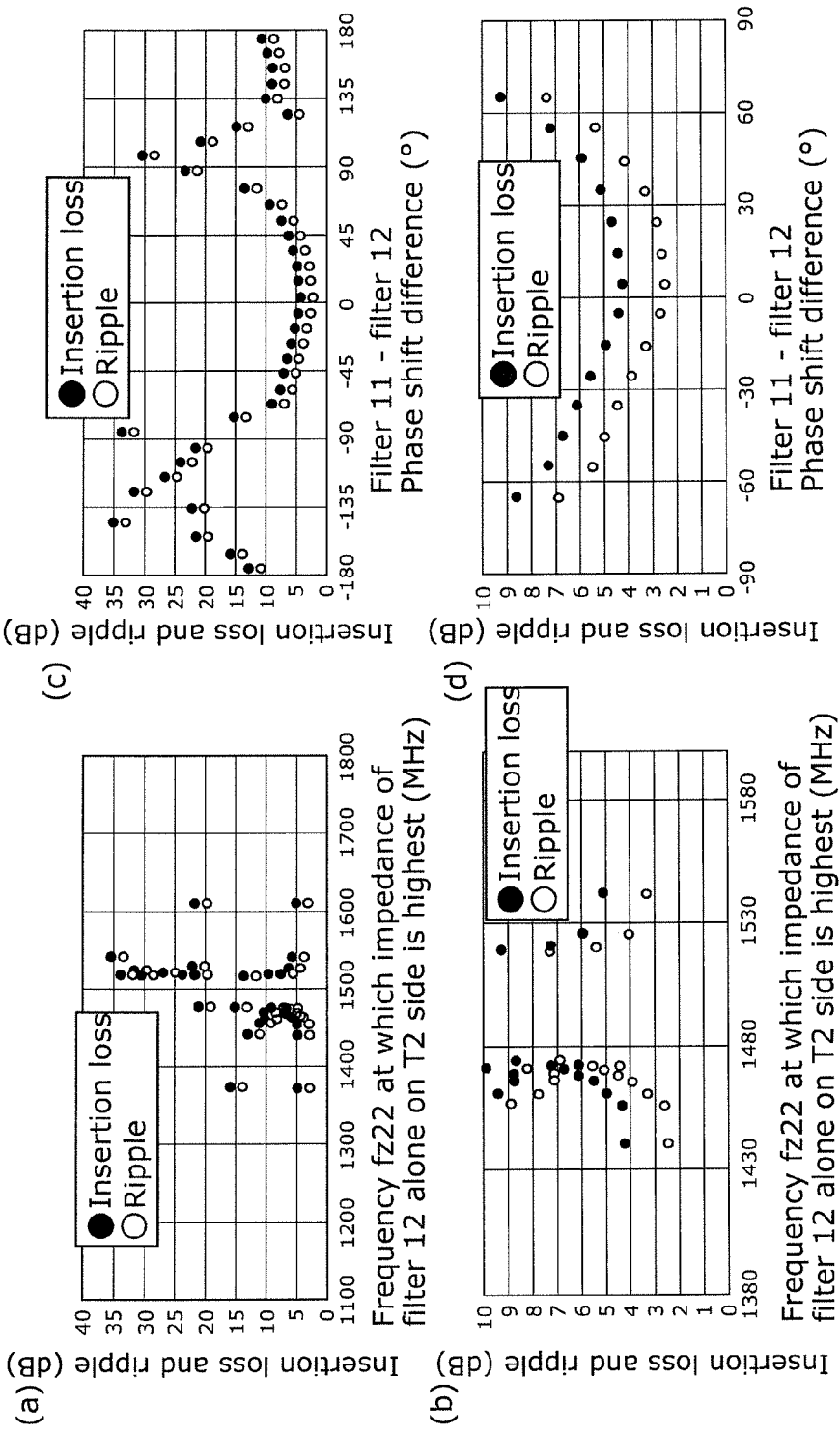
FIG. 10B illustrates graphs showing relations between (i) insertion loss and a ripple and (ii) a frequency at which the second filter has highest impedance and a difference between phase shifts caused by filters, when a phase shift on the common terminal side in the filter mode in Example 3 is changed.

FIG. 10B illustrates graphs showing insertion loss and a ripple in the third band when a phase of a signal that enters filter 12 through common terminal Tc is changed in filter device 10D according to Example 3 in the filter mode. Part (a) of FIG. 10B is a graph showing a relation between a frequency at which impedance of filter 12 is highest and insertion loss and a ripple in the third band, and (b) of FIG. 10B is an enlarged portion of the graph in (a) of FIG. 10B. Part (c) of FIG. 10B is a graph showing a relation between a difference between phase shifts caused by filters 11 and 12, and insertion loss and a ripple in the third band, and (d) of FIG. 10B is an enlarged portion of the graph in (c) of FIG. 10B.

Table 2, FIG. 10A, and (a) and (b) of FIG. 10B show that a great ripple of more than 20 dB in the wide passband of the filter which is the third band can be decreased to 20 dB or lower when frequency fz21 at which impedance of filter 12 on the common terminal Tc side is highest and frequency fz22 at which impedance of filter 12 on the input/output terminal T2 side is highest are each at most a frequency at a lower edge of the second band.

Table 2, FIG. 10A, and (c) and (d) of FIG. 10B show that a great ripple of more than 10 dB in the wide passband of the filter which is the third band can be decreased to 10 dB or lower when a difference between phase shifts caused by filters 11 and 12 is at least −50° and at most +50°.

Furthermore, Table 2, FIG. 10A, and (a) and (b) of FIG. 10B show that a great ripple of more than 5 dB in the wide passband of the filter which is the third band can be decreased to 5 dB or lower when frequency fz21 at which impedance of filter 12 alone on the common terminal Tc side is highest and frequency fz22 at which impedance of filter 12 alone on the input/output terminal T2 side is highest are each at most a frequency at a higher edge of the first band.

Table 3 shows that in filter device 10D according to Example 3 in the filter mode, insertion loss and a ripple in the third band, a frequency at which an amplitude difference between filters 11 and 12 is 0 dB, a difference between phase shifts caused by filters 11 and 12, frequency fz21 at which impedance of filter 12 on the common terminal Tc side is highest, and frequency fz21 at which impedance of filter 12 on the input/output terminal T2 side is highest, when impedance of filter 12 on the common terminal Tc side and impedance of filter 12 on the input/output terminal T2 side are changed. Note that a phase shift caused by the first phase shifter and a phase shift caused by the second phase shifter shown in Table 3 show a phase shift caused by the first phase shifter that filter 12 includes on the common terminal Tc side, and a phase shift caused by the second phase shifter that filter 12 includes on the input/output terminal T2 side, respectively. Filter 12 includes the first phase shifter, the second phase shifter, and a filter circuit connected between the first phase shifter and the second phase shifter. Filter 12 includes phase shifters at the ends thereof, and thus can change a frequency at which impedance of filter 12 alone is highest, and a difference between phase shifts caused by filter 11 alone and filter 12 alone.

TABLE 3

| Phase shift caused by 1st phase shifter (°) | Phase shift caused by 2nd phase shifter (°) | Freq fx at which amp diff is 0 dB (MHz) | Phase shift diff (Filters 11, 12) (°) | fz21 for filter 12 on Tc side (MHz) | fz22 for filter 12 on T2 side (MHz) | IL @ third band (dB) | Ripple @ third band (dB) |
|---|---|---|---|---|---|---|---|
| 5.0 | 320.0 | 1471.0 | 164.7 | 1518.0 | 1518.0 | 35.61 | 33.83 |
| 25.0 | 340.0 | 1471.0 | 124.7 | 1519.0 | 1520.0 | 15.36 | 13.43 |

TABLE 3-continued

| Phase shift caused by 1st phase shifter (°) | Phase shift caused by 2nd phase shifter (°) | Freq fx at which amp diff is 0 dB (MHz) | Phase shift diff (Filters 11, 12) (°) | fz21 for filter 12 on Tc side (MHz) | fz22 for filter 12 on T2 side (MHz) | IL @ third band (dB) | Ripple @ third band (dB) |
|---|---|---|---|---|---|---|---|
| 55.0 | 10.0 | 1471.0 | 64.7 | 1543.0 | 1558.0 | 5.94 | 3.98 |
| 65.0 | 20.0 | 1471.0 | 44.7 | 1611.0 | 1140.0 | 4.96 | 3.06 |
| 75.0 | 30.0 | 1471.0 | 24.7 | 1372.0 | 1390.0 | 3.76 | 1.93 |
| 85.0 | 40.0 | 1471.0 | 4.7 | 1442.0 | 1435.0 | 4.19 | 2.45 |
| 95.0 | 50.0 | 1471.0 | −15.3 | 1457.0 | 1447.0 | 4.85 | 3.19 |
| 105.0 | 60.0 | 1471.0 | −35.3 | 1462.0 | 1450.0 | 6.04 | 4.45 |
| 115.0 | 70.0 | 1471.0 | −55.3 | 1467.0 | 1451.0 | 7.24 | 5.70 |
| 125.0 | 80.0 | 1471.0 | −75.3 | 1470.0 | 1461.0 | 8.43 | 6.91 |
| 135.0 | 90.0 | 1471.0 | −95.3 | 1472.0 | 1461.0 | 9.56 | 8.04 |
| 145.0 | 100.0 | 1471.0 | −115.3 | 1473.0 | 1462.0 | 10.46 | 8.93 |
| 155.0 | 110.0 | 1471.0 | −135.3 | 1477.0 | 1514.0 | 13.31 | 11.74 |
| 175.0 | 130.0 | 1471.0 | −175.3 | 1518.0 | 1517.0 | 58.11 | 56.39 |
| 205.0 | 160.0 | 1471.0 | −235.3 | 1519.0 | 1520.0 | 15.36 | 13.43 |
| 235.0 | 190.0 | 1471.0 | −295.3 | 1543.0 | 1558.0 | 5.94 | 3.98 |
| 245.0 | 200.0 | 1471.0 | −315.3 | 1611.0 | 1140.0 | 4.96 | 3.06 |
| 265.0 | 220.0 | 1471.0 | −355.3 | 1442.0 | 1435.0 | 4.19 | 2.45 |
| 295.0 | 250.0 | 1471.0 | −415.3 | 1467.0 | 1451.0 | 7.24 | 5.70 |
| 325.0 | 280.0 | 1471.0 | −475.3 | 1473.0 | 1462.0 | 10.46 | 8.93 |
| 335.0 | 290.0 | 1471.0 | −495.3 | 1477.0 | 1514.0 | 13.31 | 11.74 |
| 355.0 | 300.0 | 1471.0 | −535.3 | 1518.0 | 1517.0 | 58.11 | 56.39 |

Figure 11A:
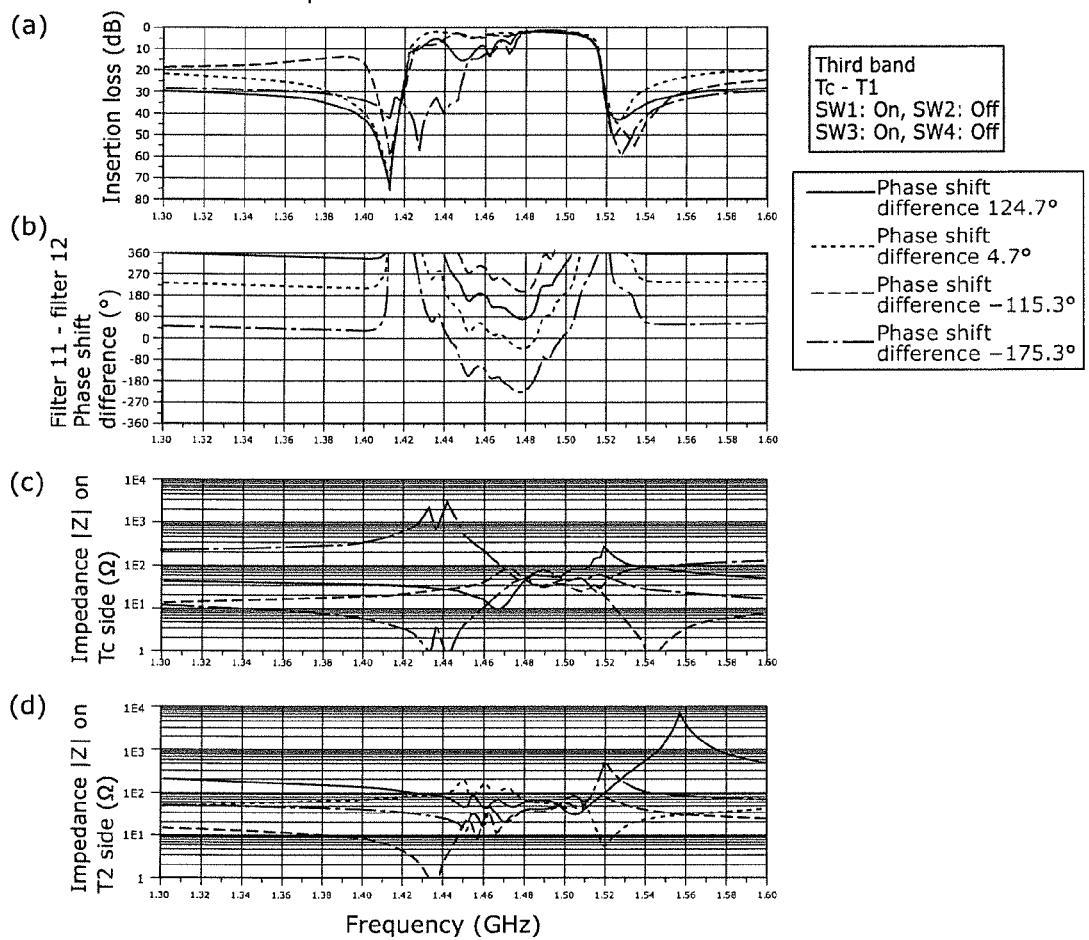
FIG. 11A illustrates graphs showing passing characteristics, phase shift difference characteristics, and impedance characteristics when phase shifts on the common terminal side and the input/output terminal side in the filter mode in Example 3 is changed.

FIG. 11A illustrates graphs showing passing characteristics, phase shift difference characteristics, and impedance characteristics when impedance of filter 12 on the common terminal Tc side and impedance of filter 12 on the input/output terminal T2 side are changed in filter device 10D according to Example 3 in the filter mode.

Figure 11B:
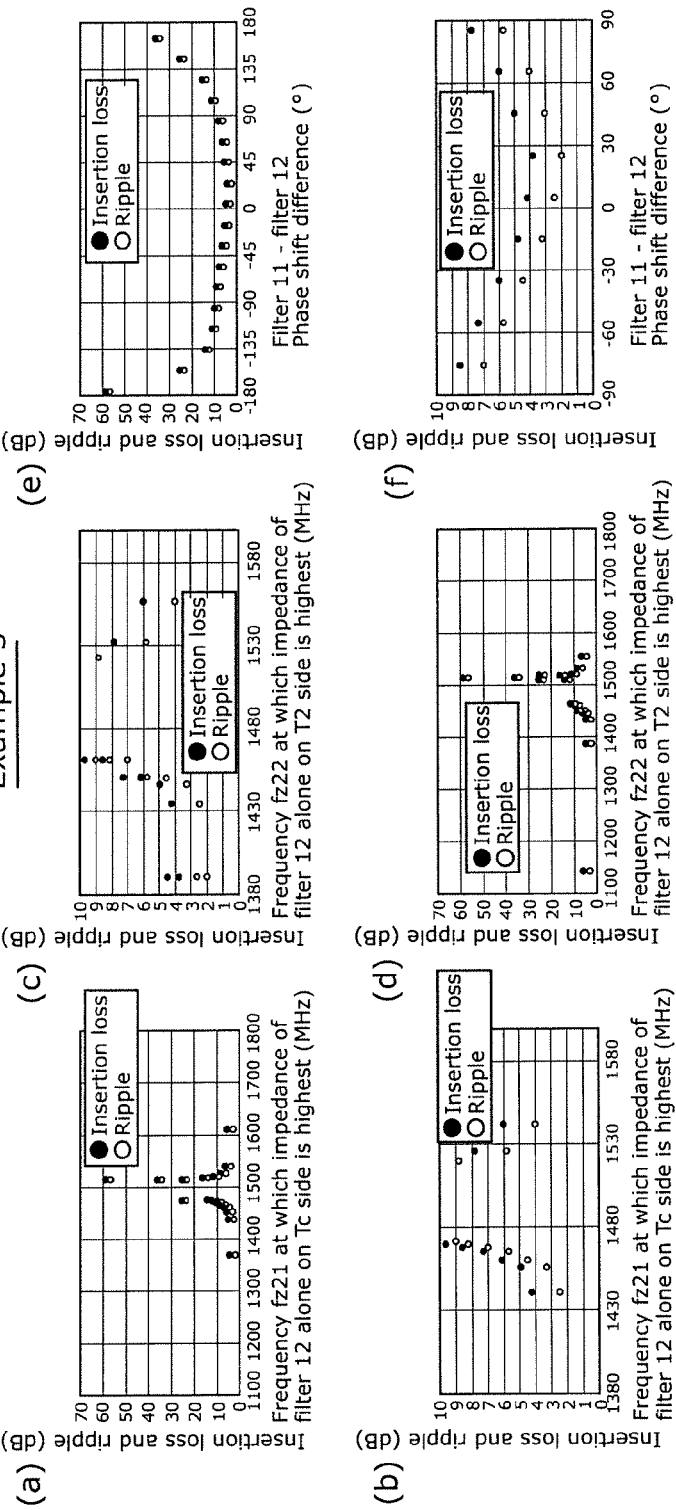
FIG. 11B illustrates graphs showing relations between (i) insertion loss and a ripple and (ii) a frequency at which the second filter has highest impedance and a difference between phase shifts caused by filters, when a phase shift on the input/output terminal side in the filter mode in Example 3 is changed.

FIG. 11B illustrates graphs showing insertion loss and a ripple in the third band when a phase of a signal that enters filter 12 through common terminal Tc and a phase of a signal that enters filter 12 through input/output terminal T2 are changed in filter device 10D according to Example 3 in the filter mode. Part (a) of FIG. 11B is a graph showing a relation between frequency fz21 at which impedance of filter 12 on the common terminal Tc side is highest, and insertion loss and a ripple in the third band, and (b) of FIG. 11B is an enlarged portion of the graph in (a) of FIG. 11B. Part (c) of FIG. 11B is a graph showing a relation between fz22 at which impedance of filter 12 on the input/output terminal T2 side is highest, and insertion loss and a ripple in the third band, and (d) of FIG. 11B is an enlarged portion of the graph in (c) of FIG. 11B. Part (e) of FIG. 11B is a graph showing a relation between a difference between phase shifts caused by filters 11 and 12 and insertion loss and a ripple in the third band, and (f) of FIG. 11B is an enlarged portion of the graph in (e) of FIG. 11B.

Table 3, FIG. 11A, and (a) to (d) of FIG. 11B show that a great ripple of more than 20 dB in the wide passband of a filter which is the third band can be decreased to 20 dB or lower when frequency fz21 at which impedance of filter 12 on the common terminal Tc side is highest and frequency fz22 at which impedance of filter 12 on the input/output terminal T2 side is highest are each at most a frequency at a lower edge of the second band.

Table 3, FIG. 11A, and (e) and (f) of FIG. 11B show that a great ripple of more than 10 dB in the wide passband of the filter which is the third band can be decreased to 10 dB or lower when a difference between phase shifts caused by filters 11 and 12 is at least −50° and at most +50°.

Furthermore, Table 3, FIG. 11A, and (a) to (d) of FIG. 11B show that a great ripple of more than 5 dB in the wide passband of the filter which is the third band can be decreased to 5 dB or lower when frequency fz21 at which impedance of filter 12 on the common terminal Tc side is highest and frequency fz22 at which impedance of filter 12 on the input/output terminal T2 side is highest are each at most a frequency at a higher edge of the first band.

Note that similarly to the configuration of filter device 10B according to Variation 1, a configuration in which switches SW2 and SW3 are disposed between filter 11 and input/output terminal T1 can be considered as a variation of filter device 10D according to Example 3. In this case, filter 11 is a second filter connected to a second path that connects common terminal Tc and input/output terminal T1 (second input/output terminal), and having a passband that is the second band. Filter 12 is a first filter connected to a first path that connects common terminal Tc and input/output terminal T2 (first input/output terminal), and having a passband that is the first band. The second band has a frequency range that is lower than the frequency range of the first band, and does not overlap the frequency range of the first band. Input/output terminal T1 corresponds to the second input/output terminal, and input/output terminal T2 corresponds to the first input/output terminal. Filter 12 (first filter) includes a first phase shifter, a filter circuit, and a second phase shifter.

In this case, frequency fz21 at which impedance of filter 12 on the common terminal Tc side is highest and frequency fz22 at which impedance of filter 12 on the input/output terminal T2 side is highest are each at most a frequency at a lower edge of the first band, and thus a great ripple of more than 20 dB in the wide passband of the filter which is the third band can be decreased to 20 dB or lower.

A difference between phase shifts caused by filters 11 and 12 is at least −50° and at most +50°, and thus a great ripple of more than 10 dB in the wide passband of the filter which is the third band can be decreased to 10 dB or lower.

Furthermore, frequency fz21 at which impedance of filter 12 on the common terminal Tc side is highest and frequency fz22 at which impedance of filter 12 on the input/output terminal T2 side is highest are each at most a frequency at a higher edge of the second band, and thus a great ripple of more than 5 dB in the wide passband of the filter which is the third band can be decreased to 5 dB or lower.

1.6 Configuration of Phase Shifters of Filter Device According to Example 3

Next, a configuration of the phase shifters included in filter 12 of filter device 10D according to Example 3 is to be described.

Figure 12:
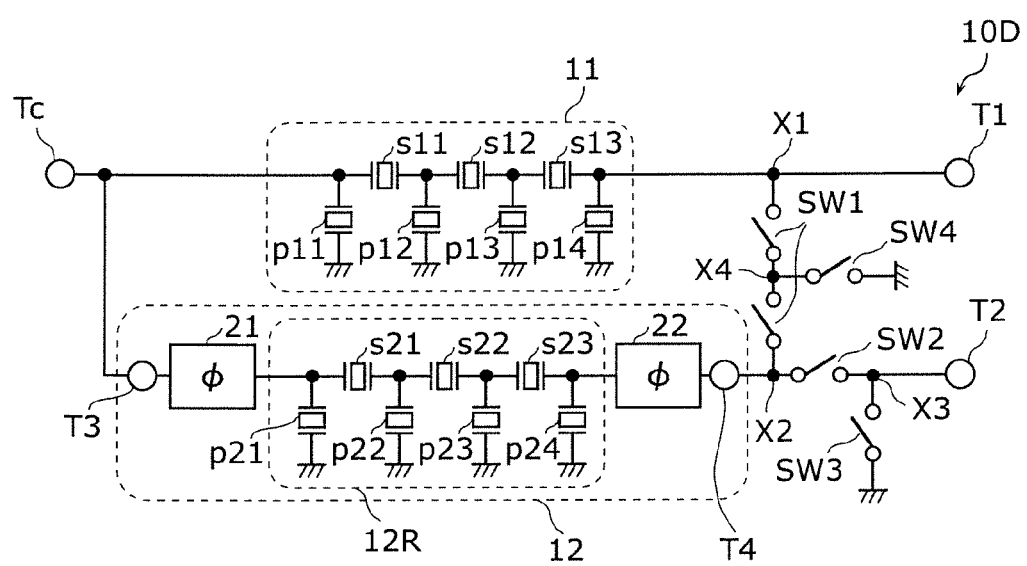
FIG. 12 illustrates a specific circuit configuration of the filter device according to Example 3.

FIG. 12 illustrates a specific circuit configuration of filter device 10D according to Example 3.

Filter 11 includes series-arm resonators s11, s12, and s13 disposed on a path that connects common terminal Tc and node X1, and parallel-arm resonators p11, p12, p13, and p14 each disposed between the ground and a node on the path that connects common terminal Tc and node X1. According to the above configuration, filter 11 is included in a ladder bandpass filter having a passband that is the first band.

Filter 12 includes series-arm resonators s21, s22, and s23 disposed on a second path that connects common terminal Tc and node X2, parallel-arm resonators p21, p22, p23, and p24 each disposed between the ground and a node on the second path, phase shifters 21 and 22, and input/output terminals T3 and T4. Series-arm resonators s21 to s23 and parallel-arm resonators p21 to p24 are included in filter portion 12R having resonance characteristics. Phase shifter 21 is a first phase shifter connected between one terminal of filter portion 12R and input/output terminal T3 (third input/output terminal), and phase shifter 22 is a second phase shifter connected between the other terminal of filter portion 12R and input/output terminal T4 (fourth input/output terminal). Phase shifters 21 and 22 include delay lines that are distributed constant lines or lumped constant elements. According to the above configuration, filter 12 is included in a ladder bandpass filter that can adjust a phase shift, and has a passband that is the second band.

Table 4 shows examples of circuit parameters of filter device 10D according to Example 3.

TABLE 4

| Example 3 | | Resonant frequency fr (MHz) | Anti-resonant frequency fa (MHz) | Electro-static cap C0 (pF) | Phase shift (°) |
|---|---|---|---|---|---|
| Filter 11 | s11 | 1446 | 1486 | 1.76 | |
| | s12 | 1465 | 1506 | 1.34 | |
| | s13 | 1452 | 1493 | 0.96 | |
| | p11 | 1413 | 1452 | 0.51 | |
| | p12 | 1412 | 1451 | 2.32 | |
| | p13 | 1413 | 1452 | 3.46 | |
| | p14 | 1413 | 1452 | 1.46 | |
| Filter 12a | s21 | 1481 | 1522 | 3.71 | |
| | s22 | 1480 | 1521 | 3.25 | |
| | s23 | 1493 | 1535 | 0.94 | |
| | p21 | 1450 | 1491 | 3.76 | |
| | p22 | 1429 | 1469 | 2.17 | |
| | p23 | 1439 | 1479 | 3.18 | |
| | p24 | 1462 | 1503 | 0.10 | |
| | Phase shifter 21 | | | | 85.2 |
| | Phase shifter 22 | | | | 37.7 |

Figure 13A:
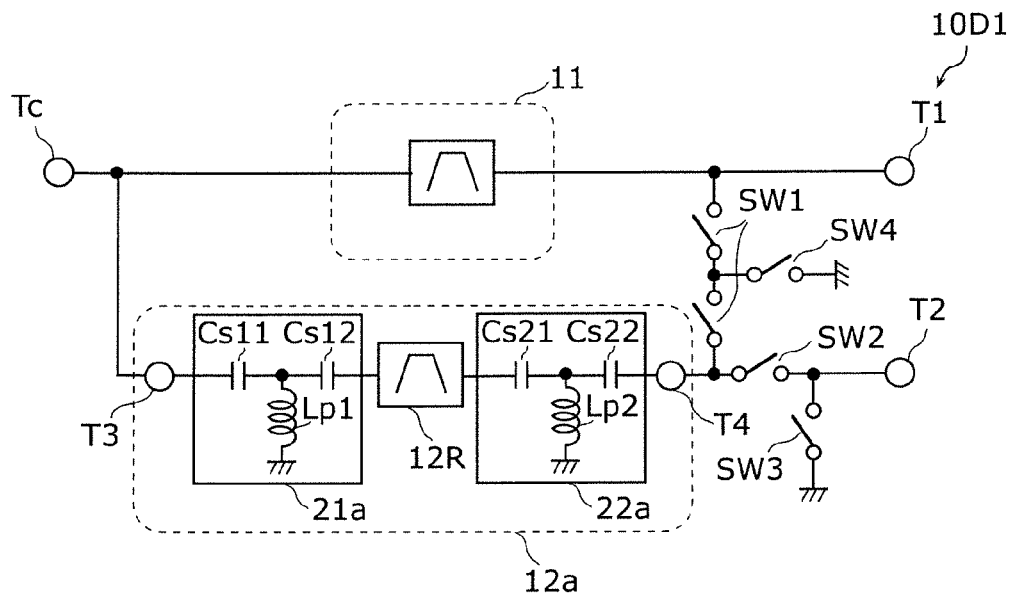
FIG. 13A illustrates a circuit configuration of a filter device according to Variation 2.

FIG. 13A illustrates a circuit configuration of filter device 10D1 according to Variation 2. Filter device 10D1 illustrated in FIG. 13A illustrates a specific circuit configuration of phase shifters 21 and 22 of filter device 10D. Filter device 10D1 according to this variation includes filters 11 and 12a, switches SW1 to SW4, common terminal Tc, and input/output terminals T1 and T2.

Filter 12a includes filter portion 12R, phase shifters 21a and 22a, and input/output terminals T3 and T4.

Phase shifters 21a and 22a each include an impedance element that includes at least one of a capacitor or an inductor. Specifically, phase shifter 21a includes capacitors Cs11 and Cs12 disposed on the second path, and inductor Lp1 connected between the ground and a connection node of capacitors Cs11 and Cs12. Phase shifter 22a includes capacitors Cs21 and Cs22 disposed on the second path, and inductor Lp2 connected between the ground and a connection node of capacitors Cs21 and Cs22. Thus, phase shifters 21a and 22a according to this variation each have a (T shaped) high-pass filter circuit configuration (having three elements).

As shown in Table 4, both of the phase shifts caused by phase shifters 21 and 22 have positive values (phase shifts on the positive side) in filter device 10D according to Example 3, and thus a high-pass filter circuit configuration is suitable therefor.

Figure 13B:
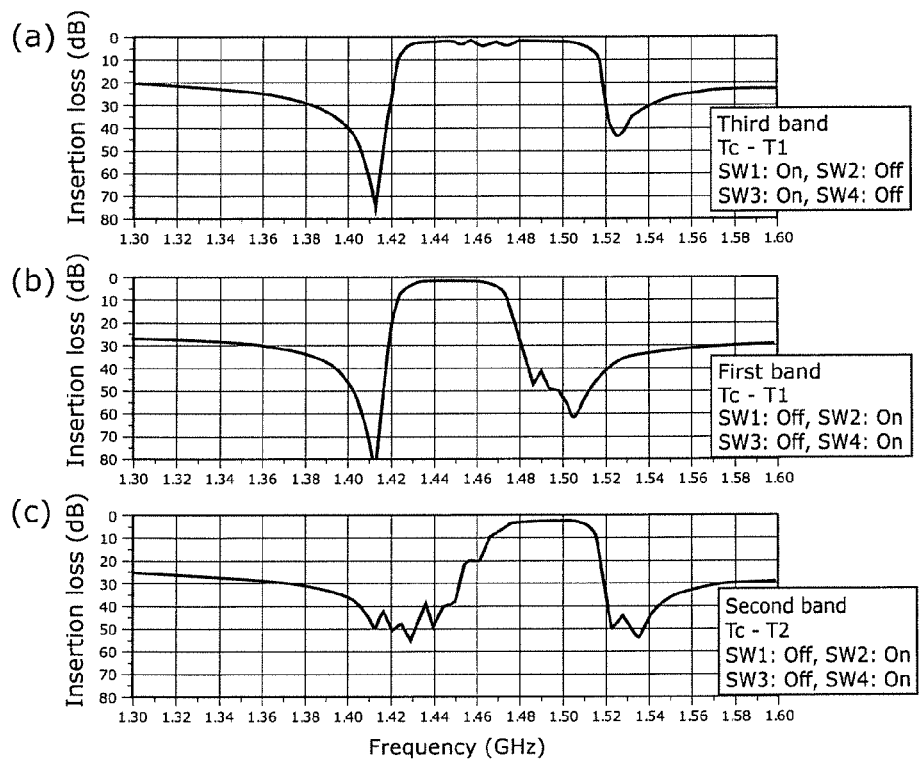
FIG. 13B illustrates graphs showing passing characteristics of the filter device according to Variation 2.

FIG. 13B illustrates graphs showing passing characteristics of filter device 10D1 according to Variation 2. Part (a) of FIG. 13B illustrates passing characteristics between common terminal Tc and input/output terminal T1 when switches SW1 and SW3 are on and switches SW2 and SW4 are off. Part (b) of FIG. 13B illustrates passing characteristics between common terminal Tc and input/output terminal T1 when switches SW1 and SW3 are off and switches SW2 and SW4 are on. Part (c) of FIG. 13B illustrates passing characteristics between common terminal Tc and input/output terminal T2 when switches SW1 and SW3 are off and switches SW2 and SW4 are on.

Note that in this variation and following Variations 2 to 5, the first band of filter 11 includes the transmission band of LTE Band 11 and the transmission band of LTE Band 21. The second band of filter 12a includes the receiving band of LTE Band 11 and the receiving band of LTE Band 21. The third band that includes at least a portion of the first band and at least a portion of the second band includes the receiving band of LTE Band 32.

As illustrated in (a) of FIG. 13B, when switches SW1 and SW3 are on and switches SW2 and SW4 are off, filter device 10D1 forms a filter that has the relatively wide third band that includes the first band and the second band, between common terminal Tc and input/output terminal T1. Here, a difference between phase shifts caused by filters 11 and 12a can be optimized by adjusting the phase shifts caused by phase shifters 21a and 22a to the values shown in Table 4. By using lumped-constant elements such as a capacitor and an inductor, a difference between phase shifts caused by filters 11 and 12a can be optimized, and also the sizes of phase shifters 21a and 22a can be reduced. Accordingly, a ripple of a filter having the relatively wide third band that includes the first band and the second band can be improved. Part (a) of FIG. 13B shows that (greatest) insertion loss in the third band is 4.15 dB, and thus the loss and a ripple in the third band are decreased.

Figure 14A:
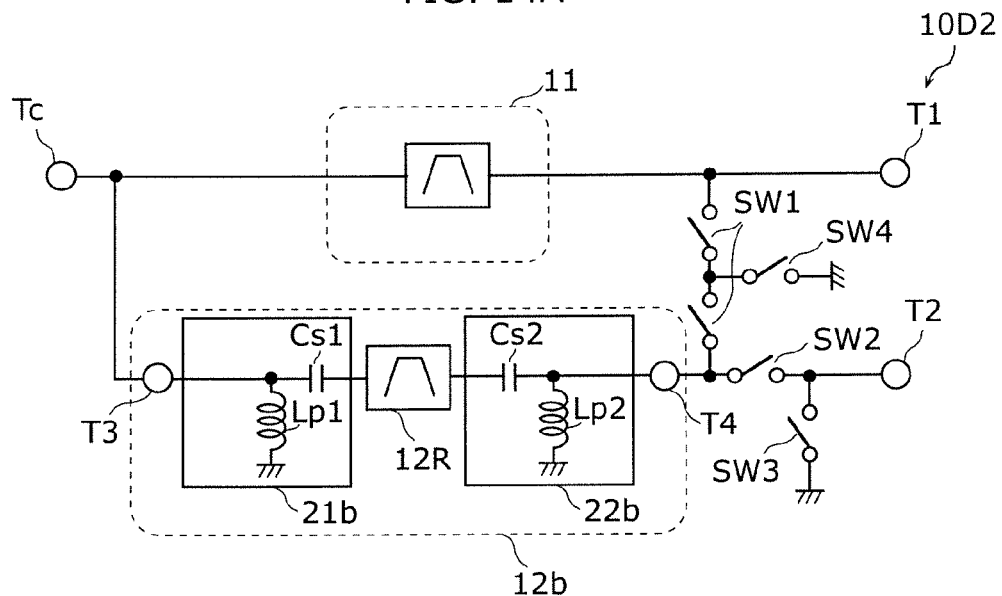
FIG. 14A illustrates a circuit configuration of a filter device according to Variation 3.

FIG. 14A illustrates a circuit configuration of filter device 10D2 according to Variation 3. Filter device 10D2 illustrated in FIG. 14A illustrates a specific circuit configuration of phase shifters 21 and 22 of filter device 10D. Filter device 10D2 according to this variation includes filters 11 and 12b, switches SW1 to SW4, common terminal Tc, and input/output terminals T1 and T2.

Filter 12b includes filter portion 12R, phase shifters 21b and 22b, and input/output terminals T3 and T4.

Phase shifters 21b and 22b each include an impedance element that includes at least one of a capacitor or an inductor. Specifically, phase shifter 21b includes capacitor Cs1 disposed on the second path, and inductor Lp1 connected between the ground and a connection node of capacitor Cs1 and input/output terminal T3. Phase shifter 22a includes capacitor Cs2 disposed on the second path, and inductor Lp2 connected between the ground and a connection node of capacitor Cs2 and input/output terminal T4. Specifically, phase shifters 21b and 22b according to this variation each have a (T shaped) high-pass filter circuit configuration (having two elements).

As shown in Table 4, both of the phase shifts caused by phase shifters 21 and 22 have positive values (phase shifts on the positive side) in filter device 10D according to Example 3, and thus a high-pass filter circuit configuration is suitable therefor.

Figure 14B:
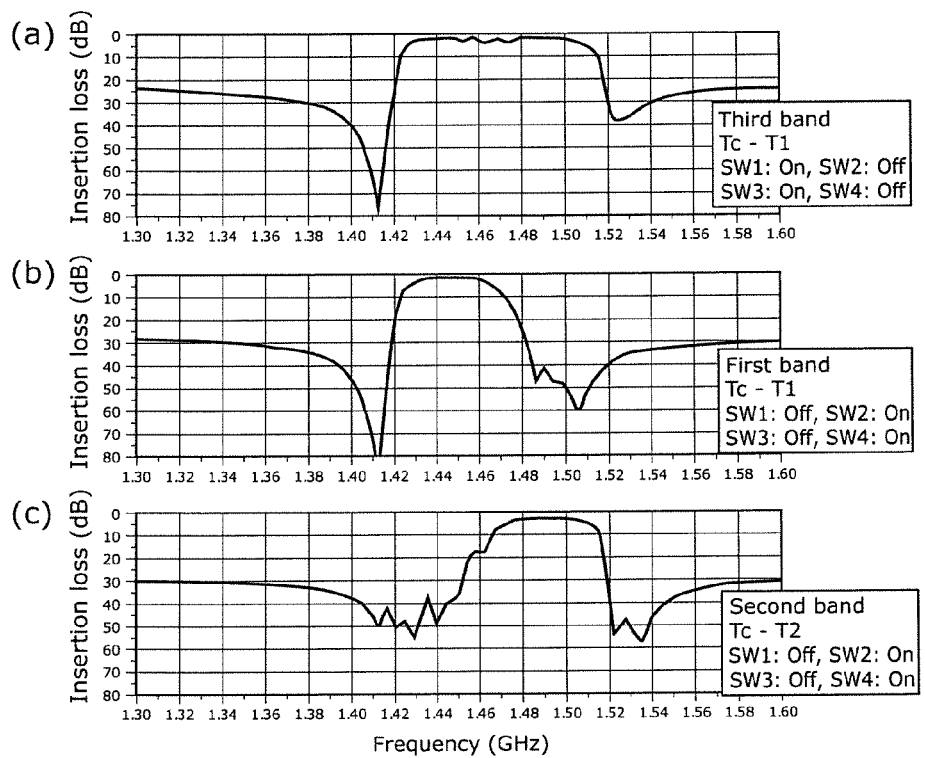
FIG. 14B illustrates graphs showing passing characteristics of the filter device according to Variation 3.

FIG. 14B illustrates graphs showing passing characteristics of filter device 10D2 according to Variation 3. Part (a) of FIG. 14B illustrates passing characteristics between common terminal Tc and input/output terminal T1 when switches SW1 and SW3 are on, and switches SW2 and SW4 are off. Part (b) of FIG. 14B illustrates passing characteristics between common terminal Tc and input/output terminal T1 when switches SW1 and SW3 are off and switches SW2 and SW4 are on. Part (c) of FIG. 14B illustrates passing characteristics between common terminal Tc and input/output terminal T2 when switches SW1 and SW3 are off and switches SW2 and SW4 are on.

As illustrated in (a) of FIG. 14B, when switches SW1 and SW3 are on and switches SW2 and SW4 are off, filter device 10D2 forms a filter having the relatively wide third band that includes the first band and the second band, between common terminal Tc and input/output terminal T1. Here, a difference between phase shifts caused by filters 11 and 12 can be optimized by adjusting the phase shifts caused by phase shifters 21b and 22b to the values shown in Table 4. By using lumped-constant elements such as a capacitor and an inductor, a difference between phase shifts caused by filters 11 and 12b can be optimized, and also the sizes of phase shifters 21b and 22b can be reduced. Accordingly, a ripple of a filter having the relatively wide third band that includes the first band and the second band can be improved. Part (a) of FIG. 14B shows that (greatest) insertion loss in the third band is 5.32 dB, and thus the loss and a ripple in the third band are decreased.

Figure 15A:
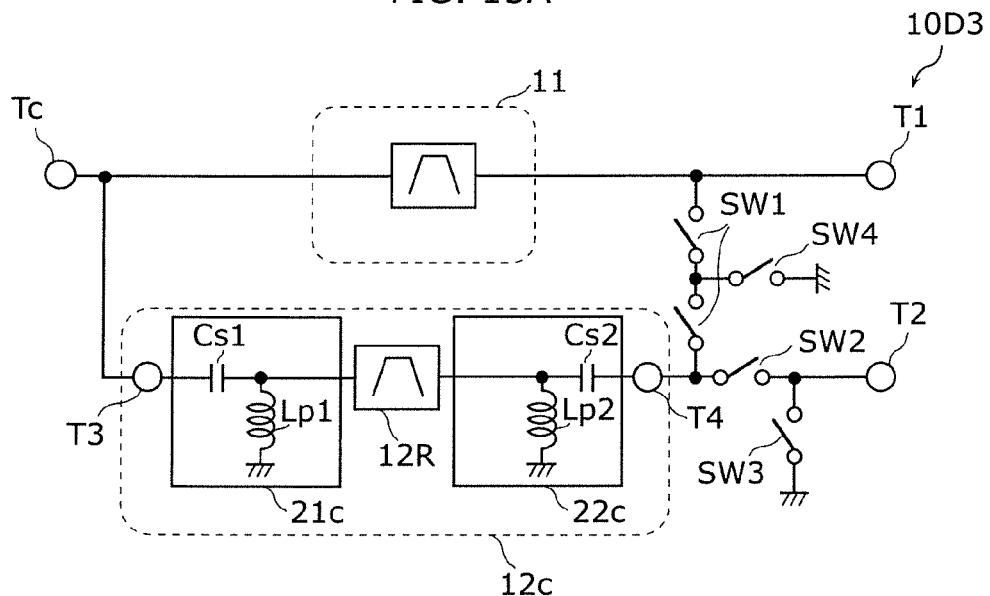
FIG. 15A illustrates a circuit configuration of a filter device according to Variation 4.

FIG. 15A illustrates a circuit configuration of filter device 10D3 according to Variation 4. Filter device 10D3 illustrated in FIG. 15A illustrates a specific circuit configuration of phase shifters 21 and 22 of filter device 10D. Filter device 10D3 according to this variation includes filters 11 and 12c, switches SW1 to SW4, common terminal Tc, and input/output terminals T1 and T2.

Filter 12c includes filter portion 12R, phase shifters 21c and 22c, and input/output terminals T3 and T4.

Phase shifters 21c and 22c each include an impedance element that includes at least one of a capacitor or an inductor. Specifically, phase shifter 21c includes capacitor Cs1 disposed on the second path, and inductor Lp1 connected between the ground and a connection node of capacitor Cs1 and filter portion 12R. Phase shifter 22c includes capacitor Cs2 disposed on the second path, and inductor Lp2 connected between the ground and a connection node of capacitor Cs2 and filter portion 12R. Specifically, phase shifters 21c and 22c according to this variation each have a (T shaped) high-pass filter circuit configuration (having two elements).

As shown in Table 4, both of the phase shifts caused by phase shifters 21 and 22 have positive values (phase shifts on the positive side) in filter device 10D according to Example 3, and thus a high-pass filter circuit configuration is suitable therefor.

Figure 15B:
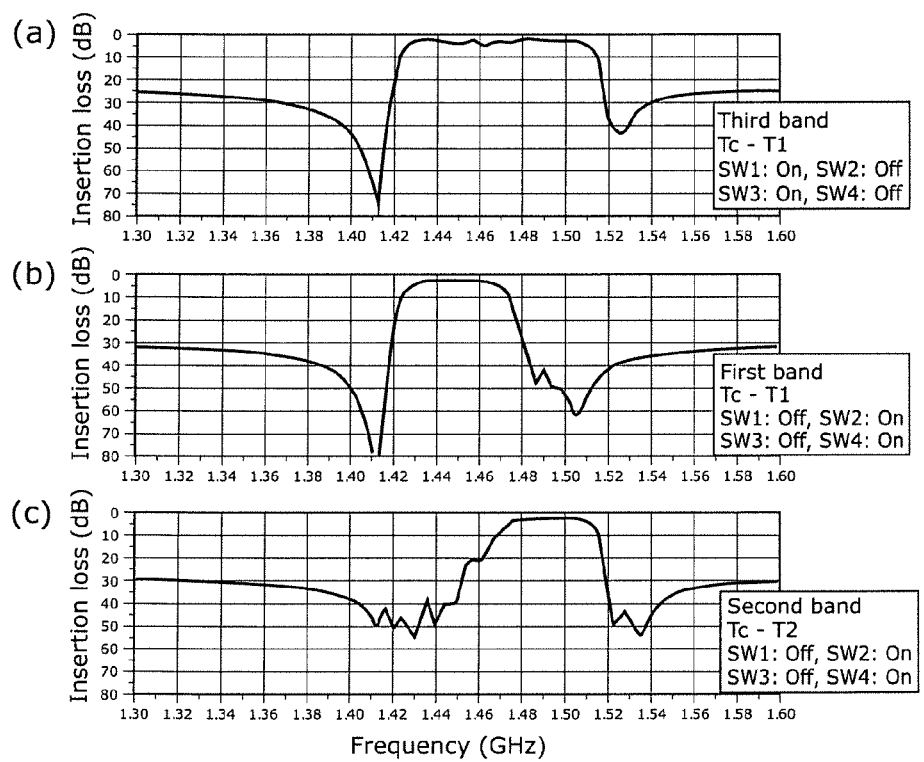
FIG. 15B illustrates graphs showing passing characteristics of the filter device according to Variation 4.

FIG. 15B illustrates graphs showing passing characteristics of filter device 10D3 according to Variation 4. Part (a) of FIG. 15B illustrates passing characteristics between common terminal Tc and input/output terminal T1 when switches SW1 and SW3 are on and switches SW2 and SW4 are off. Part (b) of FIG. 15B illustrates passing characteristics between common terminal Tc and input/output terminal T1 when switches SW1 and SW3 are off and switches SW2 and SW4 are on. Part (c) of FIG. 15B illustrates passing characteristics between common terminal Tc and input/output terminal T2 when switches SW1 and SW3 are off and switches SW2 and SW4 are on.

As illustrated in (a) of FIG. 15B, when switches SW1 and SW3 are on and switches SW2 and SW4 are off, filter device 10D3 forms a filter having the relatively wide third band that includes the first band and the second band, between common terminal Tc and input/output terminal T1. Here, a difference between phase shifts caused by filters 11 and 12 can be optimized by adjusting the phase shifts caused by phase shifters 21c and 22c to the values shown in Table 4. By using lumped-constant elements such as a capacitor and an inductor, a difference between phase shifts caused by filters 11 and 12c can be optimized, and also phase shifter 21c and phase shifter 22c can be miniaturized. Accordingly, a ripple of a filter having the relatively wide third band that includes the first band and the second band can be decreased. Part (a) of FIG. 15B shows that (greatest) insertion loss in the third band is 5.05 dB, and thus the loss and a ripple in the third band are decreased.

Figure 16A:
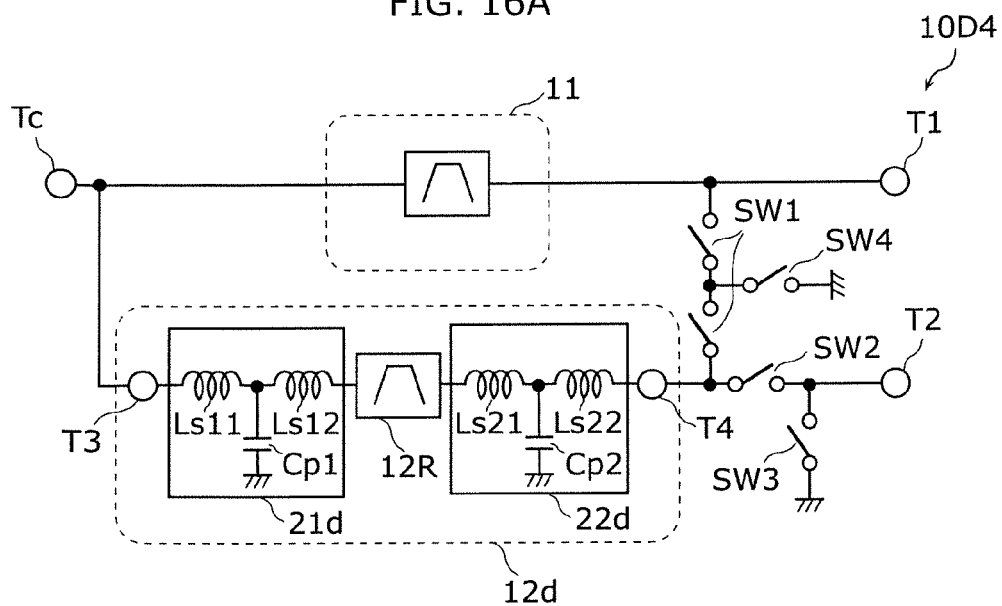
FIG. 16A illustrates a circuit configuration of a filter device according to Variation 5.

FIG. 16A illustrates a circuit configuration of filter device 10D4 according to Variation 5. Filter device 10D4 illustrated in FIG. 16A illustrates a specific circuit configuration of phase shifters 21 and 22 of filter device 10D. Filter device 10D4 according to this variation includes filters 11 and 12d, switches SW1 to SW4, common terminal Tc, and input/output terminals T1 and T2.

Filter 12d includes filter portion 12R, phase shifters 21d and 22d, and input/output terminals T3 and T4.

Phase shifters 21d and 22d each include an impedance element that includes at least one of a capacitor or an inductor. Specifically, phase shifter 21d includes inductors Ls11 and Ls12 disposed on the second path, and capacitor Cp1 connected between the ground and a connection node of inductors Ls11 and Ls12. Phase shifter 22d includes inductors Ls21 and Ls22 disposed on the second path, and capacitor Cp1 connected between the ground and a connection node of inductors Ls21 and Ls22. Thus, phase shifters 21d and 22d according to this variation each have a (T shaped) low-pass filter circuit configuration (having three elements).

As shown in Table 4, both of the phase shifts caused by phase shifters 21 and 22 have positive values (phase shifts on the positive side) in filter device 10D according to Example 3, yet even if a low-pass filter circuit configuration is adopted as in this variation, phase shifts can be adjusted. Note that a phase shifter having a low-pass filter circuit configuration is suitable when a phase shift is adjusted to a negative value (phase shift on the negative side).

Figure 16B:
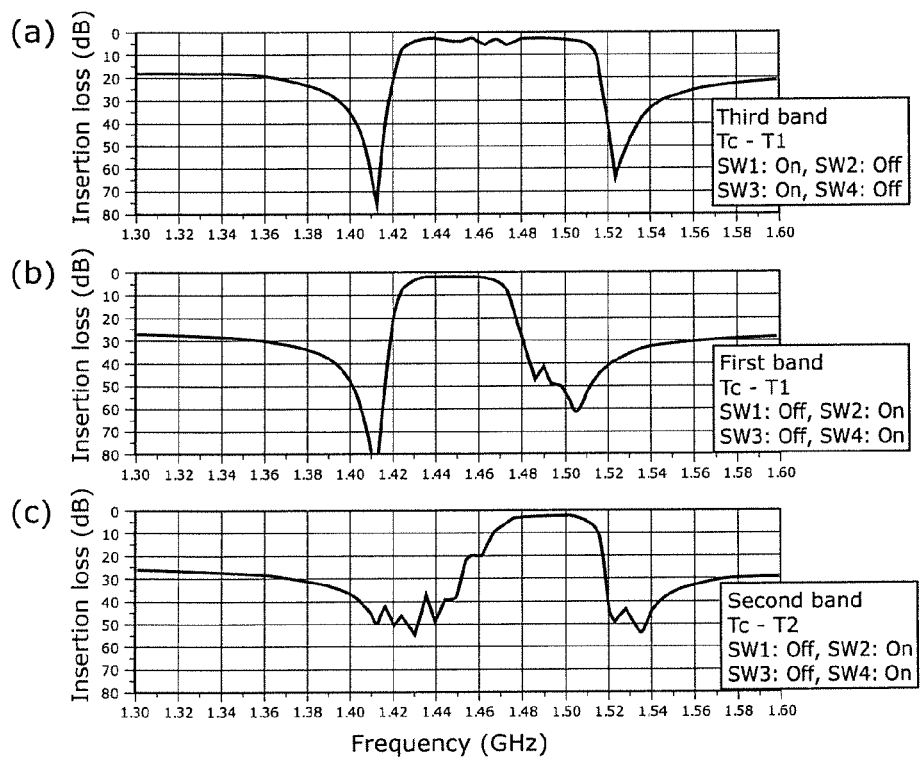
FIG. 16B illustrates graphs showing passing characteristics of the filter device according to Variation 5.

FIG. 16B illustrates graphs showing passing characteristics of filter device 10D4 according to Variation 5. Part (a) of FIG. 16B illustrates passing characteristics between common terminal Tc and input/output terminal T1 when switches SW1 and SW3 are on and switches SW2 and SW4 are off. Part (b) of FIG. 16B illustrates passing characteristics between common terminal Tc and input/output terminal T1 when switches SW1 and SW3 are off and switches SW2 and SW4 are on. Part (c) of FIG. 16B illustrates passing characteristics between common terminal Tc and input/output terminal T2 when switches SW1 and SW3 are off and switches SW2 and SW4 are on.

As illustrated in (a) of FIG. 16B, when switches SW1 and SW3 are on and switches SW2 and SW4 are off, filter device 10D4 forms a filter having the relatively wide third band that includes the first band and the second band, between common terminal Tc and input/output terminal T1. Here, a difference between phase shifts caused by filters 11 and 12 can be optimized by adjusting the phase shifts caused by phase shifters 21d and 22d to the values illustrated in Table 4. By using lumped-constant elements such as a capacitor and an inductor, a difference between phase shifts caused by filter 11 and filter 12d can be optimized, and furthermore phase shifters 21d and 22d can be miniaturized. Accordingly, a ripple of a filter having the relatively wide third band that includes the first band and the second band can be improved. Part (a) of FIG. 15B shows that (greatest) insertion loss in the third band is 5.06 dB, and thus the loss and a ripple in the third band are decreased.

Note that in Variations 2 to 5, the first phase shifter and the second phase shifter have the same circuit configuration, yet the present disclosure is not limited thereto. The first phase shifter and the second phase shifter may have different circuit configurations in order to achieve a difference between phase shifts that are caused by the first filter and the second filter, which the filter device according to the present disclosure is to have. For example, the first phase shifter may have a low-pass filter circuit configuration and the second phase shifter may have a high-pass filter circuit configuration, and vice versa.

Figure 17A:
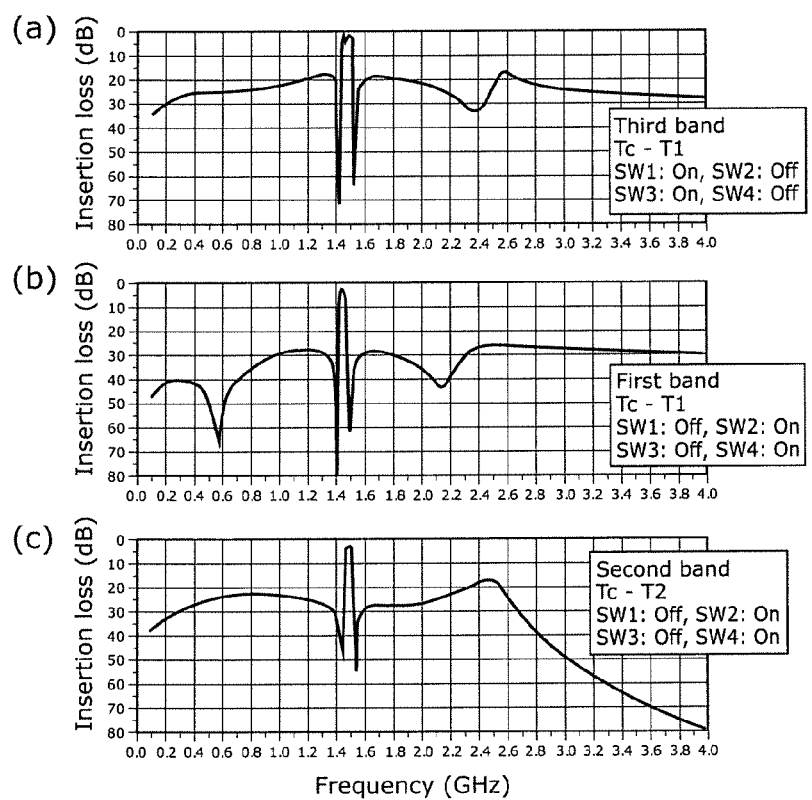
FIG. 17A illustrates graphs showing wide-band passing characteristics of the filter device according to Variation 5.
Figure 17B:
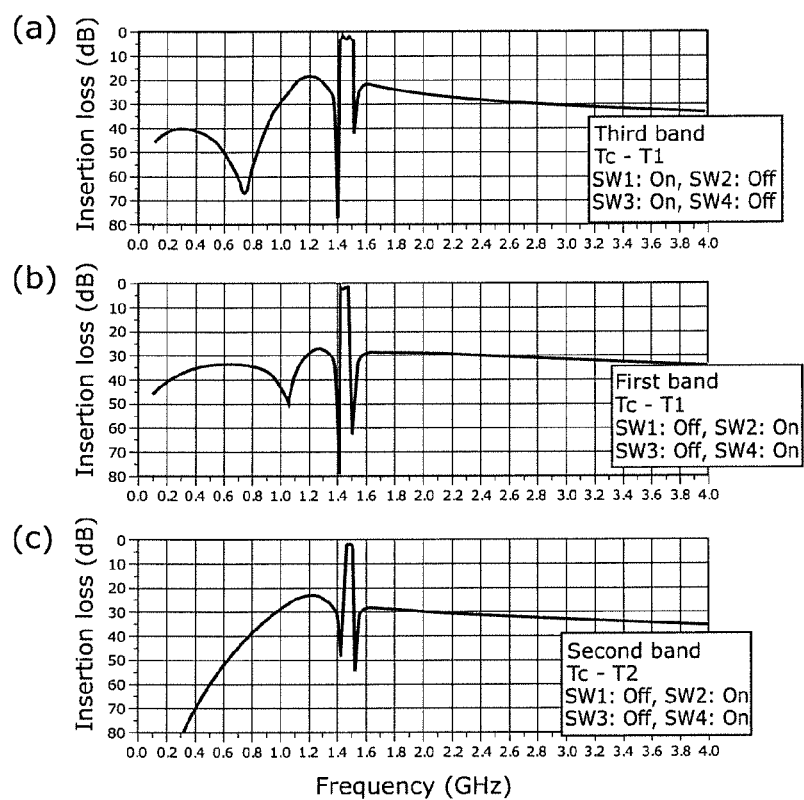
FIG. 17B illustrates graphs showing wide-band passing characteristics of the filter device according to Variation 2.

FIG. 17A illustrates graphs showing wide-band passing characteristics of filter device 10D4 according to Variation 5. FIG. 17B illustrates graphs showing wide-band passing characteristics of filter device 10D1 according to Variation 2. Part (a) of each of FIGS. 17A and 17B illustrates passing characteristics between common terminal Tc and input/output terminal T1 when switches SW1 and SW3 are on and switches SW2 and SW4 are off. Part (b) of each of FIGS. 17A and 17B illustrates passing characteristics between common terminal Tc and input/output terminal T1 when switches SW1 and SW3 are off and switches SW2 and SW4 are on. Part (c) of each of FIGS. 17A and 17B illustrates passing characteristics between common terminal Tc and input/output terminal T2 when switches SW1 and SW3 are off and switches SW2 and SW4 are on.

As illustrated in FIG. 17A, filter device 10D4 that includes phase shifters 21d and 22d each having a low-pass filter circuit configuration, attenuation characteristics on the passband high-frequency side improve. On the other hand, as illustrated in FIG. 17B, in filter device 10D1 that includes phase shifters 21a and 22a each having a high-pass filter circuit configuration, attenuation characteristics on the passband low-frequency side improve. Accordingly, for example, low-pass filter phase shifters or high-pass filter phase shifters may be selected according to a frequency at which spurious harmonics or bulk waves occur.

1.7 Filter Device According to Example 4

Figure 18:
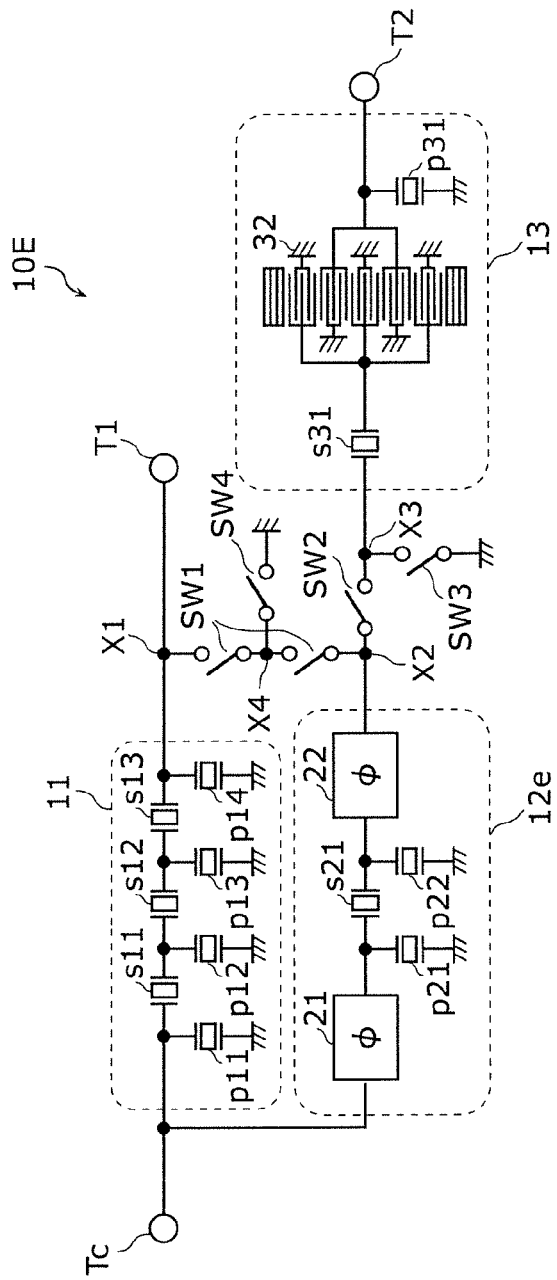
FIG. 18 illustrates a circuit configuration of a filter device according to Example 4.

FIG. 18 illustrates a circuit configuration of filter device 10E according to Example 4. Filter device 10E illustrated in FIG. 18 includes filters 11, 12e, and 13, switches SW1, SW2, SW3 and SW4, common terminal Tc, and input/output terminals T1 and T2. Filter device 10E according to this example is different from filter device 10D according to Example 3 in the circuit configuration of the second filter, and in that filter 13 is added in the configuration. In the following, description of common points of filter device 10E according to this example to those of filter device 10D according to Example 3 is omitted, and different points are mainly described.

Filter 11 has the same circuit configuration as that of filter 11 according to Example 3, and includes series-arm resonators s11 to s13 and parallel-arm resonators p11 to p14. According to the above configuration, filter 11 is included in a ladder bandpass filter having a passband that is the first band.

Filter 12e includes series-arm resonator s21 disposed on a second path that connects common terminal Tc and node X2 and between common terminal Tc and node X2, parallel-arm resonators p21 and p22 disposed between the ground and nodes on the second path between common terminal Tc and node X2, and phase shifters 21 and 22. Series-arm resonator s21 and parallel-arm resonators p21 and p22 are included in a filter circuit having resonance characteristics. Phase shifter 21 is a first phase shifter connected between common terminal Tc and one terminal of the filter circuit, and phase shifter 22 is a second phase shifter connected between node X2 and the other terminal of the filter circuit.

Filter 13 is a third filter that is on the second path, is connected between switch SW2 and input/output terminal T2, and has a passband that is the second band. Filter 13 includes series-arm resonator s31 and longitudinally coupled resonator 32 that are disposed on a path that connects node X3 and input/output terminal T2, and parallel-arm resonator p31 connected between the ground and a node that connects longitudinally coupled resonator 32 and input/output terminal T2. Longitudinally coupled resonator 32 includes five IDT electrodes, and reflectors disposed at the ends of a direction in which the five IDT electrodes are disposed, for example. Note that the number of IDT electrodes in longitudinally coupled resonator 32 may be two or more, and no reflectors may be included.

Table 5 illustrates examples of circuit parameters of filter device 10E according to Example 4. Note that circuit parameters of longitudinally coupled resonator 32 are omitted.

TABLE 5

| Example 4 | | Resonant frequency fr (MHz) | Anti-resonant frequency fa (MHz) | Electro-static cap C0 (pF) | Phase shift (°) |
|---|---|---|---|---|---|
| Filter 11a | s11 | 1446 | 1487 | 1.44 | |
| | s12 | 1467 | 1508 | 2.14 | |
| | s13 | 1449 | 1490 | 1.10 | |
| | p11 | 1400 | 1439 | 3.78 | |
| | p12 | 1409 | 1448 | 2.46 | |
| | p13 | 1412 | 1451 | 3.38 | |
| | p14 | 1409 | 1449 | 2.64 | |
| Filter 12e | s21 | 1487 | 1528 | 2.07 | |
| | p21 | 1435 | 1475 | 8.87 | |
| | p22 | 1432 | 1472 | 5.16 | |
| | Phase shifter 21 | | | | 117.7 |
| | Phase shifter 22 | | | | 91.7 |
| Filter 13 | s31 | 1550 | 1593 | 1.89 | |
| | p31 | 1410 | 1449 | 0.73 | |

Figure 19:
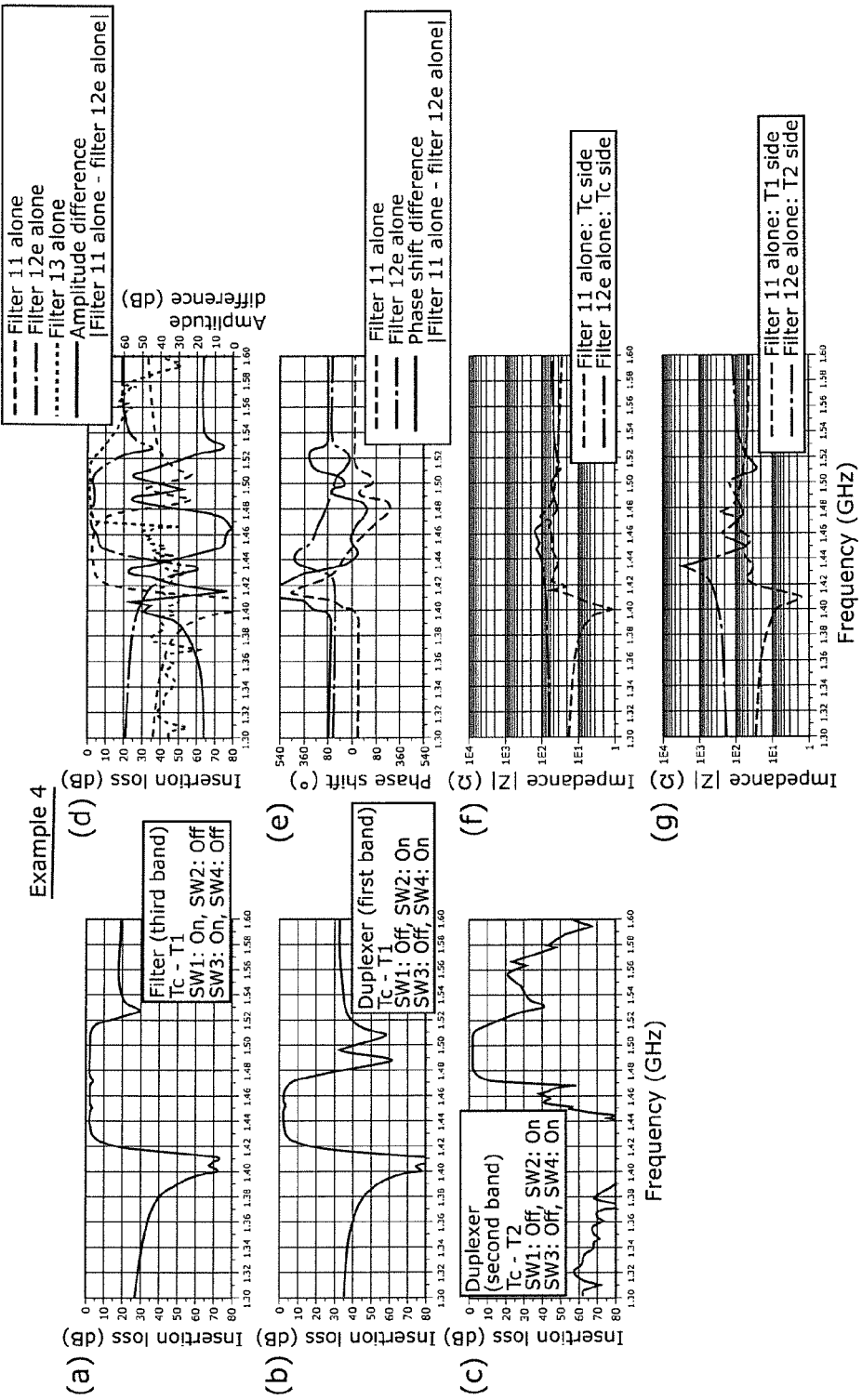
FIG. 19 illustrates graphs showing passing characteristics, amplitude characteristics, phase shift characteristics, and impedance characteristics of the filter device according to Example 4.

FIG. 19 illustrates graphs showing passing characteristics, amplitude characteristics, phase shift characteristics, and impedance characteristics of filter device 10E according to Example 4. Part (a) of FIG. 19 illustrates passing characteristics of filter device 10E in the filter mode. Parts (b) and (c) of FIG. 19 illustrate passing characteristics of filter device 10E in the multiplexer mode. Part (d) of FIG. 19 illustrates amplitude characteristics of filter 11 alone, filter 12e alone, and filter 13 alone, and an amplitude difference between filter 11 alone and filter 12e alone. Part (e) of FIG. 19 illustrates phase shift characteristics of filter 11 alone and filter 12e alone and a difference between phase shifts caused thereby. Part (f) of FIG. 19 illustrates impedance characteristics when filter 11 alone and filter 12e alone are viewed from common terminal Tc. Part (g) of FIG. 19 illustrates impedance characteristics when filter 11 alone is viewed from input/output terminal T1 and impedance characteristics when filter 12e alone is viewed from input/output terminal T2.

Figure 20:
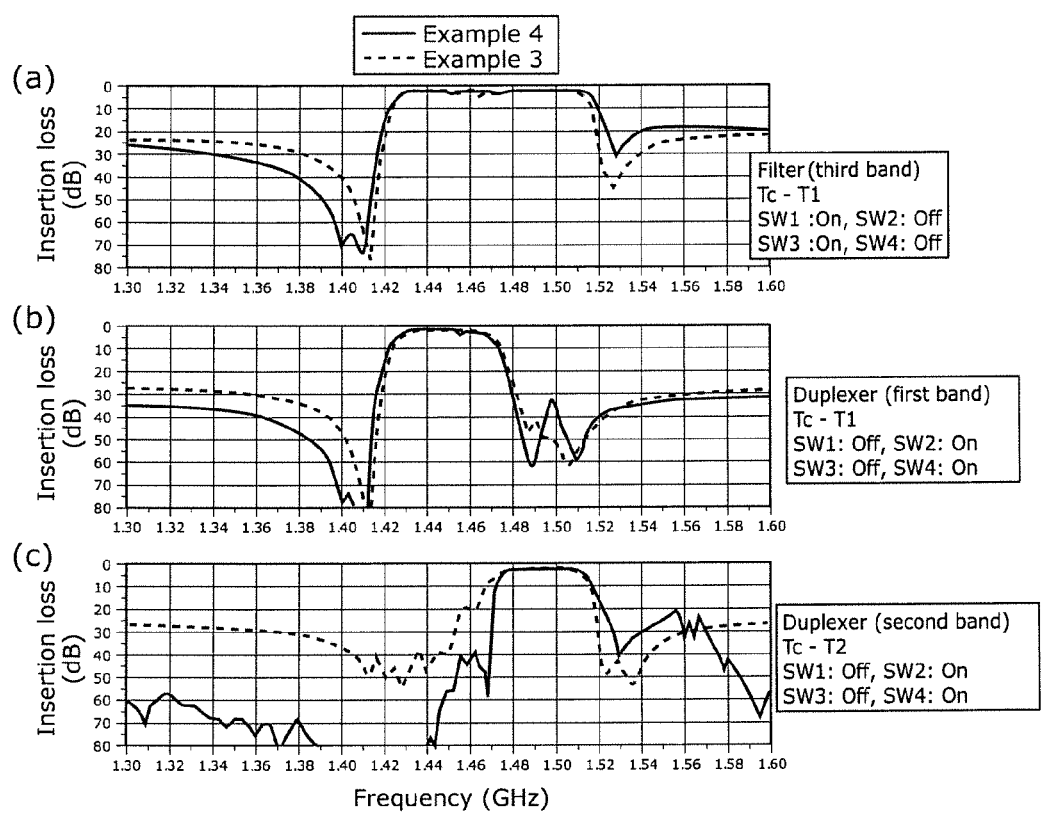
FIG. 20 illustrates graphs showing comparisons of passing characteristics of the filter devices according to Examples 3 and 4.

FIG. 20 illustrates graphs showing comparisons of passing characteristics of filter device 10D according to Example 3 and filter device 10E according to Example 4. Part (a) of FIG. 20 illustrates a comparison of passing characteristics between common terminal Tc and input/output terminal T1 when switches SW1 and SW3 are on and switches SW2 and SW4 are off. Part (b) of FIG. 20 illustrates a comparison of passing characteristics between common terminal Tc and input/output terminal T1 when switches SW1 and SW3 are off and switches SW2 and SW4 are on. Part (c) of FIG. 20 illustrates a comparison of passing characteristics between common terminal Tc and input/output terminal T2 when switches SW1 and SW3 are off and switches SW2 and SW4 are on.

According to the configuration of filter device 10E according to Example 4, as illustrated in (a) of FIG. 19 and (a) of FIG. 20, when switch SW1 is on and switch SW2 is off and a filter having a passband that is the third band is operating between common terminal Tc and input/output terminal T1, filter 13 does not operate and has passing characteristics showing a decrease in ripple in the third band. On the other hand, when switch SW1 is off and switch SW2 is on and a multiplexer is operating, as illustrated in (c) of FIG. 19 and (c) of FIG. 20, filter 13 operates between common terminal Tc and input/output terminal T2, and attenuation characteristics outside the passband of filter 13 having a passband that is the second band and formed between common terminal Tc and input/output terminal T2 improve.

As illustrated in (d) of FIG. 19, a lower-frequency skirt adjacent to the second band in passing characteristics of filter 13 alone is steeper than a lower-frequency skirt adjacent to the second band in passing characteristics of filter 12 alone.

When a filter having a wide passband that is the third band is operating between common terminal Tc and input/output terminal T1, the steeper a lower-frequency skirt adjacent to the second band of filter 12e is, the more likely a ripple occurs in the third band. On the other hand, when the filter device is operating as a multiplexer, the steeper a lower-frequency skirt adjacent to the second band of filter 12e is, the greater the isolation (attenuation) in the first band is between input/output terminal T1 and input/output terminal T2.

In contrast, according to filter device 10E according to this example, filter 13 that has a highly steep lower-frequency skirt adjacent to the second band, and does not contribute to forming the third band is disposed, and a filter having a passband that is the third band is achieved by filters 11 and 12e. Thus, while decreasing a ripple of the filter having a passband that is the third band, attenuation characteristics and isolation characteristics of a multiplexer that includes filter 11, and a filter circuit in which filters 12e and 13 are cascaded can be improved.

Furthermore, the resonator configuration of filter 12e included in the multiplexer can be reduced by disposing filter 13. Specifically, the number of resonators included in filter 12e can be decreased and the width of the second band can be increased, thus decreasing a ripple in the third band.

As illustrated in (f) and (g) of FIG. 19, in filter device 10E according to Example 4, a ripple of a filter having a wide passband that is the third band can be decreased by adjusting a frequency at which impedance of filter 12e is highest.

Note that although in this example, filter 13 is connected to the second path, and switches SW2 and SW3 and filter 13 are disposed between node X2 and input/output terminal T2, switches SW2 and SW3 and filter 13 may be disposed between node X1 and input/output terminal T1. In this case, when the filter device operates as a multiplexer, attenuation characteristics in the first band improve, in the filter characteristics achieved when the second band is a passband.

More specifically, as a variation of filter device 10E according to Example 4, a configuration is conceivable in which switches SW2 and SW3 and filter 13 are connected between node X1 and input/output terminal T1. In this case, filter 11 is a second filter connected to a second path that connects common terminal Tc and input/output terminal T1 (second input/output terminal), and having a passband that is the second band. Filter 12e is a first filter connected to the first path that connects common terminal Tc and input/output terminal T2 (first input/output terminal), and having a passband that is the first band. The second band has a frequency range that is lower than the frequency range of the first band, and does not overlap the frequency range of the first band. Input/output terminal T1 corresponds to the second input/output terminal, and input/output terminal T2 corresponds to the first input/output terminal. Filter 12e (first filter) includes a first phase shifter, a filter circuit, and a second phase shifter.

The higher-frequency skirt adjacent to the second band in passing characteristics of filter 13 alone is steeper than the higher-frequency skirt adjacent to the second band in passing characteristics of filter 11 alone.

When a filter having a wide passband that is the third band is operating between common terminal Tc and input/output terminal T2, the steeper the higher-frequency skirt of filter 11 is, the more readily a ripple occurs in the third band. On the other hand, when the filter device is operating as a multiplexer, the isolation in the first band improves between input/output terminal T1 and input/output terminal T2 as the higher-frequency skirt of filter 11 is steeper.

In contrast, according to the configuration of the present disclosure, filter 13 that has a highly steep higher-frequency skirt adjacent to the second band, and does not contribute to forming the third band is disposed, and a filter having a passband that is the third band includes filters 11 and 12e. Thus, attenuation characteristics and isolation characteristics of a multiplexer that includes filter 12e and a filter circuit in which filters 11 and 13 are cascaded can be improved while decreasing a ripple of the filter having a passband that is the third band.

Furthermore, the resonator configuration of filter 11 included in the multiplexer can be reduced by disposing filter 13. Specifically, the number of resonators included in filter 11 can be decreased and the width of the second band can be increased, thus decreasing a ripple in the third band.

1.8 Filter Device According to Example 5

In this example, a configuration in which the first filter or the second filter includes at least one of a series-arm circuit or a parallel-arm circuit to which an impedance circuit that includes a switch element is added.

Figure 21A:
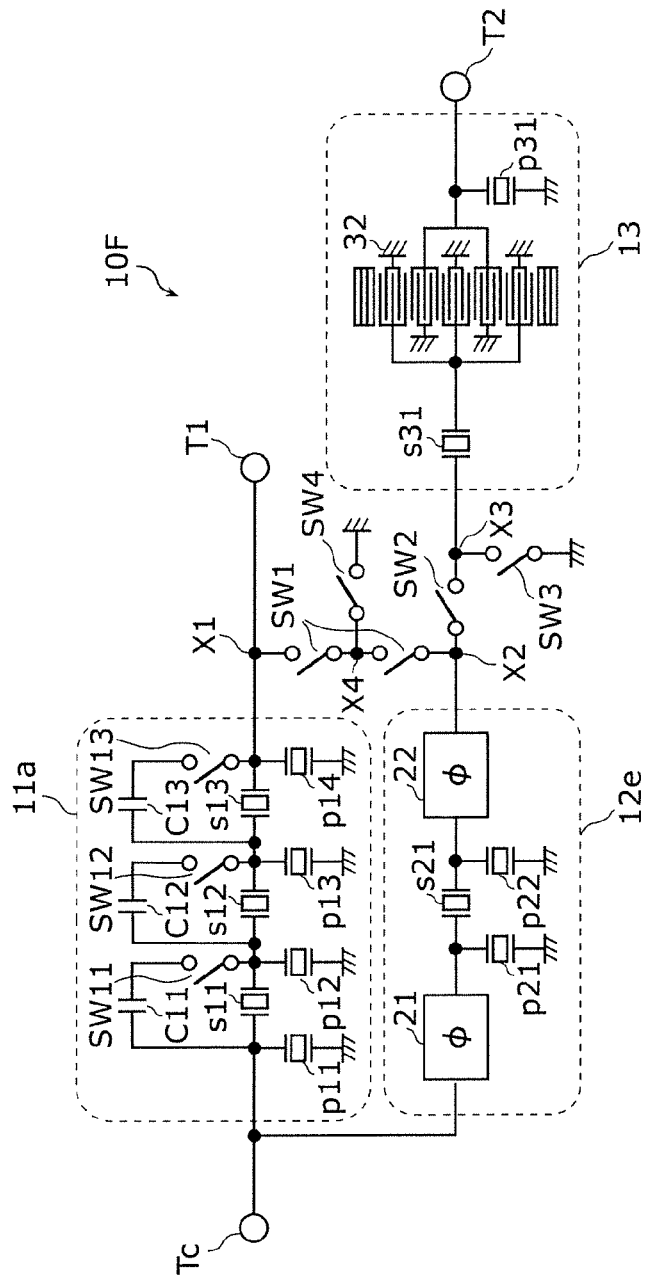
FIG. 21A illustrates a circuit configuration of a filter device according to Example 5.

FIG. 21A illustrates a circuit configuration of filter device 10F according to Example 5. Filter device 10F illustrated in FIG. 21A includes filters 11a, 12e, and 13, switches SW1, SW2, SW3 and SW4, common terminal Tc, and input/output terminals T1 and T2. Filter device 10F according to this example is different from filter device 10E according to Example 4 in the circuit configuration of filter 11a. In the following, description of common points of filter device 10F according to this example to those of filter device 10E according to Example 4 is omitted, and different points are mainly described.

Filter 11a includes series-arm resonators s11, s12, and s13 disposed on a path that connects common terminal Tc and node X1, parallel-arm resonators p11, p12, p13, and p14 each disposed between the ground and a node on the path that connects common terminal Tc and node X1, switches SW11, SW12 and SW13, and capacitors C11, C12, and C13. Note that series-arm resonators s11, s12, and s13 may be series-arm circuits disposed on the path that connects common terminal Tc and node X1. Parallel-arm resonators p11, p12, p13, and p14 may be parallel-arm circuits each disposed between the ground and a node on the path that connects common terminal Tc and node X1. A series-arm circuit and a parallel-arm circuit may include circuit elements such as an inductor and a capacitor, rather than an acoustic resonator.

One terminal of capacitor C11 is connected with the connection node of series-arm resonator s11 and common terminal Tc, and switch SW11 is connected between the other terminal of capacitor C11 and the connection node of series-arm resonators s11 and s12.

One terminal of capacitor C12 is connected with the connection node of series-arm resonators s11 and s12, and switch SW12 is connected between the other terminal of capacitor C12 and the connection node of series-arm resonators s12 and s13.

One terminal of capacitor C13 is connected with the connection node of series-arm resonator s12 and s13, and switch SW13 is connected between the other terminal of capacitor C13 and the connection node of series-arm resonator s13 and node X1.

The above configuration allows filter 11a to be a frequency-tunable bandpass filter having a passband that is a first-a band (Band11Tx) when switches SW11 to SW13 are on, and having a passband that is the first band (Band21Tx) when switches SW1 to SW13 are off.

Here, the first series-arm circuit includes series-arm resonator s11 and a first impedance circuit connected in parallel to series-arm resonator s11. The first impedance circuit is constituted by capacitor C11 and switch SW11 connected in series. The second series-arm circuit includes series-arm resonator s12, and a second impedance circuit connected in parallel to series-arm resonator s12. The second impedance circuit is constituted by capacitor C12 and switch SW12 connected in series. The third series-arm circuit includes series-arm resonator s13, and a third impedance circuit connected in parallel to series-arm resonator s13. The third impedance circuit is constituted by capacitor C13 and switch SW13 connected in series.

Table 6 shows circuit parameters of filter device 10F according to Example 5.

TABLE 6

| Example 5 | | Resonant frequency fr (MHz) | Anti-resonant frequency fa (MHz) | Electro-static cap C0 (pF) | Phase shift (°) |
|---|---|---|---|---|---|
| Filter 11a | s11 | 1437 | 1487 | 2.26 | |
| | s12 | 1458 | 1509 | 1.17 | |
| | s13 | 1447 | 1498 | 0.96 | |
| | p11 | 1401 | 1440 | 2.99 | |
| | p12 | 1401 | 1440 | 2.21 | |
| | p13 | 1407 | 1446 | 3.23 | |
| | p14 | 1411 | 1451 | 2.15 | |
| | C11 | | | 0.26 | |
| | C12 | | | 0.63 | |
| | C13 | | | 3.33 | |
| Filter 12e | s21 | 1486 | 1527 | 2.50 | |
| | p21 | 1434 | 1475 | 7.82 | |
| | p22 | 1433 | 1473 | 4.09 | |
| | Phase shifter 21 | | | | 115.3 |
| | Phase shifter 22 | | | | 91.0 |
| Filter 13 | s31 | 1550 | 1593 | 2.37 | |
| | p31 | 1461 | 1502 | 0.81 | |

Figure 22A:
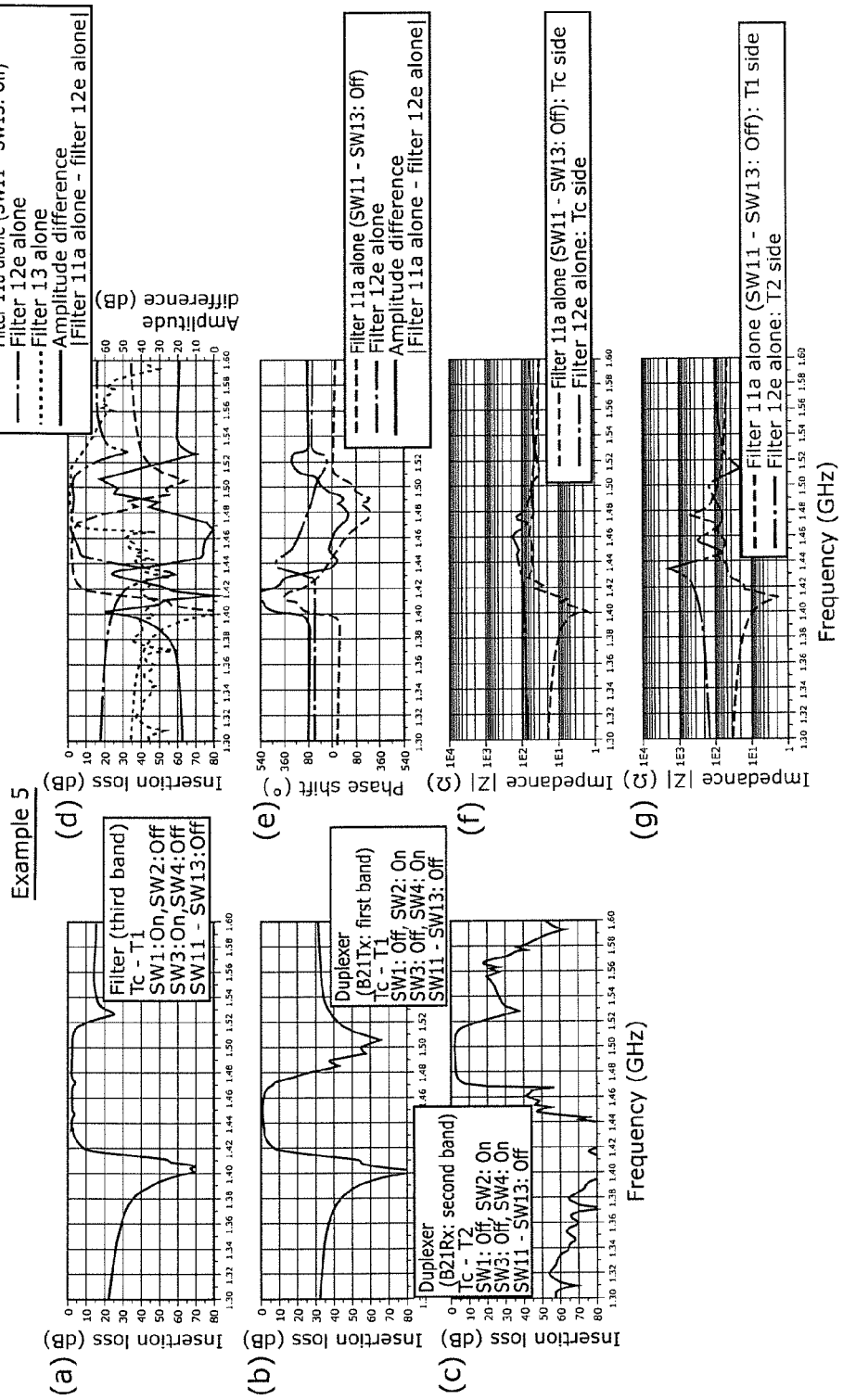
FIG. 22A illustrates graphs showing passing characteristics, amplitude characteristics, phase shift characteristics, and impedance characteristics of the filter device according to Example 5.
Figure 22B:
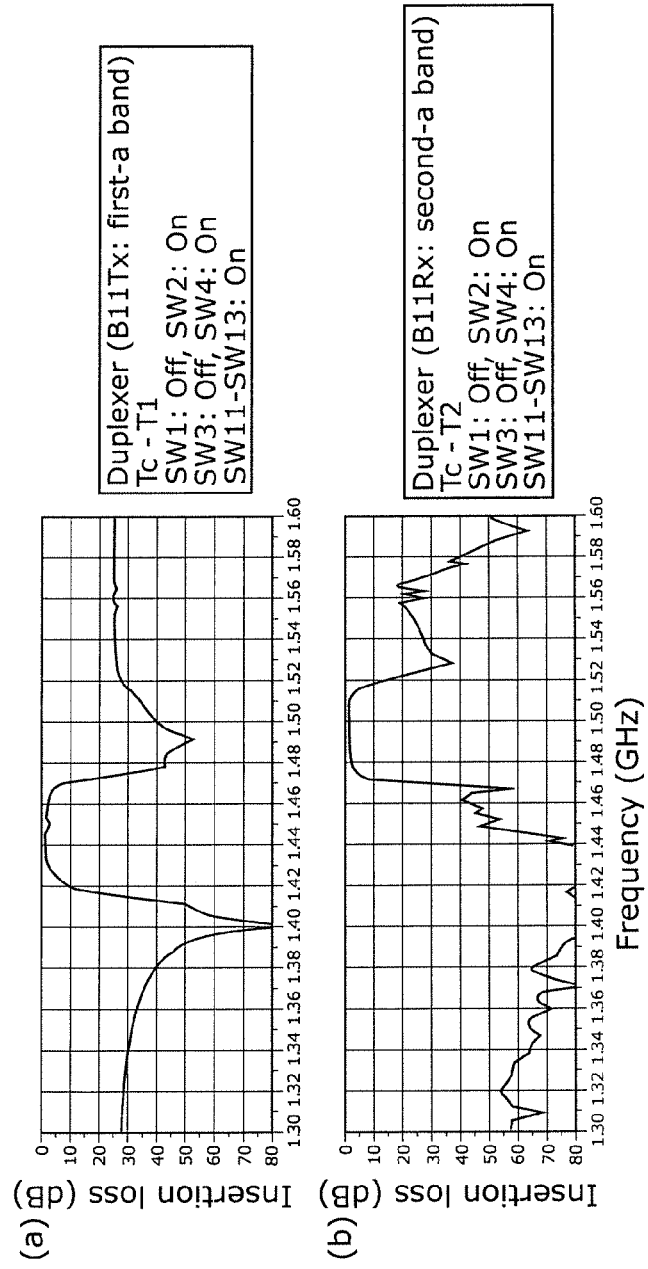
FIG. 22B illustrates graphs showing passing characteristics of a first-a band and a second-a band of the filter device according to Example 5 in the duplexer mode.

FIG. 22A illustrates graphs showing passing characteristics, amplitude characteristics, phase shift characteristics, and impedance characteristics of filter device 10F according to Example 5. FIG. 22B illustrates graphs showing passing characteristics of the first-a band and a second-a band of filter device 10F according to Example 5 in the duplexer mode. Part (a) of FIG. 22A illustrates passing characteristics of filter device 10F in the filter mode. Parts (b) and (c) of FIG. 22A illustrate passing characteristics of the first band (Band21Tx) and the second band (Band21Rx) of filter device 10F in the multiplexer mode. Part (d) of FIG. 22A illustrates amplitude characteristics of filter 11a alone, filter 12e alone, and filter 13 alone, and an amplitude difference between filter 11a alone and filter 12e alone. Part (e) of FIG. 22A illustrates phase shift characteristics of filter 11a alone and filter 12e alone and a difference between phase shifts caused thereby. Part (f) of FIG. 22A illustrates impedance characteristics when filter 11a alone and filter 12e alone are viewed from common terminal Tc. Part (g) of FIG. 22A illustrates impedance characteristics when filter 11a alone is viewed from input/output terminal T1, and impedance characteristics when filter 12e alone is viewed from input/output terminal T2. Parts (a) and (b) of FIG. 22B illustrate passing characteristics of the first-a band (Band11Tx) and the second-a band (Band11Rx) of filter device 10F in the multiplexer mode.

In filter 11a, capacitors C11 to C13 are connected in parallel to series-arm resonators s11 to s13 one-to-one when switches SW11 to SW13 are on, and thus antiresonant frequencies of the series-arm circuits are switched to lower frequencies by switching switches SW11 to SW13 from off to on.

Note that in the present embodiment, frequencies at which impedance |Z| of a series-arm resonator, a parallel-arm resonator, a series-arm circuit, and a parallel-arm circuit has a local minimum value are each a resonant frequency, and frequencies at which impedance |Z| thereof has a local maximum value are each an antiresonant frequency.

The antiresonant frequency of a series-arm circuit determines the attenuation pole on the passband high-frequency side of a ladder filter, and thus as illustrated in (b) of FIG. 22A and (a) of FIG. 22B, filter 11a can change steepness on the passband high-frequency side and a frequency at a passband high-frequency edge by switching between on and off of switches SW11 to SW13.

By switching switches SW11 to SW13 from off to on, a frequency of the higher attenuation pole of the passband of filter 11a can be changed to a lower frequency (the passband of filter 11a is switched from Band21Tx to Band11Tx), so that the attenuation of filter 12e (having a passband that is Band11Rx) on the lower frequency side is increased.

Parts (f) and (g) of FIG. 22A show that frequency fz21 at which impedance on the common terminal Tc side of filter 12e is highest and frequency fz22 at which impedance on the input/output terminal T2 side is highest are each at most a frequency at the lower edge of the second band. Accordingly, a great ripple of over 20 dB in a passband of the filter having a wide passband that is the third band can be decreased to 20 dB or less.

Parts (d) and (e) of FIG. 22A show that a difference between phase shifts caused by filters 11a and 12e is at least −50° and at most +50° at a frequency at which filter 11a alone and filter 12e alone have the same amplitude. Accordingly, a great ripple of more than 10 dB in the wide passband of a filter that is the third band can be decreased to 10 dB or lower.

Furthermore, (f) and (g) of FIG. 22A show that frequency fz21 at which impedance on the common terminal Tc side of filter 12e alone is highest and frequency fz22 at which impedance on the input/output terminal T2 side is highest are each at most a frequency at the higher edge of the first band. Accordingly, a great ripple of more than 5 dB in the wide passband of a filter that is the third band can be decreased to 5 dB or lower.

According to the configuration of filter device 10F according to this example, for both of a filter having a relatively wide passband that includes the first band (or the first-a band) and the second band (or the second-a band), and a multiplexer that multiplexes or demultiplexes a relatively narrow passband that is the first band (or the first-a band) and a relatively narrow passband that is the second band (or the second-a band), a ripple in the wide passband (third band) can be decreased while changing the passbands.

Figure 21B:
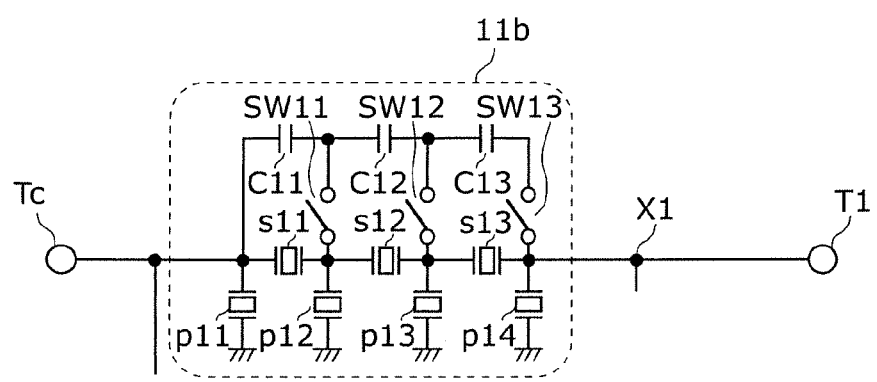
FIG. 21B illustrates a circuit configuration showing a variation of a first filter according to Example 5.

Note that filter 11a of filter device 10F according to Example 5 may be filter 11b illustrated in FIG. 21B. Filter 11b includes series-arm resonators s11, s12, and s13 disposed on the path that connects common terminal Tc and node X1, parallel-arm resonators p11, p12, p13, and p14 each disposed between the ground and a node on the path that connects common terminal Tc and node X1, switches SW11, SW12 and SW13, and capacitors C11, C12, and C13. Filter 11b is different from filter 11a only in the connection configuration of switches SW11, SW12, and SW13, and capacitors C11, C12, and C13. The following describes filter 11b, focusing only on different points from filter 11a.

One terminal of capacitor C11 is connected to the connection node of series-arm resonator s11 and common terminal Tc, and switch SW11 is connected between the other terminal of capacitor C11 and the connection node of series-arm resonators s11 and s12.

One terminal of capacitor C12 is connected to the other terminal of capacitor C11, and switch SW12 is connected between the other terminal of capacitor C12 and the connection node of series-arm resonators s12 and s13.

One terminal of capacitor C13 is connected to the other terminal of capacitor C12, and switch SW13 is connected between the other terminal of capacitor C13 and the connection node of series-arm resonator s13 and node X1.

Similar advantageous effects can be achieved even if filter 11b having the above connection configuration is disposed instead of filter 11a in filter device 10F according to Example 5. Furthermore, filter device 10F in which filter 11b is disposed includes fewer connection nodes than filter device 10F in which filter 11a is disposed, and thus is advantageous to reduction in size.

Note that in this example, the frequency-tunable function is added to the first filter (filter 11a), yet at least one of the first filter (filter 11a) or the second filter (filter 12e) may have the frequency-tunable function.

FIGS. 23A to 23D and 24A to 24F illustrate variations of a unit circuit that includes one series-arm circuit and one parallel-arm circuit connected to the series-arm circuit, and is included in each of filters 11a and 11e in filter device 10F according to this example.

Figure 23A:
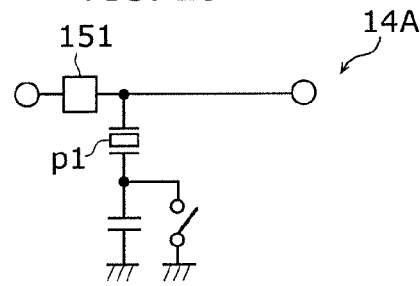
FIG. 23A illustrates a circuit configuration of Variation 6 of filters included in the filter device according to Example 5.

FIG. 23A illustrates a circuit configuration of Variation 6 of filters included in filter device 10F according to Example 5. Filter 14A illustrated in FIG. 23A includes series-arm circuit 151 and a parallel-arm circuit. The parallel-arm circuit includes parallel-arm resonator p1 and an impedance circuit that are connected in series to each other. The impedance circuit includes a switch and a capacitor connected in parallel to each other. The resonant frequency of the parallel-arm circuit is switched to another frequency by switching between on and off of the switch.

Figure 23B:
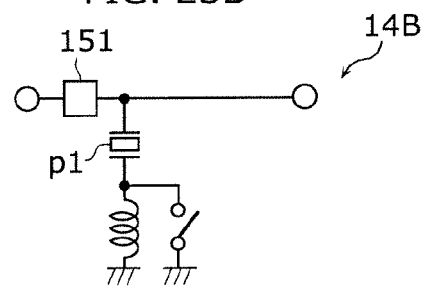
FIG. 23B illustrates a circuit configuration of Variation 7 of filters included in the filter device according to Example 5.

FIG. 23B illustrates a circuit configuration of Variation 7 of filters included in filter device 10F according to Example 5. Filter 14B illustrated in FIG. 23B includes series-arm circuit 151 and a parallel-arm circuit. The parallel-arm circuit includes parallel-arm resonator p1 and an impedance circuit that are connected in series to each other. The impedance circuit includes a switch and an inductor connected in parallel to each other. The resonant frequency of the parallel-arm circuit is switched to another frequency by switching between on and off of the switch.

Figure 23C:
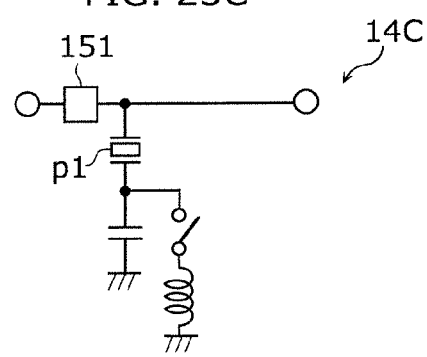
FIG. 23C illustrates a circuit configuration of Variation 8 of filters included in the filter device according to Example 5.

FIG. 23C illustrates a circuit configuration of Variation 8 of filters included in filter device 10F according to Example 5. Filter 14C illustrated in FIG. 23C includes series-arm circuit 151 and a parallel-arm circuit. The parallel-arm circuit includes parallel-arm resonator p1 and an impedance circuit that are connected in series to each other. The impedance circuit includes a series circuit in which a switch and an inductor are connected in series, and a capacitor connected in parallel to the series circuit. The resonant frequency of the parallel-arm circuit is switched to another frequency by switching between on and off of the switch.

Figure 23D:
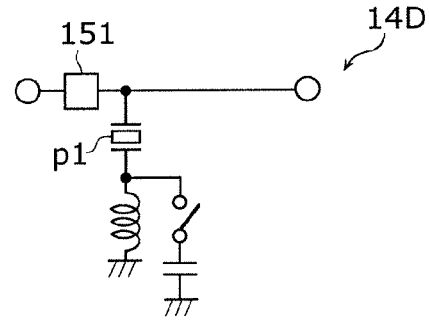
FIG. 23D illustrates a circuit configuration of Variation 9 of filters included in the filter device according to Example 5.

FIG. 23D illustrates a circuit configuration of Variation 9 of filters included in filter device 10F according to Example 5. Filter 14D illustrated in FIG. 23D includes series-arm circuit 151 and a parallel-arm circuit. The parallel-arm circuit includes parallel-arm resonator p1 and an impedance circuit that are connected in series to each other. The impedance circuit includes a series circuit in which a switch and a capacitor are connected in series, and an inductor connected in parallel to the series circuit. The resonant frequency of the parallel-arm circuit is switched to another frequency by switching between on and off of the switch.

Figure 24A:
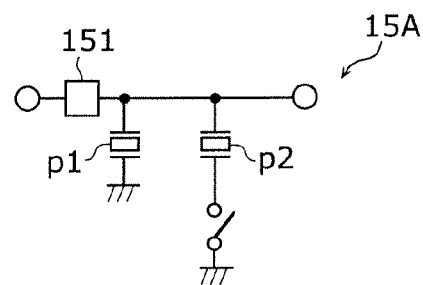
FIG. 24A illustrates a circuit configuration of Variation 10 of filters included in the filter device according to Example 5.

FIG. 24A illustrates a circuit configuration of Variation 10 of filters included in filter device 10F according to Example 5. Filter 15A illustrated in FIG. 24A includes series-arm circuit 151 and a parallel-arm circuit. The parallel-arm circuit includes parallel-arm resonator p1, and parallel-arm resonator p2 and a switch connected in series to each other. The resonant frequency of parallel-arm resonator p1 is set to a frequency lower than the resonant frequency of parallel-arm resonator p2, and the antiresonant frequency of parallel-arm resonator p1 is set to a frequency lower than the antiresonant frequency of parallel-arm resonator p2. At least one of the resonant frequency or the antiresonant frequency of the parallel-arm circuit is switched to another frequency by switching between on and off of the switch.

Figure 24B:
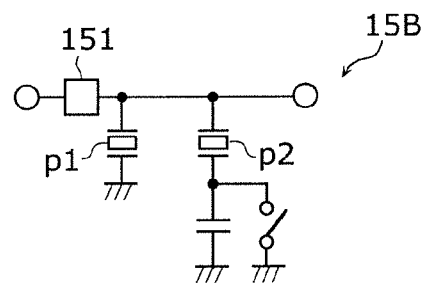
FIG. 24B illustrates a circuit configuration of Variation 11 of filters included in the filter device according to Example 5.

FIG. 24B illustrates a circuit configuration of Variation 11 of filters included in filter device 10F according to Example 5. Filter 15B illustrated in FIG. 24B includes series-arm circuit 151 and a parallel-arm circuit. The parallel-arm circuit includes parallel-arm resonator p1, and parallel-arm resonator p2 and an impedance circuit connected in series to each other. The resonant frequency of parallel-arm resonator p1 is different from the resonant frequency of parallel-arm resonator p2, and the antiresonant frequency of parallel-arm resonator p1 is different from the antiresonant frequency of parallel-arm resonator p2. The impedance circuit includes a switch and a capacitor connected in parallel to each other. The parallel-arm circuit has two resonant frequencies and two antiresonant frequencies, and at least one of the resonant frequencies of the parallel-arm circuit and at least one of the antiresonant frequencies of the parallel-arm circuit are both switched to other frequencies by switching between the conducting and non-conducting states of the switch.

Figure 24C:
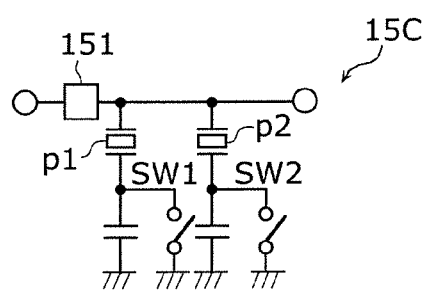
FIG. 24C illustrates a circuit configuration of Variation 12 of filters included in the filter device according to Example 5.

FIG. 24C illustrates a circuit configuration of Variation 12 of filters included in filter device 10F according to Example 5. Filter 15C illustrated in FIG. 24C includes series-arm circuit 151 and a parallel-arm circuit. The parallel-arm circuit includes parallel-arm resonator p1 and a first impedance circuit connected in series to each other, and parallel-arm resonator p2 and a second impedance circuit connected in series to each other. The resonant frequency of parallel-arm resonator p1 is different from the resonant frequency of parallel-arm resonator p2, and the antiresonant frequency of parallel-arm resonator p1 is different from the antiresonant frequency of parallel-arm resonator p2. The first impedance circuit includes switch SW1 and a capacitor connected in parallel to each other. The second impedance circuit includes switch SW2 and a capacitor connected in parallel to each other. The parallel-arm circuit has two resonant frequencies and two antiresonant frequencies, and at least one of the resonant frequencies of the parallel-arm circuit and at least one of the antiresonant frequencies of the parallel-arm circuit are both switched to other frequencies by switching between on and off of the switches.

Figure 24D:
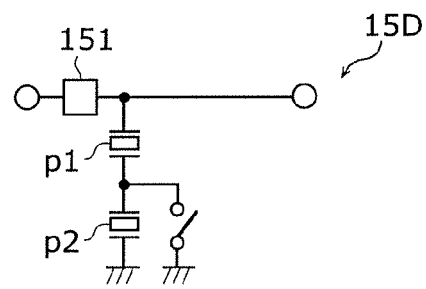
FIG. 24D illustrates a circuit configuration of Variation 13 of filters included in the filter device according to Example 5.

FIG. 24D illustrates a circuit configuration of Variation 13 of filters included in filter device 10F according to Example 5. Filter 15D illustrated in FIG. 24D includes series-arm circuit 151 and a parallel-arm circuit. The parallel-arm circuit includes parallel-arm resonator p1 and an impedance circuit that are connected in series to each other. The impedance circuit includes switch SW1 and parallel-arm resonator p2 connected in parallel to each other. The resonant frequency of parallel-arm resonator p1 is different from the resonant frequency of parallel-arm resonator p2, and the antiresonant frequency of parallel-arm resonator p1 is different from the antiresonant frequency of parallel-arm resonator p2. The frequencies and the numbers of the resonance point and the antiresonance point of the parallel-arm circuit are changed by switching between on and off of the switch.

Figure 24E:
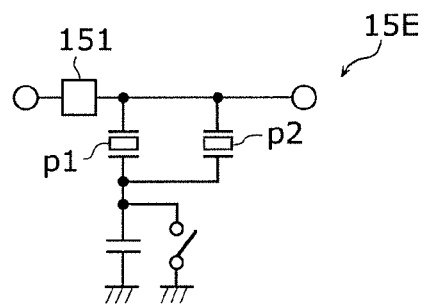
FIG. 24E illustrates a circuit configuration of Variation 14 of filters included in the filter device according to Example 5.

FIG. 24E illustrates a circuit configuration of Variation 14 of filters included in filter device 10F according to Example 5. Filter 15E illustrated in FIG. 24E includes series-arm circuit 151 and a parallel-arm circuit. The parallel-arm circuit has a configuration in which a circuit constituted by parallel-arm resonators p1 and p2 connected in parallel and an impedance circuit are connected in series. The resonant frequency of parallel-arm resonator p1 is set to a frequency lower than the resonant frequency of parallel-arm resonator p2, and the antiresonant frequency of parallel-arm resonator p1 is set to a frequency lower than the antiresonant frequency of parallel-arm resonator p2. The impedance circuit includes switch SW1 and a capacitor connected in parallel to each other. The parallel-arm circuit has two resonant frequencies and two antiresonant frequencies, and the two resonant frequencies of the parallel-arm circuit are switched by switching between on and off of the switch.

Figure 24F:
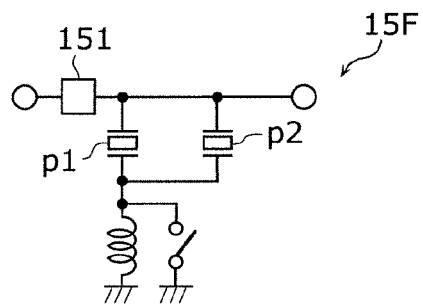
FIG. 24F illustrates a circuit configuration of Variation 15 of filters included in the filter device according to Example 5.

FIG. 24F illustrates a circuit configuration of Variation 15 of filters included in filter device 10F according to Example 5. Filter 15F illustrated in FIG. 24F includes series-arm circuit 151 and a parallel-arm circuit. The parallel-arm circuit has a configuration in which a circuit constituted by parallel-arm resonators p1 and p2 connected in parallel and an impedance circuit are connected in series. The resonant frequency of parallel-arm resonator p1 is set to a frequency lower than the resonant frequency of parallel-arm resonator p2, and the antiresonant frequency of parallel-arm resonator p1 is set to a frequency lower than the antiresonant frequency of parallel-arm resonator p2. The impedance circuit includes switch SW1 and an inductor connected in parallel to each other. The parallel-arm circuit has two resonant frequencies and two antiresonant frequencies, and the two resonant frequencies of the parallel-arm circuit are switched by switching between on and off of the switch.

1.9 Mount Structure of Filter Device According to Example 5

Figure 25:
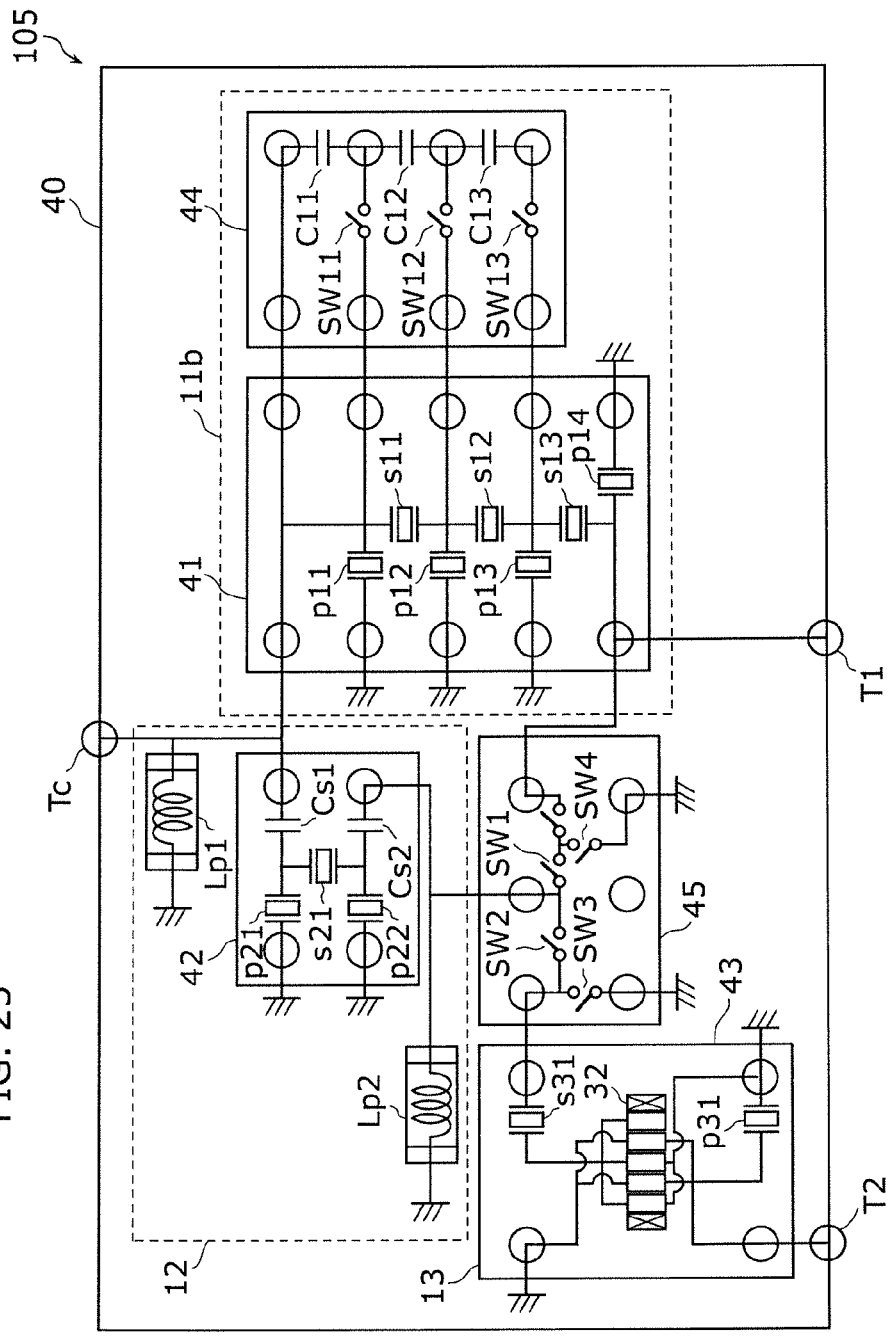
FIG. 25 illustrates a mount configuration of the filter device according to Example 5.

FIG. 25 illustrates a mount configuration of filter device 10F according to Example 5. Note that the mount configuration illustrated in FIG. 25 shows that filter 11b according to the variation is disposed, instead of filter 11a included in filter device 10F. As illustrated in FIG. 25, in this example, series-arm resonators s11 to s13 and parallel-arm resonators p11 to p14 are included in one package 41 (chip) for resonators. Series-arm resonator s21, parallel-arm resonators p21 and p22, and capacitors Cs1 and Cs2 are included in one package 42 (chip) for resonators. Series-arm resonator s31, parallel-arm resonator p31, and longitudinally coupled resonator 32 are included in one package 43 (chip) for resonators. Switches SW11 to SW13 and capacitors C11 to C13 are included in package 44 for switches. Switches SW1 to SW4 are included in package 45 for switches. Packages 41 to 45 and inductors Lp1 and Lp2 are mounted on wiring board 40. Thus, the resonators and the switches are formed in different packages.

Packages 41 to 45 include, on the bottom surfaces, surface electrodes for mounting packages 41 to 45 onto wiring board 40 (the round marks in FIG. 25, which are also referred to as "lands" or "pads"). Note that FIG. 25 schematically illustrates circuit elements and lines included in the packages, and illustrates the surface electrodes on the bottom surfaces of packages 41 to 45 as if packages 41 to 45 were transparent, in order to simplify the description.

Wiring board 40 includes external connection electrodes that include common terminal Tc and input/output terminals T1 and T2. The external connection electrodes are, for example, connectors that connect the surface electrodes for mounting wiring board 40 onto, for instance, a mother board, wiring board 40, and other electronic components.

Note that switches SW11 to SW13 and SW1 to SW4, and capacitors C11 to C13, Cs1, and Cs2 may be packaged in combinations different from the above combinations.

1.10 Filter Device According to Example 6

Figure 26:
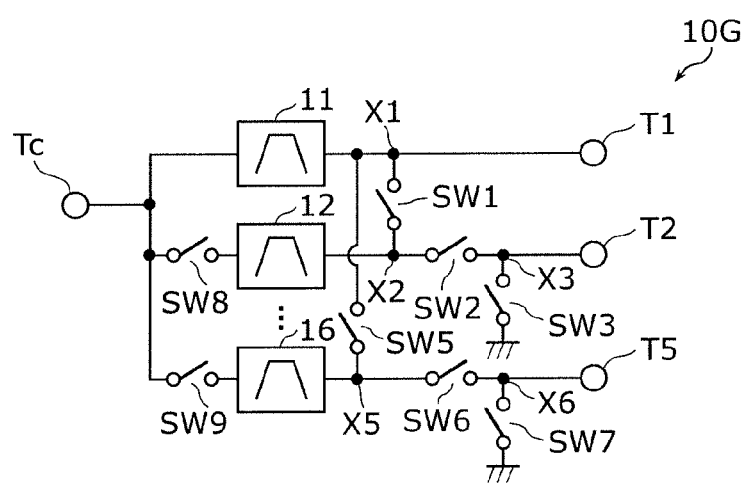
FIG. 26 illustrates a circuit configuration of a filter device according to Example 6.

FIG. 26 illustrates a circuit configuration of filter device 10G according to Example 6. Filter device 10G illustrated in FIG. 26 includes filters 11, 12, and 16, switches SW1, SW2, SW3, SW5, SW6, SW7, SW8, and SW9, common terminal Tc, and input/output terminals T1, T2, and T5. Filter device 10G according to this example is different from filter device 10C according to Example 2 in that a third path on which filter 16 is disposed is added, and switches SW8 and SW9 that switch between the second path and the third path are added. In the following, description of common points of filter device 10G according to this example to those of filter device 10C according to Example 2 is omitted, and different points are mainly described.

Filter 16 is a fourth filter that is connected to the third path that connects common terminal Tc and input/output terminal T5 (fifth input/output terminal), has a different frequency range from the frequency ranges of the first band and the second band, and has a passband that is a fourth band having a frequency range that does not overlap the frequency range of the first band.

Switch SW5 is a fifth switch element that is connected between node X1 and node X5 (fifth node) on the third path between filter 16 and input/output terminal T5. Switch SW6 is a sixth switch element on the third path, which is connected between node X5 and input/output terminal T5. Switch SW7 is connected between the ground and node X6 that is a connection node of switch SW6 and input/output terminal T5. Switch SW8 is a seventh switch element connected between common terminal Tc and filter 12. Switch SW9 is an eighth switch element connected between common terminal Tc and filter 16.

Switches SW6 and SW7 are switched between on and off mutually exclusively from each other.

According to the above configuration, filters 12 and 16 can be selected by switching between on and off of switches SW8 and SW9. Accordingly, a small filter device that switches among (1) to (4) below by switching between on and off of switches SW1, SW2, SW5, SW6, SW8, and SW9 can be provided: (1) a filter having a wide passband that is the third band and formed between common terminal Tc and input/output terminal T1, (2) a filter having a relatively wide passband that includes the first band and the fourth band, and formed between common terminal Tc and input/output terminal T1, (3) a multiplexer that multiplexes or demultiplexes a signal passing through filter 11 having a relatively narrow passband that is the first band and formed between common terminal Tc and input/output terminal T1, and a signal passing through filter 12 having a relatively narrow passband that is the second band and formed between common terminal Tc and input/output terminal T2, and (4) a multiplexer that multiplexes or demultiplexes a signal passing through filter 11 having a relatively narrow passband that is the first band and formed between common terminal Tc and input/output terminal T1, and a signal passing through filter 16 having a relatively narrow passband that is the fourth band and formed between common terminal Tc and input/output terminal T5.

Note that in this example, the configuration includes a single second path and a single third path, but may further include a path having a passband whose frequency range is different from the frequency ranges of the first band and the second band, and does not overlap the frequency range of the first band.

1.11 Configuration of Filter Device 10H According to Examples 1a to 1e

Figure 27:
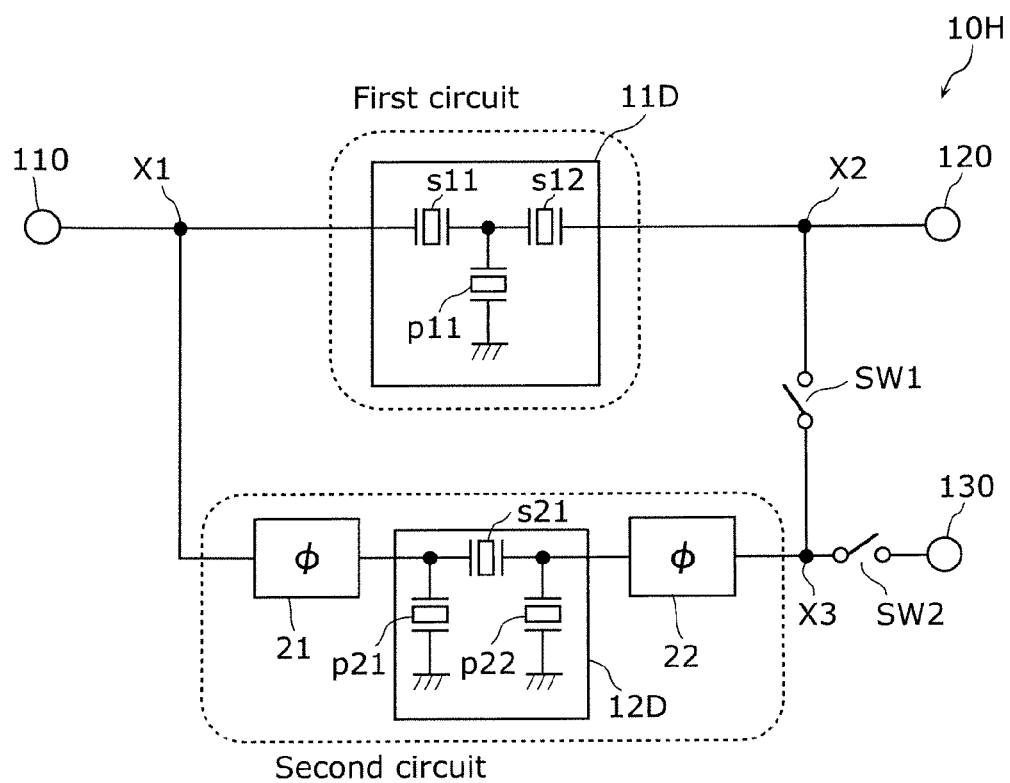
FIG. 27 illustrates a circuit configuration of a radio frequency filter according to Examples 1a, 1b, 1c, 1d, and 1e.

FIG. 27 illustrates a circuit configuration of filter device 10H according to Examples 1a, 1b, 1c, 1d, and 1e. Filter device 10H illustrated in FIG. 27 includes a first circuit, a second circuit, common terminal 110, input/output terminals 120 and 130, and switches SW1 and SW2. Filter device 10H is an example of a specific circuit configuration of filter device 10A according to Example 1, the first circuit is an example of a specific circuit configuration of filter 11, and the second circuit is a specific example of a circuit configuration of filter 12.

The first circuit includes filter 11D. Filter 11D includes series-arm resonators s11 and s12 disposed on a first path that connects nodes X1 and X2, and parallel-arm resonator p11 disposed between the ground and a node on a path that connects series-arm resonators s11 and s12. Accordingly, this makes filter 11D a ladder bandpass filter.

The second circuit includes filter 12D, and phase shifters 21 and 22. Filter 12D includes series-arm resonator s21 disposed on a second path that connects nodes X1 and X3, and parallel-arm resonators p21 and p22 each disposed between a node on the second path and the ground. Accordingly, this makes filter 12D a ladder bandpass filter.

Phase shifter 21 is a first phase shifter connected to one terminal of filter 12D. Phase shifter 22 is a second phase shifter connected to the other terminal of filter 12D. Specifically, phase shifter 21, filter 12D, and phase shifter 22 are connected in series in this order between nodes X1 and X2.

Switch SW1 is a first switch element connected between node X2 and node X3. Switch SW2 is a second switch element connected between node X3 and input/output terminal 130. Node X2 is a first node on the first path, between filter 11D and input/output terminal 120, and node X3 is a second node on the second path, between filter 12D and input/output terminal 130.

When switch SW1 is on and switch SW2 is off, filter device 10H forms a filter that has the relatively wide third band that includes the first band and the second band, between common terminal 110 and input/output terminal 120. On the other hand, when switch SW1 is off and switch SW2 is on, filter device 10H forms a duplexer (multiplexer) in which the first circuit having a relatively narrow passband that is the first band between common terminal 110 and input/output terminal 120 is connected, via common terminal 110, to the second circuit having a relatively narrow passband that is the second band between common terminal 110 and input/output terminal 130.

Thus, a small filter device that switches between (1) and (2) below by switching between on and off of switches SW1 and SW2 can be provided: (1) a filter having a relatively wide passband (third band) that includes the first band and the second band, and formed between common terminal 110 and input/output terminal 120, and (2) a multiplexer that multiplexes or demultiplexes a signal passing through the first circuit (filter 11D) having a relatively narrow passband that is the first band and formed between common terminal 110 and input/output terminal 120, and a signal passing through the second circuit (phase shifter 21+filter 12D+ phase shifter 22) having a relatively narrow passband that is the second band and formed between common terminal 110 and input/output terminal 130.

As described above, the filter as in (1) and the multiplexer as in (2) are switched by switching between on and off of switches SW1 and SW2 mutually exclusively from each other.

This example describes a relation between the I-R pitch and a filter having a wide passband that is the third band when switch SW1 is on and switch SW2 is off.

In the following, the structure of each resonator included in filter device 10H is described in more detail, focusing on parallel-arm resonator p11. Note that the other resonators have substantially the same structure as that of parallel-arm resonator p11 except that the I-R pitch is about 0.5 times wavelength λ of an acoustic wave, and thus a detailed description thereof is omitted.

Figure 28:
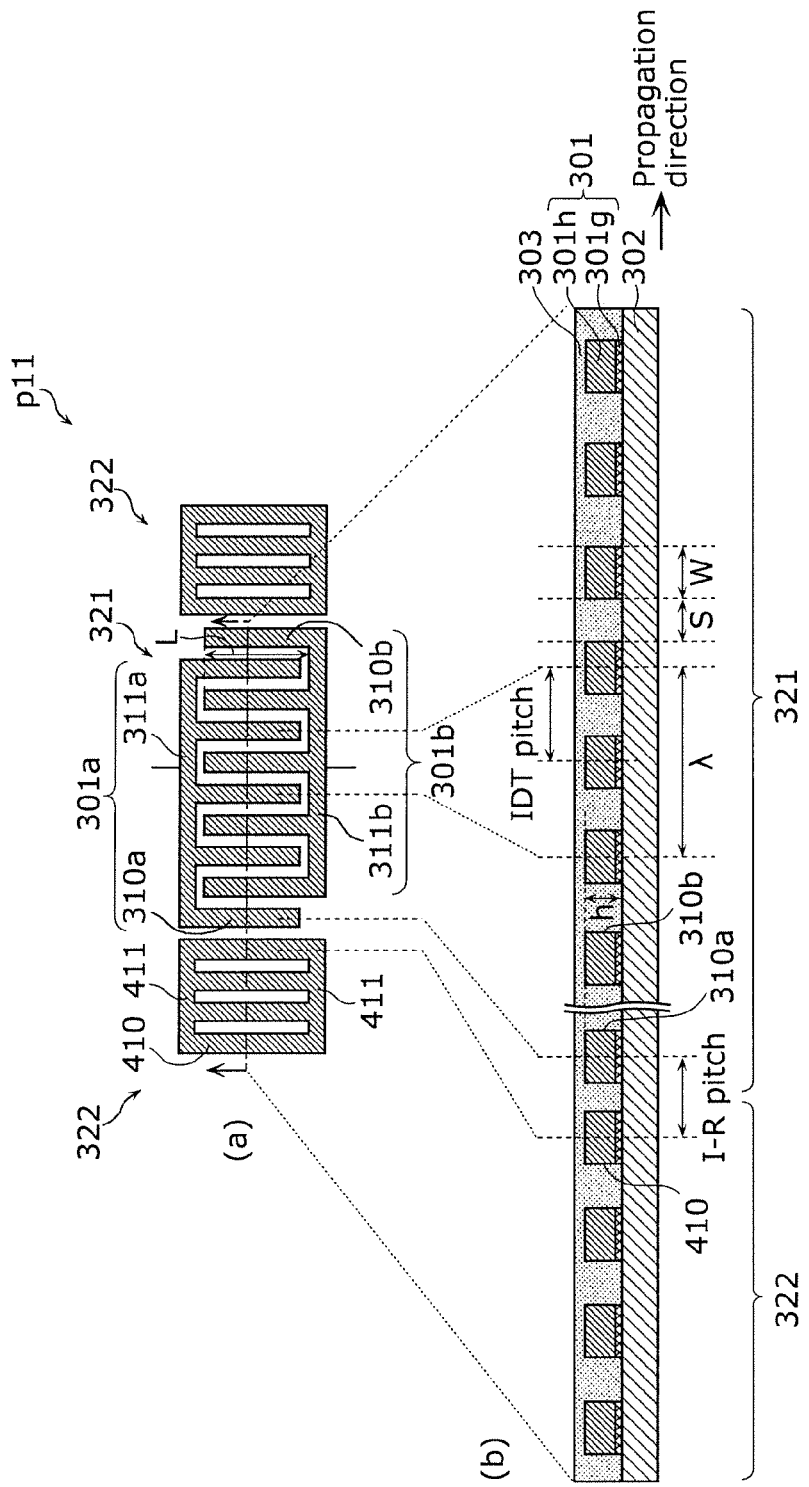
FIG. 28 schematically illustrates an example of a structure of a parallel-arm resonator in Embodiment 1.

FIG. 28 illustrates an example of a drawing schematically showing the structure of parallel-arm resonator p11 in Embodiment 1, where (a) is a plan view and (b) is a cross-sectional view of (a). Note that parallel-arm resonator p11 illustrated in FIG. 28 is for describing a typical structure of the resonators included in filter device 10H. Accordingly, the number and the length of electrode fingers included in an interdigital transducer (IDT) electrode of each resonator in filter 10H, for instance, are not limited to the number and the length of electrode fingers of the IDT electrode illustrated in FIG. 28.

As illustrated in (a) and (b) of FIG. 28, parallel-arm resonator p11 includes electrode film 301 included in IDT electrode 321 and reflectors 322, piezoelectric substrate 302 on which electrode film 301 is formed, and protective layer 303 that covers electrode film 301. The following describes in detail these elements.

As illustrated in (a) of FIG. 28, a pair of comb-shaped electrodes 301a and 301b facing each other and included in IDT electrode 321 are formed on piezoelectric substrate 302. Comb-shaped electrode 301a includes electrode fingers 310a parallel to each other, and bus bar electrode 311a that connects electrode fingers 310a. Comb-shaped electrode 301b includes electrode fingers 310b parallel to each other, and bus bar electrode 311b that connects electrode fingers 310b. Electrode fingers 310a and 310b are formed in the direction orthogonal to the direction in which acoustic waves propagate, and cyclically formed in the propagation direction.

IDT electrode 321 having such a configuration excites surface acoustic waves in a specific frequency region determined by the electrode pitch of electrode fingers 310a and 310b included in IDT electrode 321.

Note that comb-shaped electrodes 301a and 301b may each be referred to as an IDT electrode. Note that the following gives description assuming that, for convenience, one IDT electrode 321 includes one pair of comb-shaped electrodes 301a and 301b.

Reflectors 322 are disposed adjacent to IDT electrode 321 in the direction in which acoustic waves propagate. Specifically, a pair of reflectors 322 are disposed at the sides of IDT electrode 321 in the direction in which acoustic waves propagate. Reflectors 322 each include electrode fingers 410 parallel to each other, and a pair of bus bar electrodes 411 consisting of bus bar electrode 411 that connects ends of electrode fingers 410 on one side, and bus bar electrode 411 that connects ends of electrode fingers 410 on the other side. Electrode fingers 410 are formed in the direction orthogonal to the direction in which acoustic waves propagate, and are cyclically formed in the propagating direction, similarly to electrode fingers 310a and 310b included in IDT electrode 321.

Reflectors 322 having such a configuration reflect surface acoustic waves with a high reflection coefficient in a frequency band (stopband) determined by, for example, the electrode pitch of electrode fingers 410 included in reflectors 322. Thus, when the electrode pitch of IDT electrode 321 and the electrode pitch of each reflector 322 are equal, reflector 322 reflects surface acoustic waves excited by IDT electrode 321 with a high reflection coefficient.

Since such reflectors 322 are included, parallel-arm resonator p11 can keep the excited surface acoustic waves inside, and reduces leakage of the waves to the outside. Accordingly, parallel-arm resonator p11 can improve Q at a resonance point and an antiresonance point determined by, for instance, an electrode pitch, a pair count, a cross width of IDT electrode 321.

Note that it is sufficient if reflectors 322 include electrode fingers 410, and thus reflectors 322 may not have bus bar electrodes 411. The number of electrode fingers 410 may be at least one, and is not limited in particular. Note that if there are too few electrode fingers 410, leakage of acoustic waves increases, and thus filter characteristics may deteriorate. On the other hand, if there are too many electrode fingers 410, the size of reflectors 322 is increased, and thus the entire size of filter device 10H may be increased. Accordingly, the number of electrode fingers 410 may be determined as appropriate, taking into consideration filter characteristics and the size, for instance, that filter device 10H is to have.

Such IDT electrode 321 and reflectors 322 are included in electrode film 301 illustrated in (b) of FIG. 28. In this example, electrode film 301 has a structure in which adhesive layer 301g and main electrode layer 301h are stacked, as illustrated in (b) of FIG. 28. Note that in this example, IDT electrode 321 and reflectors 322 are included in single electrode film 301, but may be included in electrode films having different structures and different compositions.

Adhesive layer 301g is for improving the adhesion of piezoelectric substrate 302 and main electrode layer 301h, and Ti is used as a material, for example. The thickness of adhesive layer 301g is 12 nm, for example.

The material of main electrode layer 301h is Al that contains 1% of Cu, for example. The thickness of main electrode layer 301h is 162 nm, for example.

Piezoelectric substrate 302 is a substrate on which electrode film 301 (namely, IDT electrode 321 and reflectors 322) is formed, and is made of, for example, a $LiTaO_3$ piezoelectric single crystal, a $LiNbO_3$ piezoelectric single crystal, a $KNbO_3$ piezoelectric single crystal, a quartz crystal, or piezoelectric ceramics.

Protective layer 303 is formed so as to cover comb-shaped electrodes 301a and 301b. Protective layer 303 is intended to, for instance, protect main electrode layer 301h from the outside environment, adjust frequency temperature characteristics, and improve moisture-resistant properties, and is a film that contains silicon dioxide as a principal component, for example.

Note that the structure of each resonator included in filter device 10H is not limited to the structure illustrated in FIG. 28. For example, electrode film 301 may be a metal single layer, rather than metal films having a stacked structure. The materials of adhesive layer 301g, main electrode layer 301h, and protective layer 303 are not limited to the above stated materials. Electrode film 301 may include metal such as, for example, Ti, Al, Cu, Pt, Au, Ag, or Pd or an alloy of such metals, or may have a structure in which a plurality of layers made of such metals or an alloy of such metals are stacked. Protective layer 303 may not be formed.

In parallel-arm resonator p11 having such a configuration, the design parameter of IDT electrode 321, for instance, determines the wavelength of acoustic waves to be excited. The following describes the design parameters of IDT electrode 321, namely the design parameters of comb-shaped electrode 301a and comb-shaped electrode 301b.

The wavelength of acoustic waves is determined by repeating cycle λ of electrode fingers 310a included in comb-shaped electrode 301a or electrode fingers 310b included in comb-shaped electrode 301b illustrated in FIG. 28. The electrode pitch (cyclic pattern) is ½ of repeating cycle λ, and is defined to be (W+S), where W denotes the line width of electrode fingers 310a and 310b included in comb-shaped electrodes 301a and 301b, and S denotes the space width between adjacent electrode fingers 310a and adjacent electrode fingers 310b. Cross width L of IDT electrode 321 is the length of overlapping electrodes when electrode fingers 310a of comb-shaped electrode 301a and electrode fingers 310b of comb-shaped electrode 301b are viewed in the direction in which acoustic waves propagate, as illustrated in (a) of FIG. 28. The electrode duty cycle (duty cycle) indicates a percentage made up by the line width of each of electrode fingers 310a and 310b, that is, a proportion of the line width to a value obtained by adding a line width of each of electrode fingers 310a and 310b to a space width, and thus is defined to be W/(W+S). The pair count is the number of electrode fingers 310a and 310b that are paired within comb-shaped electrodes 301a and 301b, and is substantially half the total number of electrode fingers 310a and 310b. For example, M=2N+1 is satisfied, where N denotes the pair count, and M denotes a total number of electrode fingers 310a and 310b. The thickness of IDT electrode 321 indicates thickness h of electrode fingers 310a and 310b.

Next, the design parameter of reflectors 322 is to be described.

The electrode pitch (cyclic pattern) of reflectors 322 is defined to be ($W_{REF}+S_{REF}$), where $W_{REF}$ denotes the line width of electrode finger 410, and $S_{REF}$ denotes the space width between adjacent electrode fingers 410. The electrode duty cycle (duty cycle) of reflectors 322 indicates a percentage made up by the line width of each of electrode fingers 410, that is, a proportion of the line width to a value obtained by adding a line width of each of electrode fingers 410 to a space width, and thus is defined to be REF $W_{REF}/(W_{REF}+S_{REF})$. The thickness of reflectors 322 is the thickness of electrode fingers 410.

In this example, the electrode pitch and the electrode duty cycle of reflectors 322 is equivalent to the electrode pitch and the electrode duty cycle of IDT electrode 321. In each reflector 322, the pair of bus bar electrodes 411 are disposed so as to overlap bus bar electrodes 311a and 311b of IDT electrode 321 when viewed in the direction in which acoustic waves propagate.

Note that reflectors 322 preferably have the above configuration from the viewpoint of reducing leakage of acoustic waves, but may have a configuration different from the above configuration.

Next, the design parameter regarding relative arrangement of IDT electrode 321 and reflectors 322 is to be described.

The pitch (I-R pitch) between IDT electrode 321 and each reflector 322 is defined by the center-to-center distance between (i) an electrode finger closest to reflector 322 out of electrode fingers 310a and 310b included in IDT electrode 321 and (ii) electrode finger 410 closest to IDT electrode 321 out of electrode fingers 410 included in reflector 322. This I-R pitch can be expressed using repeating cycle λ of electrode fingers 310a included in comb-shaped electrode 301a or electrode fingers 310b included in comb-shaped electrode 301b (that is, wavelength λ of acoustic waves determined by the electrode pitch of IDT electrode 321) and, for example, when the pitch is 0.50 times repeating cycle λ, the pitch is expressed as 0.50λ.

Filter device 10H according to this example includes filters 11D and 12D. Filter 11D includes a first series-arm circuit (series-arm resonator s11 or s12) disposed on a first path that connects nodes X1 and X2, and a first parallel-arm circuit (parallel-arm resonator p11) connected to the ground and a node disposed on the first path. Filter 12D includes a second series-arm circuit (series-arm resonator s21) disposed on a second path that connects phase shifters 21 and 22, and a second parallel-arm circuit (parallel-arm resonator p21 or p22) connected to the ground and a node disposed on the second path. One or more of the first series-arm circuit, the first parallel-arm circuit, the second series-arm circuit, and the second parallel-arm circuit include one or more acoustic wave resonators, and at least one of the one or more acoustic wave resonators includes an IDT electrode formed on a piezoelectric substrate, and a reflector. Here, when λ denotes a wavelength of acoustic waves determined by a cyclic pattern of the IDT electrode in the at least one of the one or more acoustic wave resonators, a pitch between the IDT electrode and the reflector is desirably at least 0.42λ and less than 0.50λ.

As described above, an acoustic wave resonator that includes IDT electrode 321 and reflectors 322 has a cyclic structure that includes electrode fingers cyclically arranged, and has a frequency band in which surface acoustic waves each having a frequency in a specific frequency region is reflected with a high reflection coefficient. This frequency band is generally referred to as a stopband, and is defined by the repeating cycle of the cyclic structure, for instance. At this time, a ripple that is a locally increasing reflection coefficient occurs at the higher edge of the stopband. Furthermore, if the pitch (I-R pitch) between IDT electrode 321 and each reflector 322 is set to at least 0.5λ, a ripple at the higher edge of the stopband is increased, a ripple in the passband of the filter is increased, and insertion loss is increased. On the other hand, if the I-R pitch is set to at least 0.42λ and less than 0.50λ, a ripple at the higher edge of the stopband can be decreased. From the above viewpoint, in filters 11D and 12D included in filter device 10H, insertion loss in the passband of filter device 10H having the third band when switch SW1 is on and switch SW2 is off can be further decreased by setting the I-R pitch to at least 0.42λ and less than 0.50λ.

The following describes comparisons between filter device 10H according to Examples 1a to 1d and filter device 10H according to Example 1e.

Note that filter device 10H according to Examples 1a to 1d and filter device 10H according to Example 1e all have the circuit configuration illustrated in FIG. 27, but nevertheless I-R pitches are configured as follows.

(1) Example 1e: The I-R pitch of all the acoustic wave resonators (series-arm resonators s11, s12, and s21, and parallel-arm resonators p11, p21, and p22) is 0.50λ.

(2) Example 1a: The I-R pitch of series-arm resonators s11 and s12 is 0.44λ, and the I-R pitch of the other acoustic wave resonators is 0.50λ.

(3) Example 1b: The I-R pitch of parallel-arm resonator p11 is 0.44λ, and the I-R pitch of the other acoustic wave resonators is 0.50λ.

(4) Example 1c: The I-R pitch of parallel-arm resonators p21 and p22 is 0.44λ, and the I-R pitch of the other acoustic wave resonators is 0.50λ.

(5) Example 1d: The I-R pitch of all the acoustic wave resonators (series-arm resonators s11, s12, and s21, and parallel-arm resonators p11, p21, and p22) is 0.44λ.

Figure 29A:
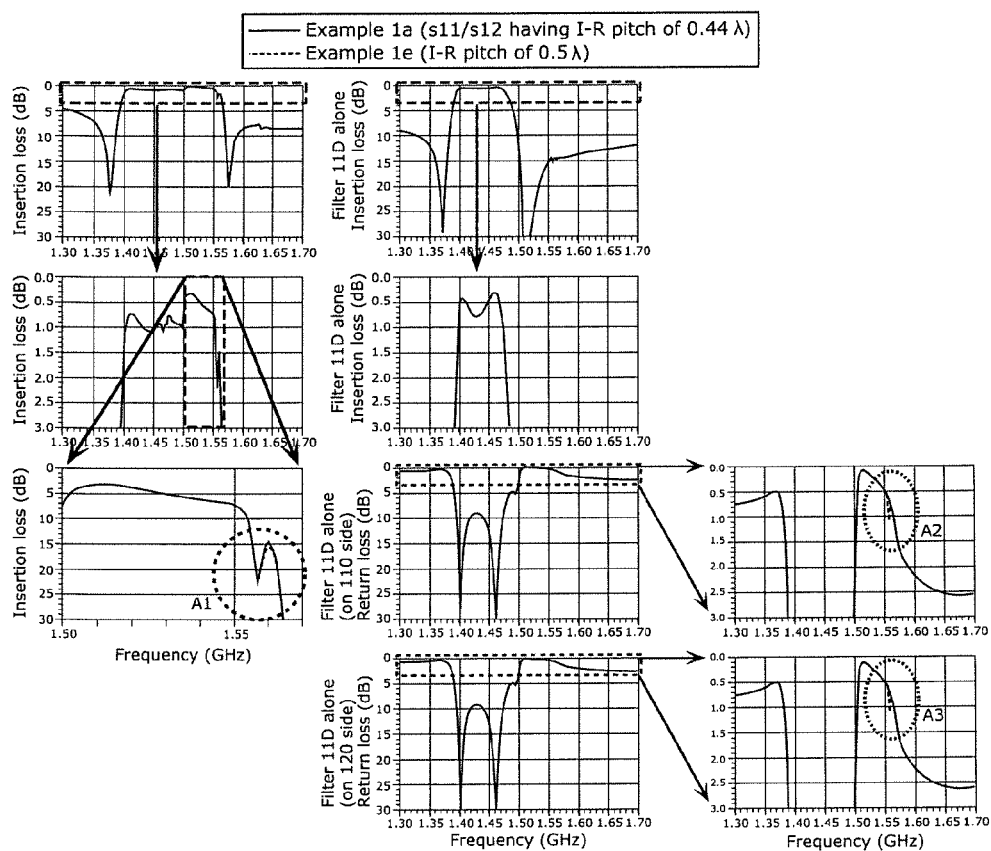
FIG. 29A illustrates graphs showing comparisons of passing characteristics and return characteristics of the radio frequency filter according to Examples 1a and 1e.
Figure 29B:
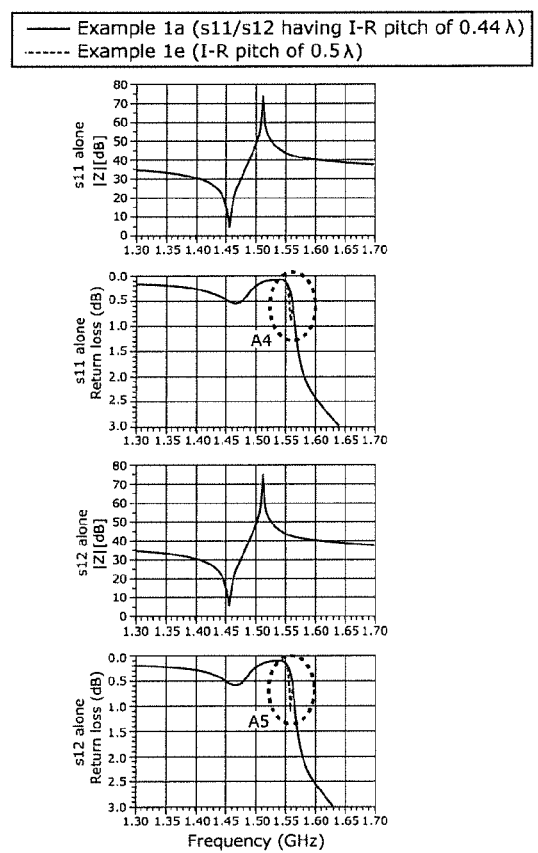
FIG. 29B illustrates graphs showing comparisons of impedance characteristics and return characteristics of series-arm resonators according to Examples 1a and 1e.

1.12 Filter Characteristics of Filter Device 10H According to Examples 1a to 1e FIG. 29A illustrates graphs showing comparisons of passing characteristics and return characteristics of filter device 10H according to Examples 1a and 1e. FIG. 29B illustrates graphs showing comparisons of impedance characteristics and return characteristics of series-arm resonators s11 and s12 alone according to Examples 1a and 1e. Note that the left graphs in FIG. 29A illustrate passing characteristics of filter device 10H according to Examples 1a and 1e (when switch SW1 is on and switch SW2 is off). The center and right graphs in FIG. 29A illustrate passing characteristics and return characteristics of filter 11D alone according to Examples 1a and 1e.

First, as illustrated in FIG. 29B, in series-arm resonators s11 and s12 of the radio frequency filter according to Example 1e, a ripple that is locally increasing return loss occurs at the higher edge of the stopband. In contrast, in series-arm resonators s11 and s12 of filter device 10H according to Example 1a, such a ripple of return loss is decreased at the higher edge of the stopband (regions A4 and A5 in FIG. 29B).

Along with this, as illustrated in the right enlarged graphs in FIG. 29A, a ripple that is locally increasing return loss occurs at the higher edge of the stopband, in filter 11D according to Example 1e. In contrast, such a ripple of return loss is decreased at the higher edge of the stopband (regions A2 and A3 in FIG. 29A), in filter 11D according to Example 1a.

As a result, in filter device 10H according to Example 1e, a ripple that is locally increasing insertion loss occurs at the passband high-frequency edge, as illustrated in the left graphs in FIG. 29A. In contrast, in filter device 10H according to Example 1a, insertion loss is decreased at the passband high-frequency edge (region A1 in FIG. 29A).

As stated above, filter device 10H according to Example 1a includes filters 11D and 12D. Filter 11D includes a first series-arm circuit (series-arm resonator s11 or s12) disposed on the first path that connects nodes X1 and X2, and a first parallel-arm circuit (parallel-arm resonator p11) connected to the ground and a node disposed on the first path. Filter 12D includes a second series-arm circuit (series-arm resonator s21) disposed on the second path that connects phase shifters 21 and 22, and a second parallel-arm circuit (parallel-arm resonator p21 or p22) connected to the ground and a node disposed on the second path. The first series-arm circuit includes an acoustic wave resonator, and the acoustic wave resonator includes an IDT electrode formed on a piezoelectric substrate, and a reflector. Here, the pitch between the IDT electrode and the reflector of the acoustic wave resonator is at least 0.42λ and less than 0.50λ.

Series-arm resonators s11 and s12 in the series-arm circuit of filter 11D each have a resonant frequency in the passband of filter 11D, and an antiresonant frequency in the passband of filter 12D on the passband high-frequency side of filter 11D. Then, the stopbands of series-arm resonators s11 and s12 form a passband of filter 12D. In this configuration, a ripple at the higher edge of the stopband can be decreased by setting the I-R pitch to at least 0.42λ and less than 0.50λ. Accordingly, insertion loss in the passband of filter device 10H (when switch SW1 is on and switch SW2 is off) can be further decreased by setting the I-R pitch to at least 0.42λ and less than 0.50λ.

Figure 30A:
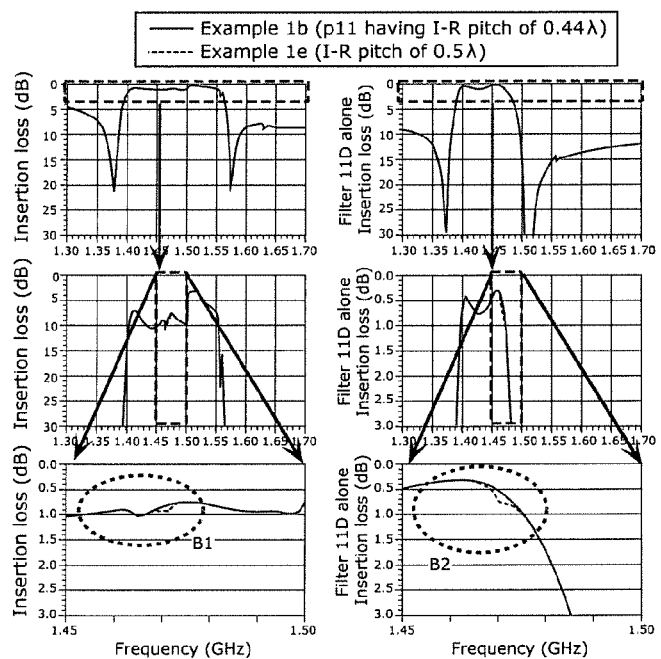
FIG. 30A illustrates graphs showing comparisons of passing characteristics of the radio frequency filter according to Examples 1b and 1e.
Figure 30B:
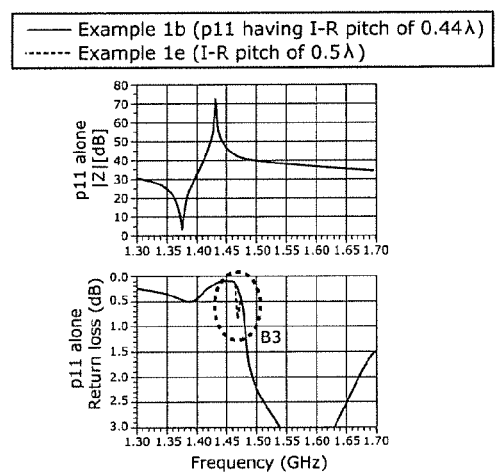
FIG. 30B illustrates graphs showing comparisons of impedance characteristics and return characteristics of the parallel-arm resonator according to Examples 1b and 1e.

FIG. 30A illustrates graphs showing comparisons of passing characteristics of filter device 10H according to Examples 1b and 1e. FIG. 30B illustrates graphs showing comparisons of impedance characteristics and return characteristics of parallel-arm resonator p11 alone according to Examples 1b and 1e. Note that the left graphs in FIG. 30A illustrate passing characteristics of filter device 10H according to Examples 1b and 1e (when switch SW1 is on and switch SW2 is off). The right graphs in FIG. 30A illustrate passing characteristics of filter 11D alone according to Examples 1b and 1e.

First, as illustrated in FIG. 30B, in parallel-arm resonator p11 of filter device 10H according to Example 1e, a ripple that is locally increasing return loss occurs at the higher edge of the stopband. In contrast, in parallel-arm resonator p11 of filter device 10H according to Example 1b, such a ripple of return loss is decreased at the higher edge of the stopband (region B3 in FIG. 30B).

With this, as illustrated in the right graphs in FIG. 30A, in filter 11D according to Example 1e, a ripple that is locally increasing insertion loss occurs in the passband corresponding to the higher edge of the stopband. In contrast, in filter 11D according to Example 1b, such a ripple of insertion loss is decreased in the passband corresponding to the higher edge of the stopband (region B2 in FIG. 30A).

As a result, in filter device 10H according to Example 1e, a ripple that is locally increasing insertion loss occurs in the passband, as illustrated in the left graphs in FIG. 30A. In contrast, in filter device 10H according to Example 1b, insertion loss is decreased in the passband (region B1 in FIG. 30A).

As stated above, filter device 10H according to Example 1b includes filters 11D and 12D. Filter 11D includes a first series-arm circuit (series-arm resonator s11 or s12) disposed on the first path that connects nodes X1 and X2, and a first parallel-arm circuit (parallel-arm resonator p11) connected to the ground and a node disposed on the first path. Filter 12D includes a second series-arm circuit (series-arm resonator s21) disposed on the second path that connects phase shifters 21 and 22, and a second parallel-arm circuit (parallel-arm resonator p21 or p22) connected to the ground and a node disposed on the second path. The first parallel-arm circuit includes an acoustic wave resonator, and the acoustic wave resonator includes an IDT electrode formed on a piezoelectric substrate, and a reflector. Here, the pitch between the IDT electrode and the reflector of the acoustic wave resonator is at least 0.42λ and less than 0.50λ.

Parallel-arm resonator p11 in the parallel-arm circuit of filter 11D has a resonant frequency on the passband low-frequency side of filter 11D, and has an antiresonant frequency in the passband of filter 11D. Then, the stopband of parallel-arm resonator p11 is located in the passband of filter 11D or on the passband high-frequency side of filter 11D. In this configuration, a ripple at the higher edge of the stopband can be decreased by setting the I-R pitch to at least 0.42λ and less than 0.50λ. Accordingly, insertion loss in the passband of filter device 10H (when switch SW1 is on and switch SW2 is off) can be further decreased by setting the I-R pitch to at least 0.42λ and less than 0.50λ.

Figure 31A:
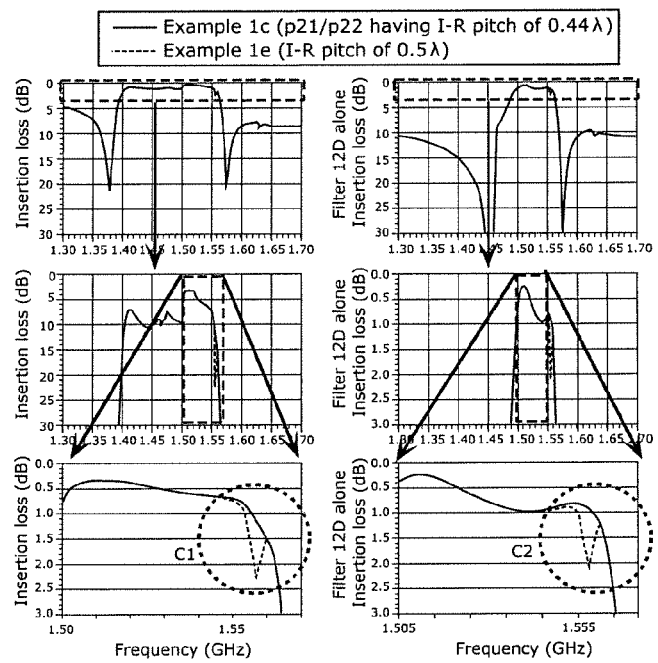
FIG. 31A illustrates graphs showing comparisons of passing characteristics of the radio frequency filter according to Examples 1c and 1e.
Figure 31B:
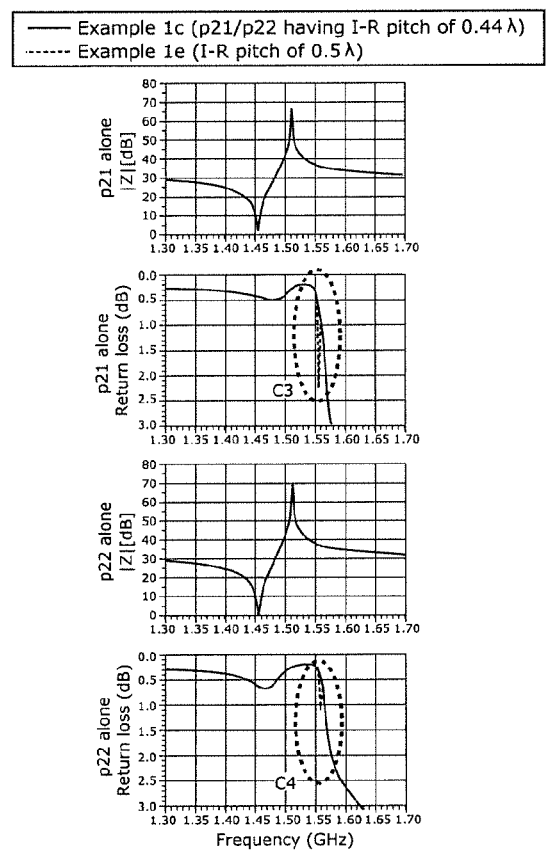
FIG. 31B illustrates graphs showing comparisons of impedance characteristics and return characteristics of parallel-arm resonators according to Examples 1c and 1e.

FIG. 31A illustrates graphs showing comparisons of passing characteristics and return characteristics of filter device 10H according to Examples 1c and 1e. FIG. 31B illustrates graphs showing comparisons of impedance characteristics and return characteristics of parallel-arm resonators p21 and p22 alone according to Examples 1c and 1e. Note that the left graphs in FIG. 31A illustrate passing characteristics of filter device 10H according to Examples 1c and 1e (when switch SW1 is on and switch SW2 is off). The right graphs in FIG. 31A illustrate passing characteristics of filter 12D alone according to Examples 1c and 1e.

First, as illustrated in FIG. 31B, in parallel-arm resonators p21 and p22 of filter device 10H according to Example 1e, a ripple that is locally increasing return loss occurs at the higher edge of the stopband. In contrast, in parallel-arm resonators p21 and p22 of filter device 10H according to Example 1c, such a ripple of return loss is decreased at the higher edge of the stopband (regions C3 and C4 in FIG. 31B).

With this, in filter 12D according to Example 1e, a ripple that is locally increasing insertion loss occurs in the passband corresponding to the higher edge of the stopband, as illustrated in the right graphs in FIG. 31A. In contrast, in filter 12D according to Example 1c, such a ripple of insertion loss is decreased in the passband corresponding to the higher edge of the stopband (region C2 in FIG. 31A).

As a result, in filter device 10H according to Example 1e, a ripple that is locally increasing insertion loss occurs in the passband, as illustrated in the left graphs in FIG. 31A. In contrast, in filter device 10H according to Example 1c, insertion loss is decreased in the passband (region C1 in FIG. 31A).

As stated above, filter device 10H according to Example 1c includes filters 11D and 12D. Filter 11D includes a first series-arm circuit (series-arm resonator s11 or s12) disposed on the first path that connects nodes X1 and X2, and a first parallel-arm circuit (parallel-arm resonator p11) connected to the ground and a node disposed on the first path. Filter 12D includes a second series-arm circuit (series-arm resonator s21) disposed on the second path that connects phase shifters 21 and 22, and a second parallel-arm circuit (parallel-arm resonator p21 or p22) connected to the ground and a node disposed on the second path. The second parallel-arm circuit includes an acoustic wave resonator, and the acoustic wave resonator includes an IDT electrode formed on a piezoelectric substrate, and a reflector. Here, the pitch between the IDT electrode and the reflector of the acoustic wave resonator is at least 0.42λ and less than 0.50λ.

Parallel-arm resonators p21 and p22 in the parallel-arm circuit of filter 12D each have a resonant frequency on the passband low-frequency side of filter 12D, and an antiresonant frequency in the passband of filter 12D. Then, the stopbands of parallel-arm resonators p21 and p22 are located in the passband of filter 12D or on the passband high-frequency side of filter 12D. In this configuration, a ripple at the higher edge of the stopband can be decreased by setting the I-R pitch to at least 0.42λ and less than 0.50λ. Accordingly, insertion loss in the passband of filter device 10H (when switch SW1 is on and switch SW2 is off) can be further decreased by setting the I-R pitch to at least 0.42λ and less than 0.50λ.

Figure 32:
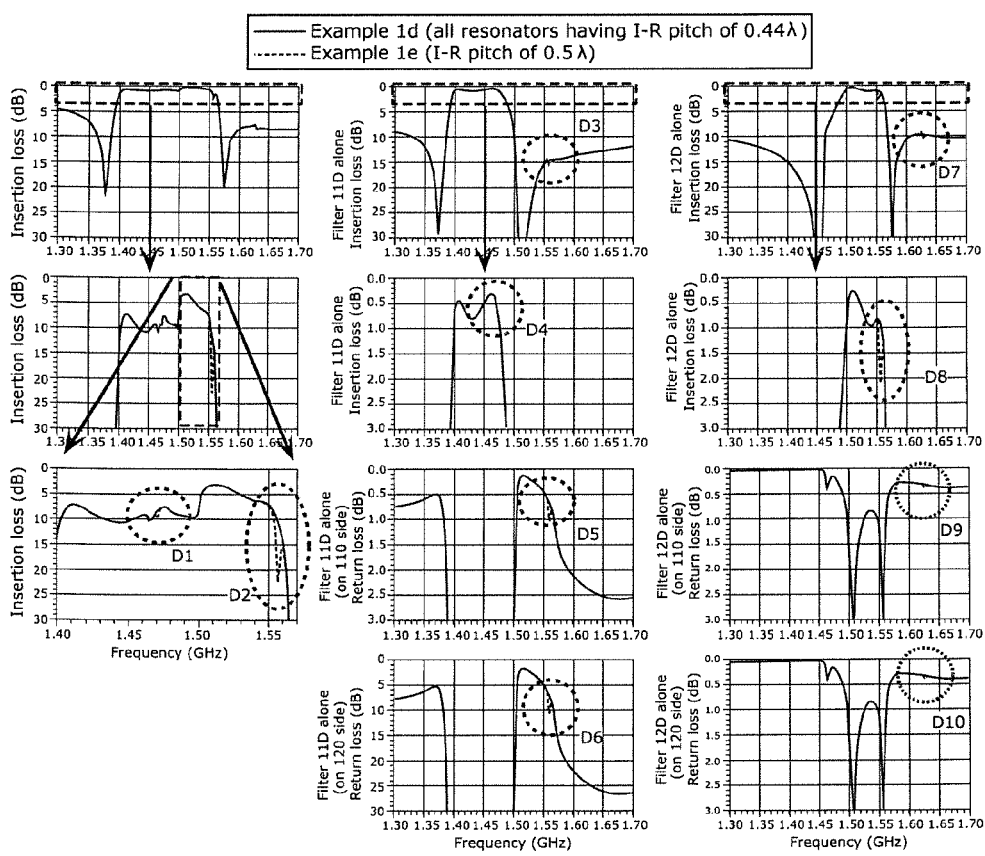
FIG. 32 illustrates graphs showing comparisons of passing characteristics and return characteristics of the radio frequency filter according to Examples 1d and 1e.

FIG. 32 illustrates graphs showing comparisons of passing characteristics and return characteristics of filter device 10H according to Examples 1d and 1e. Note that the left graphs in FIG. 32 illustrate passing characteristics of filter 10H according to Examples 1 and 1e (when switch SW1 is on and switch SW2 is off). The center graphs in FIG. 32 illustrate passing characteristics and return characteristics of filter 11D alone according to Examples 1d and 1e. The right graphs in FIG. 32 illustrate passing characteristics and return characteristics of filter 12D alone according to Examples 1d and 1e.

First, as illustrated in the center graphs in FIG. 32, in the series-arm resonator and the parallel-arm resonator of filter 11D according to Example 1e, a ripple that is locally increasing return loss occurs at the higher edge of the stopband. In contrast, in the series-arm resonator and the parallel-arm resonator of filter device 10H according to Example 1d, such a ripple of return loss is decreased at the higher edge of the stopband (regions D5 and D6 in FIG. 32).

As illustrated in the right graphs in FIG. 32, in the series-arm resonator and the parallel-arm resonator of filter 12D according to Example 1e, a ripple that is locally increasing return loss occurs at the higher edge of the stopband. In contrast, in the series-arm resonator and the parallel-arm resonator of filter device 10H according to Example 1d, such a ripple of return loss is decreased at the higher edge of the stopband (regions D9 and D10 in FIG. 32).

As a result, in filter device 10H according to Example 1e, a ripple that is locally increasing insertion loss occurs in the passband and at the higher edge of the passband, as illustrated in the left graphs in FIG. 32. In contrast, in filter device 10H according to Example 1d, insertion loss is decreased in the passband and at the higher edge of the passband (regions D1 and D2 in FIG. 32).

As stated above, filter device 10H according to Example 1d includes filters 11D and 12D. Filter 11D includes a first series-arm circuit (series-arm resonator s11 or s12) disposed on the first path that connects nodes X1 and X2, and a first parallel-arm circuit (parallel-arm resonator p11) connected to the ground and a node disposed on the first path. Filter 12D includes a second series-arm circuit (series-arm resonator s21) disposed on the second path that connects phase shifters 21 and 22, and a second parallel-arm circuit (parallel-arm resonator p21 or p22) connected to the ground and a node disposed on the second path. The first series-arm circuit, the second series-arm circuit, the first parallel-arm circuit, and the second parallel-arm circuit each include an acoustic wave resonator, and the acoustic wave resonators each include an IDT electrode formed on a piezoelectric substrate, and a reflector. Here, the pitch between the IDT electrode and the reflector of the acoustic wave resonator is at least 0.42λ and less than 0.50λ. A ripple at the higher edge of the stopband can be decreased by setting the I-R pitch of all the acoustic wave resonators included in filter device 10H to at least 0.42λ and less than 0.50λ. Accordingly, insertion loss in the passband of filter device 10H (when switch SW1 is on and switch SW2 is off) can be further decreased by setting the I-R pitch to at least 0.42λ and less than 0.50λ.

Note that the I-R pitch of series-arm resonator s21 of filter 12D does not directly affect insertion loss of filter device 10H, yet when a multiplexer includes filter device 10H, and a filter having a passband that has a higher frequency range than that of filter device 10H (a filter having a passband that includes a frequency overlapping a frequency at which a stopband ripple of filter device 10H occurs), insertion loss of the filter can be decreased.

Here, a relation between the I-R pitch and characteristics of an acoustic wave resonator is to be described in detail.

Figure 33A:
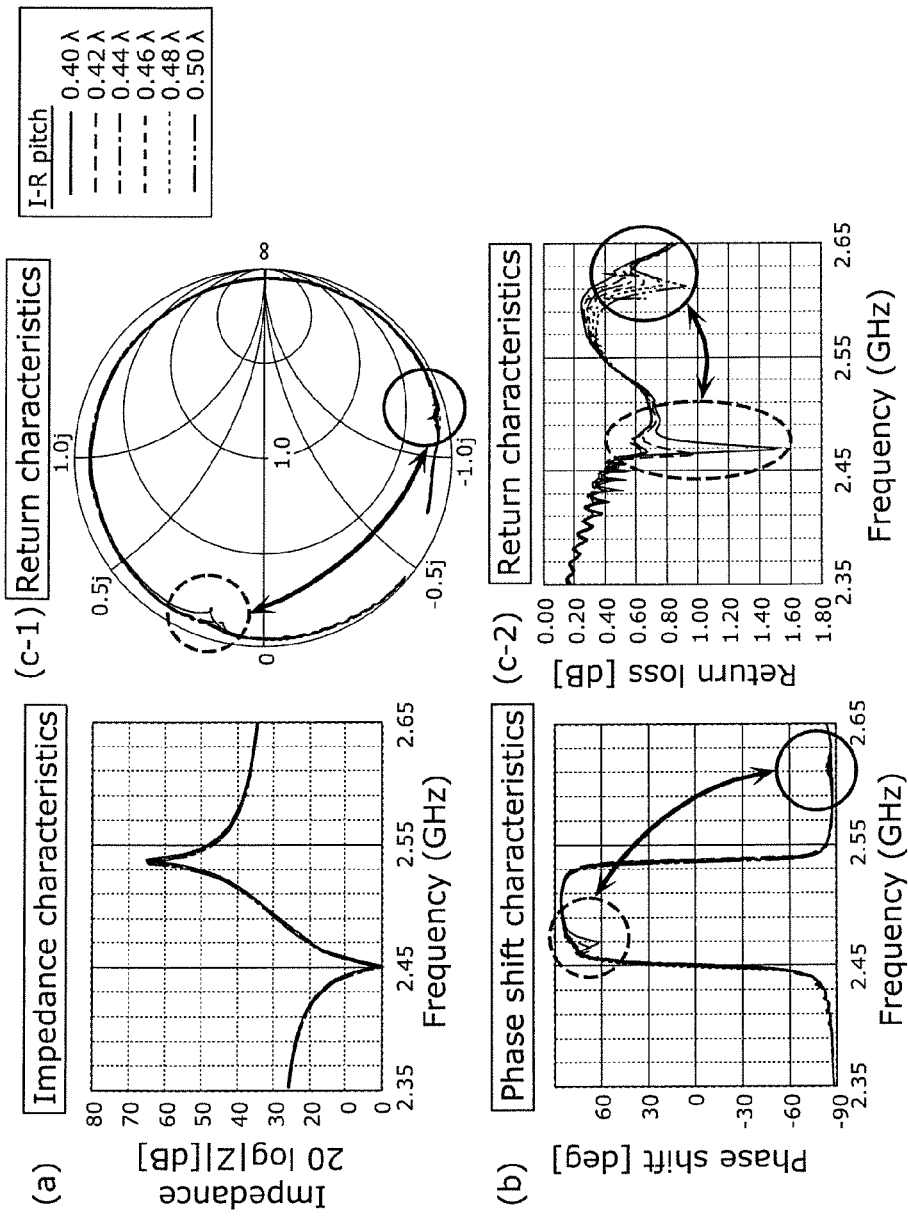
FIG. 33A illustrates graphs showing change in characteristics when the I-R pitch is changed in a range from 0.40λ to 0.50λ in a typical example of a resonator.
Figure 33B:
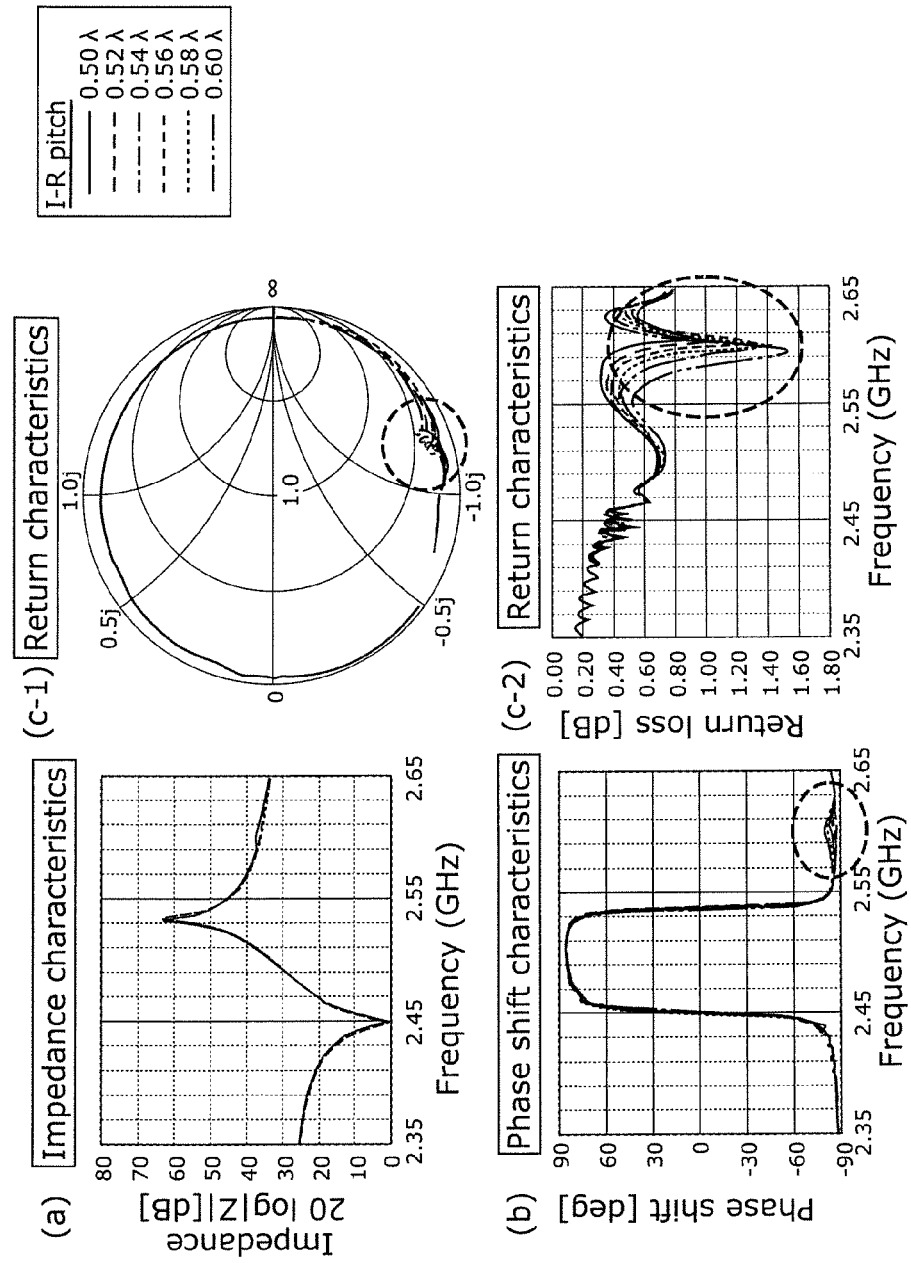
FIG. 33B illustrates graphs showing change in characteristics when the I-R pitch is changed in a range from 0.50λ to 0.60λ in a typical example of a resonator.

FIG. 33A illustrates graphs showing change in characteristics when the I-R pitch is changed in a range from 0.40λ to 0.50λ in a typical example of a resonator. FIG. 33B illustrates graphs showing change in characteristics when the I-R pitch is changed in a range from 0.50λ to 0.60λ in a typical example of a resonator.

In both of FIGS. 33A and 33B, (a) is a graph showing the absolute value of impedance, (b) is a graph showing phase shift characteristics, (c-1) is a graph showing impedance in Smith-chart form, and (c-2) is a graph showing return loss. Specifically, FIG. 33A illustrates characteristics of a resonator when the I-R pitch is changed in a range from 0.40λ to 0.50λ in 0.02λ increments, as illustrated in the graph legend. FIG. 33B illustrates characteristics of a resonator when the I-R pitch is changed in a range from 0.50λ to 0.60λ in 0.02λ increments, as illustrated in the graph legend.

As can be seen from FIG. 33B, ripples at the higher edge of the stopband (specifically, on a higher frequency side relative to the antiresonant frequency) (in the portions enclosed by dashed lines in (b), (c-1), and (c-2) in FIG. 33B) increase with an increase in the I-R pitch from 0.5λ.

In contrast, as can be seen from FIG. 33A, the more the I-R pitch decreases from 0.5λ, the more ripples at the higher edge of the stopband (specifically, on a higher frequency side relative to the antiresonant frequency) (in the portions enclosed by solid lines in (b), (c-1), and (c-2) in FIG. 33A) are decreased. However, on the other hand, if the I-R pitch is decreased, new ripples occur (in the portions enclosed by dashed lines in (b), (c-1), and (c-2) in FIG. 33A) on a higher frequency side relative to the resonant frequency (specifically, between the resonant frequency and the antiresonant frequency), and increase with a decrease in the I-R pitch.

Specifically, a ripple that may occur in a higher frequency range than the resonant frequency of a resonator can be decreased by setting the I-R pitch of the resonator to at least 0.42λ and at most 0.50λ, and thus increase in insertion loss in the passband due to the ripple can be decreased.

By setting the I-R pitch of a resonator to at least 0.44λ and at most 0.46λ, (i) a ripple at the higher edge of a stopband, and (ii) a ripple that may occur in a higher frequency range than the resonant frequency can be both decreased, and thus insertion loss in the passband due to both such ripples can be decreased.

Embodiment 2

The filter device described in Embodiment 1 is applicable to a multiplexer, a radio frequency front-end circuit, and a communication device for a system in which a large number of bands are used. In view of this, in the present embodiment, such a multiplexer, such a radio frequency front-end circuit, and such a communication device are to be described.

Figure 34A:
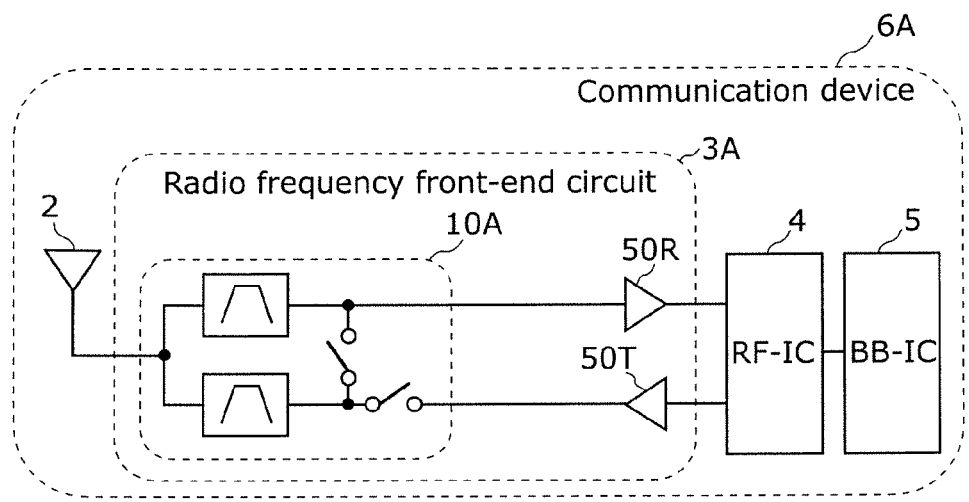
FIG. 34A illustrates a configuration of a communication device according to Embodiment 2.

FIG. 34A illustrates a configuration of communication device 6A according to Embodiment 2. As illustrated in FIG. 34A, communication device 6A includes radio frequency front-end circuit 3A, radio frequency (RF) signal processing circuit (RFIC) 4, baseband signal processing circuit (BBIC) 5, and antenna element 2.

Radio frequency front-end circuit 3A includes filter device 10A according to Example 1, transmission amplifier circuit 50T, and receiving amplifier circuit 50R.

Antenna element 2 is connected to common terminal Tc of filter device 10A, receiving amplifier circuit 50R is connected to input/output terminal T1 of filter device 10A, and transmission amplifier circuit 50T is connected to input/output terminal T2 of filter device 10A.

Note that the filter device included in radio frequency front-end circuit 3A is not limited to filter device 10A according to Example 1, and may be a filter device according to any of the examples and variations described in Embodiment 1.

Transmission amplifier circuit 50T is a power amplifier that amplifies power of a radio frequency signal to be transmitted, which has a frequency in a predetermined frequency band. Receiving amplifier circuit 50R is a low-noise amplifier that amplifies power of a radio frequency signal received, which has a frequency in a predetermined frequency band.

RF signal processing circuit (RFIC) 4 processes radio frequency signals transmitted and received by antenna element 2. Specifically, RF signal processing circuit (RFIC) 4 processes a radio frequency signal (here, a radio frequency signal received) input through a receiver signal path from antenna element 2 by down-conversion, for instance, and outputs a received signal generated by being processed to baseband signal processing circuit (BBIC) 5. RF signal processing circuit (RFIC) 4 processes a signal to be transmitted which is input from baseband signal processing circuit (BBIC) 5 by up-conversion, for instance, and outputs a radio frequency signal (here, a radio frequency signal to be transmitted) generated by being processed to a transmitter signal path.

In the above configuration, when in the filter mode, filter device 10A is a communication device in which only a path that includes receiving amplifier circuit 50R operates, so that only reception functions. When in the duplexer mode, filter device 10A is a communication device (for frequency division duplex (FDD)) in which both a path that includes receiving amplifier circuit 50R, and a path that includes transmission amplifier circuit 50T operate so that both transmission and reception function.

According to the above configuration, a small radio frequency front-end circuit that can switch between a filter having a relatively wide passband and a multiplexer having relatively narrow passbands, and a communication device can be provided.

Figure 34B:
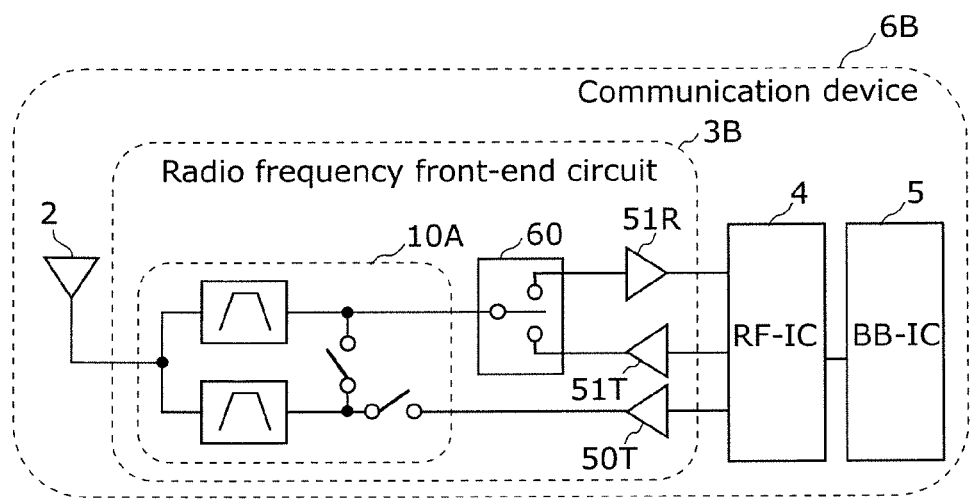
FIG. 34B illustrates a configuration of a communication device according to Variation 1 of Embodiment 2.

FIG. 34B illustrates a configuration of communication device 6B according to Variation 1 of Embodiment 2. As illustrated in FIG. 34B, communication device 6B includes radio frequency front-end circuit 3B, RF signal processing circuit (RFIC) 4, baseband signal processing circuit (BBIC) 5, and antenna element 2.

Radio frequency front-end circuit 3B includes filter device 10A, transmission amplifier circuits 50T and 51T, receiving amplifier circuit 51R, and switch 60. Communication device 6B according to this variation is different from communication device 6A according to Embodiment 2 in that switch 60 is disposed between filter device 10A and the amplifier circuits, and transmission amplifier circuit 51T is added. In the following, description of common points of communication device 6B according to this variation to those of communication device 6A according to Embodiment 2 is omitted, and different points are mainly described.

Switch 60 is a switch circuit that includes a common connection terminal connected to input/output terminal T1 of filter device 10A, and two selection terminals connected to receiving amplifier circuit 51R and transmission amplifier circuit 51T.

In the above configuration, when switch SW1 of filter device 10A is on and switch SW2 is off, filter device 10A forms a filter having the relatively wide third band that includes the first band and the second band, between common terminal Tc and input/output terminal T1. At this time, switch 60 can switch between (i) connection of input/output terminal T1 of filter device 10A to receiving amplifier circuit 51R and (ii) connection of input/output terminal T1 of filter device 10A to transmission amplifier circuit 51T. Such a configuration is applicable to a communication device for TDD that includes a transmission and receiving filter having a wide passband that is the third band.

On the other hand, when switch SW1 is off and switch SW2 is on, filter device 10A forms a multiplexer in which filter 11 having a relatively narrow passband that is the first band between common terminal Tc and input/output terminal T1 is connected, via common terminal Tc, to filter 12 having a relatively narrow passband that is the second band between common terminal Tc and input/output terminal T2. At this time, filter device 10A can be applied to a transmitter multiplexer having the narrow first band and the narrow second band, by connecting input/output terminal T1 and transmission amplifier circuit 51T using switch 60. At this time, FDD that uses the third band and FDD in which the first band is a receiving band and the second band is a transmission band can be switched by connecting input/output terminal T1 and receiving amplifier circuit 51R using switch 60.

Figure 34C:
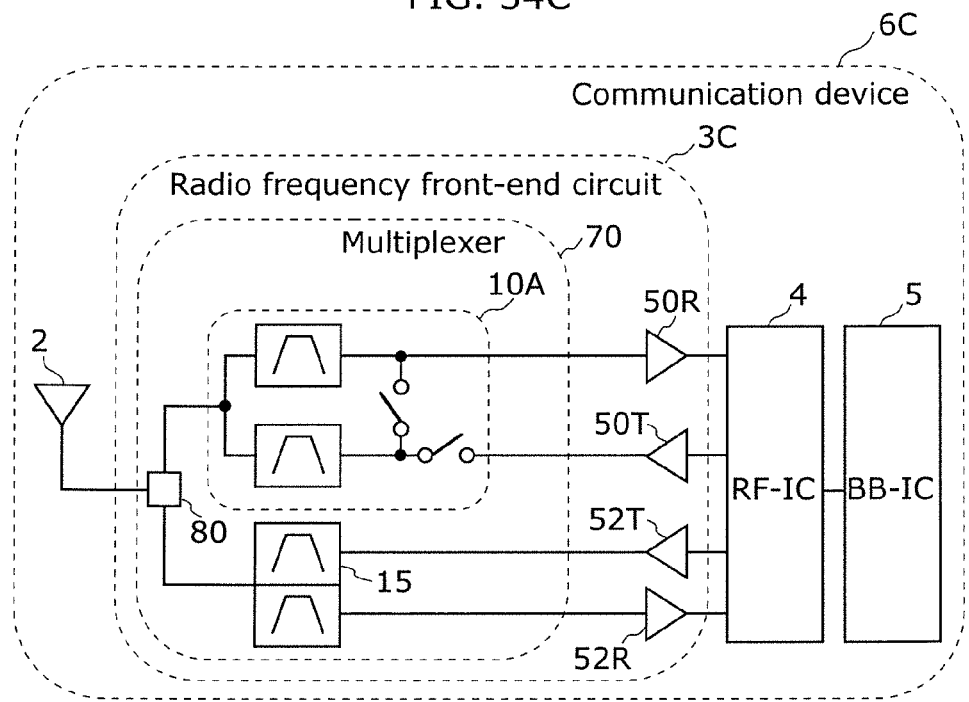
FIG. 34C illustrates a configuration of a communication device according to Variation 2 of Embodiment 2.

FIG. 34C illustrates a configuration of communication device 6C according to Variation 2 of Embodiment 2. As illustrated in FIG. 34C, communication device 6C includes radio frequency front-end circuit 3C, RF signal processing circuit (RFIC) 4, baseband signal processing circuit (BBIC) 5, and antenna element 2.

Radio frequency front-end circuit 3C includes filter device 10A, duplexer 15, matching circuit 80, transmission amplifier circuits 50T and 52T, and receiving amplifier circuits 50R and 52R. Communication device 6C according to this variation is different from communication device 6A according to Embodiment 2 in that duplexer 15, matching circuit 80, transmission amplifier circuit 52T, and receiving amplifier circuit 52R are added. In the following, description of common points of communication device 6C according to this variation to those of communication device 6A according to Embodiment 2 is omitted, and different points are mainly described.

Filter device 10A, duplexer 15, and matching circuit 80 are included in multiplexer 70.

Duplexer 15 is a duplexer in which frequency bands different from the first band, the second band, and the third band that are used by filter device 10A are used as the transmission band and the receiving band. Duplexer 15 is connected to common terminal Tc of filter device 10A and antenna element 2 via matching circuit 80. Specifically, duplexer 15 and filter device 10A are connected to the common connection terminal of multiplexer 70 via matching circuit 80. Note that matching circuit 80 may not be included.

Transmission amplifier circuit 52T is a power amplifier that is connected to the transmission terminal of duplexer 15 and amplifies power of a radio frequency signal to be transmitted which has a frequency in a predetermined frequency band. Receiving amplifier circuit 52R is a low-noise amplifier that amplifies power of a radio frequency signal received which has a frequency in a predetermined frequency band.

Note that duplexer 15 may be one of the filter devices according to any of the examples and variations described in Embodiment 1.

The above configuration provides small radio frequency front-end circuit 3C, and small multiplexer 70 that can switch between a filter having a relatively wide passband and a duplexer having relatively narrow passbands, can further switch among the filter, the duplexer, and, for instance, a filter or a duplexer having a passband in another frequency band, and can simultaneously use (i) one of the filter and the duplexer and (ii) the filter or the duplexer (can demultiplex a signal or multiplex signals).

Figure 34D:
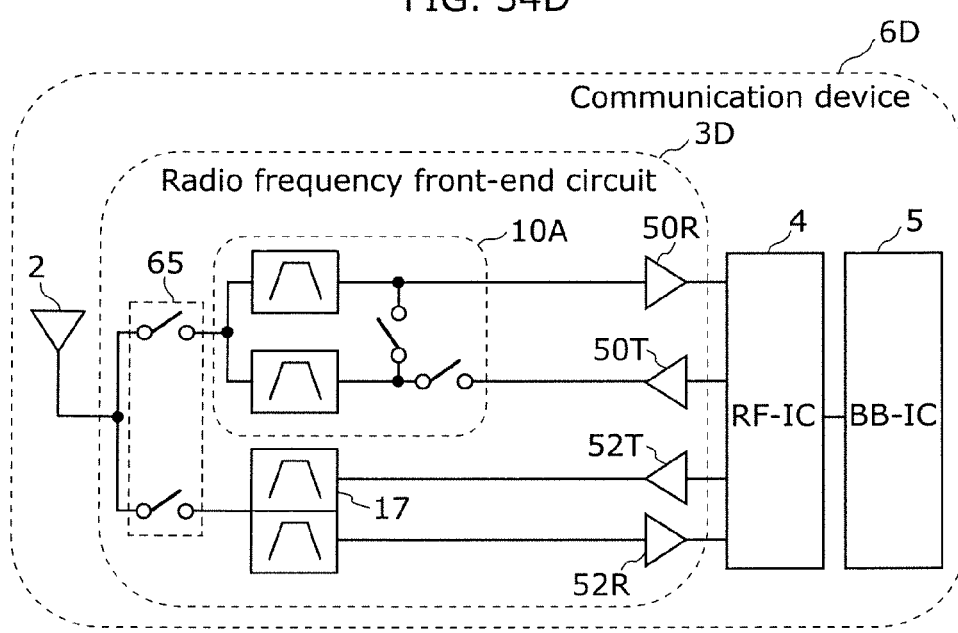
FIG. 34D illustrates a configuration of a communication device according to Variation 3 of Embodiment 2.

FIG. 34D illustrates a configuration of communication device 6D according to Variation 3 of Embodiment 2. As illustrated in FIG. 34D, communication device 6D includes radio frequency front-end circuit 3D, RF signal processing circuit (RFIC) 4, baseband signal processing circuit (BBIC) 5, and antenna element 2.

Radio frequency front-end circuit 3D includes filter device 10A, duplexer 17, switch 65, transmission amplifier circuits 50T and 52T, and receiving amplifier circuits 50R and 52R. Communication device 6D according to this variation is different from communication device 6C according to Embodiment 2 in that switch 65 is disposed instead of duplexer 15 and matching circuit 80. In the following, description of common points of communication device 6D according to this variation to those of communication device 6AC according to Variation 2 is omitted, and different points are mainly described.

Switch 65 is a switch circuit that switches between connection between antenna element 2 and filter device 10A, and connection between antenna element 2 and duplexer 17.

Common terminal Tc of filter device 10A is connected to a first selection terminal of switch 65.

Duplexer 17 is a duplexer in which frequency bands different from the first band, the second band, and the third band used by device 10A are the transmission band and the receiving band. Duplexer 17 is connected to a second selection terminal of switch 65.

The above configuration provides a small radio frequency front-end circuit that can switch between a filter having a relatively wide passband, and a duplexer having relatively narrow passbands, can further switch among the filter, the duplexer and, for instance, a filter or a duplexer having a passband in another frequency band, and can simultaneously use (i) one of the filter and the duplexer and (ii) the filter or the duplexer.

Other Embodiments

The above has described the filter device, the multiplexer, the radio frequency front-end circuit, and the communication device according to the present disclosure, using Embodiments 1 and 2, yet the present disclosure is not limited to the above embodiments. The present disclosure also encompasses other embodiments achieved by combining arbitrary elements in the above embodiments, variations as a result of applying, to the embodiments, various modifications that may be conceived by those skilled in the art without departing from the scope of the present disclosure, and various devices that include the filter device, the multiplexer, the radio frequency front-end circuit, and the communication device according to the present disclosure.

Each of the series-arm resonators and the parallel-arm resonators included in the filters may not be limited to a single resonator, but may be achieved by a plurality of split resonators obtained by splitting one resonator.

The phase shifters described in Embodiment 1 also have an impedance conversion function in addition to the phase shifting function, and may be read as an "impedance converter".

The term "duplexer" in the duplexer (multiplexer) and the duplexer mode in the above embodiments indicates not only a multiplexer in which in FDD, a transmission signal flows into one filter and a reception signal flows into another filter, but also indicates when both filters are receiving filters in TDD and when both filters are transmission filters in TDD. Furthermore, the term "duplexer" also indicates a multiplexer in which in TDD, a signal to be transmitted flows into one filter, and a received signal flows into another filter. Accordingly, the term "duplexer" can also indicate a demultiplexer (multiplexer) that includes common terminal Tc connected to an amplifier.

For example, a controller that switches between on and off of each switch element may be disposed in RF signal processing circuit (RFIC) 4. Alternatively, the controller may be disposed outside RF signal processing circuit (RFIC) 4, and for example, may be disposed in any of radio frequency front-end circuits 3A to 3D. Specifically, the configurations of radio frequency front-end circuits 3A to 3D are not limited to the configurations described above, and radio frequency front-end circuits 3A to 3D may each include a filter device according to any of the examples of Embodiment 1, and a controller that controls on and off of a switch element included in the filter device.

For example, in radio frequency front-end circuits 3A to 3D or communication devices 6A to 6D, an inductor or a capacitor may be connected between elements. Note that the inductor may include a line inductor achieved by a line that connects elements.

Examples of the switch elements included in any of the filter devices according to Embodiments 1 and 2 include a field effect transistor (FET) switch made of GaAs or complementary metal oxide semiconductor (CMOS), and a diode switch. Such switches are small, and thus the filter devices according to Embodiments 1 and 2 can be miniaturized.

The series-arm resonator and the parallel-arm resonator included in any of the filter devices according to Embodiments 1 and 2 are acoustic wave resonators that use acoustic waves and, for example, are resonators that use surface acoustic waves (SAWs), resonators that use bulk acoustic waves (BAWs), and film bulk acoustic resonators (FBARs), for instance. Accordingly, this can achieve a small filter device having high selectivity. Note that SAWs include not only surface waves, but also boundary waves.

The series-arm resonator and the parallel-arm resonator included in any of the filter devices according to Embodiments 1 and 2 are examples in which acoustic resonators such as surface acoustic wave resonators or bulk acoustic wave resonators are used, yet may include a resonance circuit having an impedance local minimum point (local minimum frequency) and an impedance local maximum point (local maximum frequency). Further, an LC resonance circuit having only an impedance local maximum point (local maximum frequency), and a filter circuit that includes an impedance element may be interposed in a portion of a series-arm resonator and a portion of a parallel-arm resonator.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as mobile phones, as a small filter that can switch between a filter having a wide passband and a multiplexer having narrow passbands, a multiplexer, a front-end circuit, and a communication device.

The invention claimed is:
1. A filter device, comprising:
a first filter connected to a first path that connects a common terminal and a first input/output terminal, the first filter having a passband that is a first band;
a second filter connected to a second path that connects the common terminal and a second input/output terminal, the second filter having a passband that is a second band, the second band having a frequency range that is different from, and not overlapping with, a frequency range of the first band;
a first switch connected between a first node on the first path and a second node on the second path, the first node being located between the first filter and the first input/output terminal, the second node being located between the second filter and the second input/output terminal; and
a second switch on the second path, the second switch being connected between the second node and the second input/output terminal.
2. The filter device according to claim 1, wherein switch states of the first switch and the second switch between conducting and non-conducting states are mutually exclusive with respect to each other.
3. The filter device according to claim 1, further comprising:
a third switch connected between a ground and a third node on the second path, the third node being located between the second switch and the second input/output terminal,
wherein switch states of the second switch and the third switch between conducting and non-conducting states are mutually exclusive with respect to each other.
4. The filter device according to claim 1, wherein an off-capacitance of the first switch, which is capacitance of the first switch when non-conducting, is smaller than an off-capacitance of the second switch, which is capacitance of the second switch when non-conducting.
5. The filter device according to claim 4, wherein at least one of
the off-capacitance of the first switch is at most 0.10 pF, and
the off-capacitance of the second switch is at most 0.35 pF.
6. The filter device according to claim 1, wherein the first switch comprises a plurality of unit switches connected in series, and
the filter device further comprises a fourth switch connected between a ground and a fourth node that is one of connection nodes of the plurality of unit switches, and
the switch states of the first switch and the fourth switch between conducting and non-conducting states are mutually exclusive with respect to each other.
7. The filter device according to claim 1, further comprising:
a third filter on the second path, the third filter being connected between the second switch and the second input/output terminal, and having a passband that is the second band.
8. The filter device according to claim 7, wherein the frequency range of the first band is lower than the frequency range of the second band, and a lower-frequency skirt adjacent to the second band in passing characteristics of the third filter alone is steeper than a lower-frequency skirt adjacent to the second band in passing characteristics of the second filter alone.

9. The filter device according to claim 7,
wherein the frequency range of the first band is higher than the frequency range of the second band, and
a higher-frequency skirt adjacent to the second band in passing characteristics of the third filter alone is steeper than a higher-frequency skirt adjacent to the second band in passing characteristics of the second filter alone.

10. The filter device according to claim 1,
wherein the frequency range of the first band is lower than the frequency range of the second band,
the second filter includes a third input/output terminal and a fourth input/output terminal,
a frequency at which impedance when the second filter alone is viewed from the third input/output terminal has a local maximum value is at most a frequency at a lower edge of the second band, and
a frequency at which impedance when the second filter alone is viewed from the fourth input/output terminal has a local maximum value is at most the frequency at the lower edge of the second band.

11. The filter device according to claim 1,
wherein the frequency range of the first band is lower than the frequency range of the second band, and
a difference between a phase shift caused by the first filter alone and a phase shift caused by the second filter alone is in a range from −50° to +50° at a frequency at which the first filter alone and the second filter alone have an identical amplitude.

12. The filter device according to claim 11,
wherein the second filter includes a third input/output terminal and a fourth input/output terminal,
a frequency at which impedance when the second filter alone is viewed from the third input/output terminal has a local maximum value is at most a frequency at a higher edge of the first band, and
a frequency at which impedance when the second filter alone is viewed from the fourth input/output terminal has a local maximum value is at most the frequency at the higher edge of the first band.

13. The filter device according to claim 1,
wherein the frequency range of the first band is higher than the frequency range of the second band,
the first filter includes a third input/output terminal and a fourth input/output terminal,
a frequency at which impedance when the first filter alone is viewed from the third input/output terminal has a local maximum value is at most a frequency at a lower edge of the first band, and
a frequency at which impedance when the first filter alone is viewed from the fourth input/output terminal has a local maximum value is at most the frequency at the lower edge of the first band.

14. The filter device according to claim 1,
wherein the frequency range of the first band is higher than the frequency range of the second band, and
a difference between a phase shift caused by the first filter alone and a phase shift caused by the second filter alone is in a range from −50° to +50° at a frequency at which the first filter alone and the second filter alone have an identical amplitude.

15. The filter device according to claim 14,
wherein the first filter includes a third input/output terminal and a fourth input/output terminal,
a frequency at which impedance when the first filter alone is viewed from the third input/output terminal has a local maximum value is at most a frequency at a higher edge of the second band, and
a frequency at which impedance when the first filter alone is viewed from the fourth input/output terminal has a local maximum value is at most the frequency at the higher edge of the second band.

16. The filter device according to claim 1, further comprising:
a fifth input/output terminal;
a fourth filter connected to a third path that connects the common terminal and the fifth input/output terminal, and having a passband that is a fourth band, the fourth band having a frequency range that is different from the frequency range of the first band and the frequency range of the second band, and does not overlap the frequency range of the first band;
a fifth switch connected between the first node and a fifth node on the third path, the fifth node being located between the fourth filter and the fifth input/output terminal;
a sixth switch on the third path, the sixth switch being connected between the fifth node and the fifth input/output terminal;
a seventh switch connected between the common terminal and the second filter; and
an eighth switch connected between the common terminal and the fourth filter.

17. The filter device according to claim 1,
wherein under a condition that the first switch is conducting and the second switch is non-conducting, the filter device is configured as a filter for time division duplex (TDD) between the common terminal and the first input/output terminal, and
under a condition that the first switch is non-conducting and the second switch is conducting, the filter device is configured as a multiplexer for frequency division duplex (FDD) between the common terminal and the first input/output terminal and between the common terminal and the second input/output terminal.

18. A multiplexer, comprising:
a plurality of filter devices each of which is the filter device according to claim 1,
wherein each common terminal of the plurality of filter devices are directly or indirectly connected to a common connection terminal.

19. A radio frequency front-end circuit, comprising:
the multiplexer according to claim 18; and
an amplifier circuit directly or indirectly connected to the multiplexer.

20. A communication device, comprising:
a radio frequency (RF) signal processing circuit that processes a radio frequency signal to be transmitted by an antenna element and a radio frequency signal received by the antenna element; and
the radio frequency front-end circuit according to claim 19 that conveys the radio frequency signals between the antenna element and the RF signal processing circuit.

* * * * *